United States Patent
Iwamoto et al.

(10) Patent No.: US 10,629,414 B2
(45) Date of Patent: Apr. 21, 2020

(54) TARGET SUPPLY DEVICE, TARGET MATERIAL REFINING METHOD, RECORDING MEDIUM HAVING TARGET MATERIAL REFINING PROGRAM RECORDED THEREIN, AND TARGET GENERATOR

(71) Applicant: Gigaphoton Inc., Tochigi (JP)

(72) Inventors: Fumio Iwamoto, Oyama (JP); Yutaka Shiraishi, Oyama (JP); Tsukasa Hori, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/379,539

(22) Filed: Apr. 9, 2019

(65) Prior Publication Data
US 2019/0237303 A1    Aug. 1, 2019

Related U.S. Application Data

(63) Continuation of application No. 15/346,431, filed on Nov. 8, 2016, now abandoned, which is a
(Continued)

(51) Int. Cl.
*H01J 37/32* (2006.01)
*H05G 2/00* (2006.01)

(52) U.S. Cl.
CPC ......... *H01J 37/32449* (2013.01); *H05G 2/00* (2013.01); *H05G 2/005* (2013.01); *H05G 2/006* (2013.01); *H05G 2/008* (2013.01)

(58) Field of Classification Search
None
See application file for complete search history.

(56) References Cited

U.S. PATENT DOCUMENTS 7,122,816 B2 * 10/2006 Algots ............... H05G 2/003
250/504 R
7,449,703 B2 * 11/2008 Bykanov ............ B82Y 10/00
250/504 R
(Continued)

FOREIGN PATENT DOCUMENTS

JP        H10-001728 A     1/1998
JP        2008532228 A     8/2008
(Continued)

OTHER PUBLICATIONS

International Search Report issued in PCT/JP2014/067382; dated Aug. 26, 2014.
(Continued)

*Primary Examiner* — Alexander H Taningco
*Assistant Examiner* — Srinivas Sathiraju
(74) *Attorney, Agent, or Firm* — Studebaker & Brackett PC

(57) ABSTRACT

A target supply device may be provided with a tank configured to contain a metal as a target material, a nozzle having a nozzle hole through which the target material is output from the tank, a filter disposed in a communication portion for conducting the target material from the tank to the nozzle hole, a temperature adjuster configured to change the temperature of the target material in the tank, and a controller controlling the temperature adjuster to change the temperature of the target material in the tank such that oxygen in the target material is precipitated as metal oxide.

22 Claims, 36 Drawing Sheets

Related U.S. Application Data continuation of application No. PCT/JP2014/067382, filed on Jun. 30, 2014.

(56) References Cited

U.S. PATENT DOCUMENTS

| | | | | |
|---|---|---|---|---|
| 8,003,962 | B2* | 8/2011 | Someya | H05G 2/006 250/423 R |
| 8,018,571 | B2* | 9/2011 | Fujiwara | G03F 7/70341 355/30 |
| 8,395,133 | B2* | 3/2013 | Moriya | H05G 2/005 250/423 R |
| 8,497,489 | B2* | 7/2013 | Yabu | G03F 7/70033 250/492.1 |
| 8,530,869 | B2* | 9/2013 | Nagai | G03F 7/70033 250/365 |
| 8,610,095 | B2* | 12/2013 | Yabu | H05G 2/003 250/365 |
| 8,872,145 | B2* | 10/2014 | Hirashita | G21K 5/08 250/504 R |
| 9,039,957 | B2* | 5/2015 | Shiraishi | C22B 9/00 266/171 |
| 9,891,012 | B2* | 2/2018 | Kawasuji | G05D 23/1917 |
| 9,961,755 | B2* | 5/2018 | Umeda | H05G 2/005 |
| 9,986,629 | B2* | 5/2018 | Suzuki | H05G 2/003 |
| 2008/0226332 | A1* | 9/2008 | Fujiwara | G03F 7/70341 399/98 |
| 2012/0236273 | A1 | 9/2012 | Kameda et al. | |

FOREIGN PATENT DOCUMENTS

| | | |
|---|---|---|
| JP | 2008-226462 A | 9/2008 |
| JP | 2010-118652 A | 5/2010 |
| JP | 2011-216860 A | 10/2011 |
| JP | 2012199005 A | 10/2012 |
| JP | 2013-140771 A | 7/2013 |
| JP | 2013-179029 A | 9/2013 |
| JP | 2013-201118 A | 10/2013 |
| WO | 2006093687 A1 | 9/2006 |
| WO | 2013/029898 A1 | 3/2013 |

OTHER PUBLICATIONS

Written Opinion issued in PCT/JP2014/067382; dated Aug. 26, 2014.

An Office Action mailed by the Japanese Patent Office dated Dec. 13, 2017, which corresponds to Japanese Patent Application No. 2016-530698 and is related to U.S. Appl. No. 15/346,431; with English Translation.

An Office Action; "Notification of Reasons for Refusal," issued by the Japanese Patent Office dated Jul. 5, 2018, which corresponds to Japanese Patent Application No. 2016-530698 and is related to U.S. Appl. No. 15/346,431; with English language translation.

An Office Action mailed by the Japanese Patent Office dated Jul. 17, 2019, which corresponds to Japanese Patent Application No. 2018-201997 and is related to U.S. Appl. No. 16/379,539.

* cited by examiner

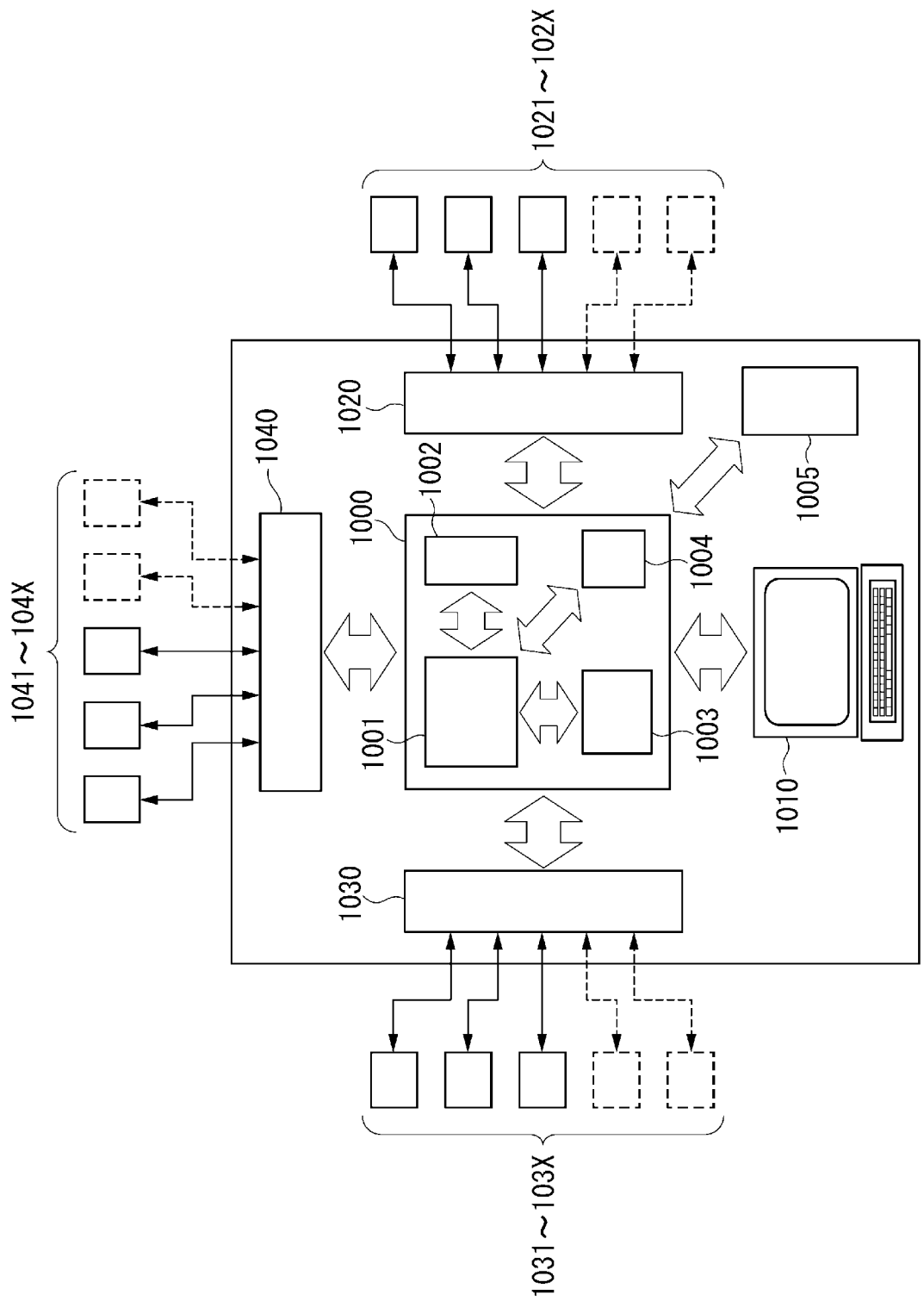

TARGET SUPPLY DEVICE, TARGET MATERIAL REFINING METHOD, RECORDING MEDIUM HAVING TARGET MATERIAL REFINING PROGRAM RECORDED THEREIN, AND TARGET GENERATOR

CROSS-REFERENCE TO RELATED APPLICATIONS

This application is a Continuation of U.S. patent application Ser. No. 15/346,431 filed Nov. 8, 2016, which is a Continuation of PCT International Application No. PCT/JP2014/067382 filed Jun. 30, 2014, the entire content of which is incorporated herein by reference.

BACKGROUND

1. Technical Field

The present invention relates to a target supply device, a target material refining method, a recording medium having target material refining program recorded therein, and a target generator.

2. Related Art

In recent years, semiconductor production processes have become capable of producing semiconductor devices with increasingly fine feature sizes, as photolithography has been making rapid progress toward finer fabrication. In next generation of semiconductor production processes, microfabrication with feature sizes of 45 to 70 nm, and further, microfabrication with feature sizes of 32 nm or less will be required. In order to meet the demand for microfabrication with feature sizes of 32 nm or less, for example, an exposure apparatus is needed in which an apparatus for generating extreme ultraviolet (EUV) light at a wavelength of approximately 13 nm is combined with a reduced projection reflective optical system.

Three kinds of apparatuses for generating EUV light are known in general, which include a Laser Produced Plasma (LPP) type apparatus in which plasma generated by irradiating a target material with a laser beam is used, a Discharge Produced Plasma (DPP) type apparatus in which plasma generated by electric discharge is used, and a Synchrotron Radiation (SR) type apparatus using synchrotron radiation.

SUMMARY

According to one aspect of the present invention, a target supply device may include a tank, a nozzle, a filter, a temperature adjuster and a controller. The tank may be configured to contain a target material of a metal. The nozzle may have a nozzle hole configured to output the target material from the tank. The filter may be disposed in a communication portion for conducting the target material from the tank to the nozzle hole. The temperature adjuster may be configured to change a temperature of the target material in the tank. The controller may be configured to control the temperature adjuster to change the temperature of the target material in the tank so as oxygen dissolved in the target material to precipitate as metal oxide.

According to another aspect of the present invention, a target supply device may include a tank, a nozzle, a filter, a temperature adjuster and a controller. The tank may be configured to contain a target material of a metal. The nozzle may have a nozzle hole configured to output the target material from the tank. The filter may be disposed in a communication portion for conducting the target material from the tank to the nozzle hole. The temperature adjuster may be configured to change a temperature of the target material in the tank. The controller may be configured to control the temperature adjuster to change the temperature of the target material in the tank for at least one time between a first temperature higher than a melting point of the target material and a second temperature lower than the first temperature while the target material is not contained between the filter and the nozzle hole.

According to one aspect of the present invention, a target supply device may include a tank, a nozzle, a filter, a temperature adjuster, a gas exhauster and a controller. The tank may be configured to contain a target material of a metal. The nozzle may have a nozzle hole configured to output the target material from the tank. The filter may be disposed in a communication portion for conducting the target material from the tank to the nozzle hole. The temperature adjuster may be configured to change a temperature of the target material in the tank. The gas exhauster may be configured to exhaust gas from the tank. The controller may be configured to control the temperature adjuster to change the temperature of the target material in the tank for at least one time between a first temperature higher than a melting point of the target material and a second temperature lower than the first temperature while the gas exhauster is controlled to set a pressure in the tank lower than an atmospheric pressure.

According to still another aspect of the present invention, a target material refining method of refining a target material by use of a target generator and a temperature adjuster may be provided, the target generator having a tank configured to contain the target material of a metal, a nozzle having a nozzle hole configured to output the target material from the tank, and a filter disposed in a communication portion for conducting the target material from the tank to the nozzle hole, the temperature adjuster being configured to change a temperature of the target material in the tank. The target material refining method may include a step of causing oxygen in the target material to precipitate as metal oxide by changing the temperature of the target material in the tank by the temperature adjuster, and a step of filtrating the target material of a liquid phase containing the precipitated metal oxide through the filter.

According to another aspect of the present invention, a target material refining program may enable a computer to perform operations for controlling the temperature adjuster in the target material refining method as defined above.

According to one aspect of the present invention, a recording medium may be configured to store a target material refining program in a computer readable manner, the target material refining program enabling a computer to perform operations for controlling the temperature adjuster in the target material refining method as defined above.

According to another aspect of the present invention, a target generator may be configured to contain a target material that is solidified after refined by the target material refining method as defined above.

BRIEF DESCRIPTION OF THE DRAWINGS

Hereinafter, selected embodiments of the present disclosure will be described with reference to the accompanying drawings.

FIG. 36 is a block diagram schematically illustrating a controller.

DETAILED DESCRIPTION

Figure 1:
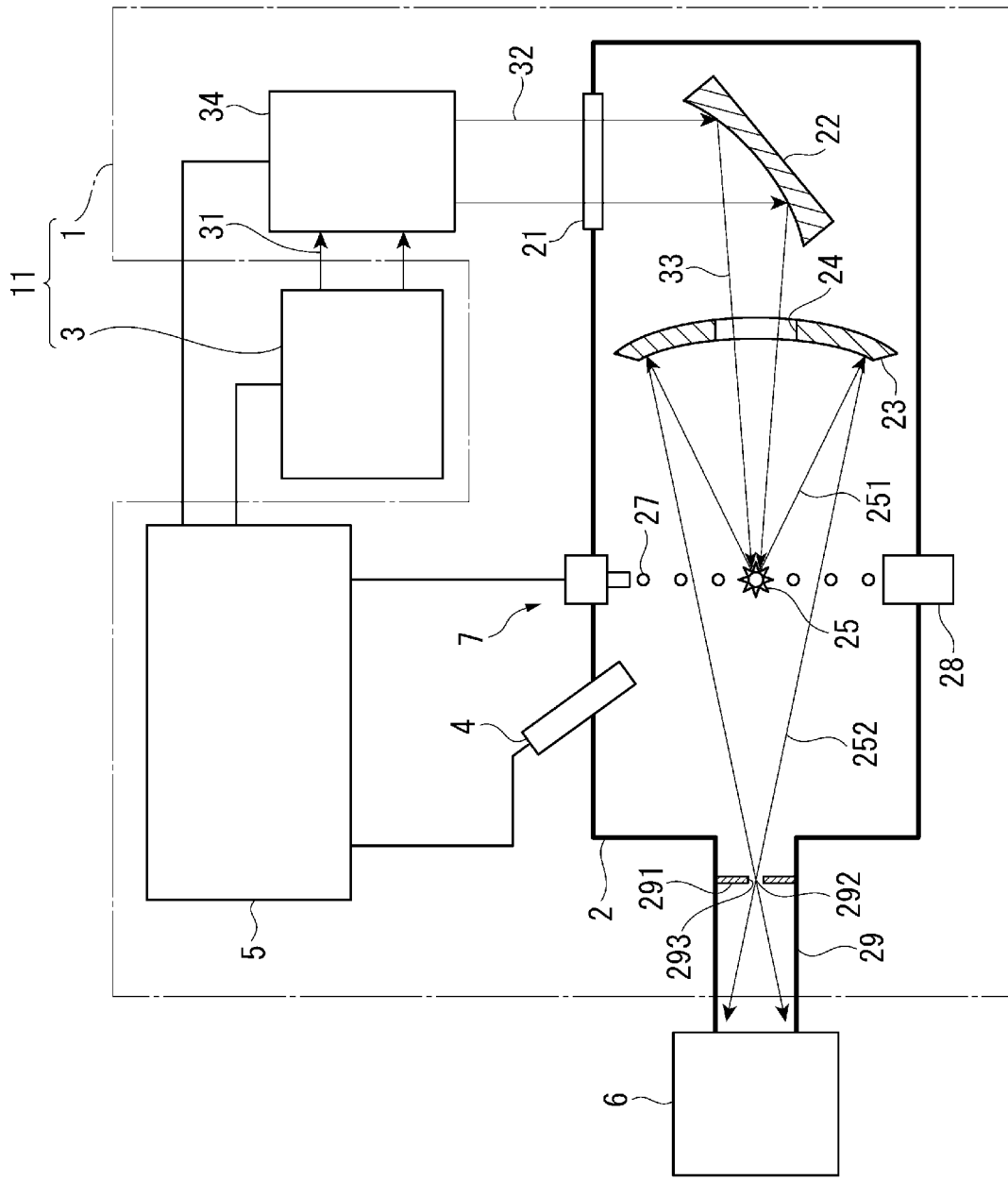
FIG. 1 is an explanatory view in a cross section of an LPP type EUV light generation apparatus.

Contents
1. Overview
2. Overview of EUV Light Generation Apparatus
2.1 Configuration
2.2 Operation
3. EUV Light Generation Apparatus With a Target Supply Device
3.1 Terms
3.2 First Embodiment
3.2.1 Overview
3.2.2 Configuration
3.2.3 Solubility of Oxygen Atoms to Tin
3.2.4 Operation
3.2.5 Variation of the First Embodiment
3.2.5.1. Operation
3.3 Second Embodiment
3.3.1 Configuration
3.3.2 Operation
3.3.3 Variation of the Second Embodiment
3.3.3.1 Configuration
3.3.3.2 Operation
3.4 Third Embodiment
3.4.1 Configuration
3.4.2 Operation
3.4.3 Variation of the Third Embodiment
3.4.3.1 Operation
4. Target Supply Device With Tanks
4.1 Fourth Embodiment
4.1.1 Configuration
4.1.2 Operation
5. Controller
5.1 Configuration
5.2 Operation
6. Other Variations Hereinafter, selected embodiments of the present disclosure will be described in detail with reference to the accompanying drawings. The embodiments to be described below are merely illustrative in nature and do not limit the scope of the present disclosure. Furthermore, the configurations and operations described in the embodiments are not necessarily all essential in implementing the present disclosure. Among the elements shown in FIG. 1, those elements which are not essential to the description of the present disclosure may be omitted from the embodiments described with the drawings other than FIG. 1. The same elements are designated by the same reference numerals, to omit duplicated explanations.

1. Overview

According to an embodiment of the present disclosure, a target supply device may include a tank, a nozzle, a filter, a temperature adjuster and a controller. The tank may be configured to contain a target material of a metal. The nozzle may have a nozzle hole configured to output the target material from the tank. The filter may be disposed in a communication portion for conducting the target material from the tank to the nozzle hole. The temperature adjuster may be configured to change the temperature of the target material in the tank. The controller may be configured to control the temperature adjuster to change the temperature of the target material in the tank so as oxygen dissolved in the target material to precipitate as metal oxide.

According to an embodiment of the present disclosure, a target supply device may include a tank, a nozzle, a filter, a temperature adjuster and a controller. The tank may be configured to contain a target material of a metal. The nozzle may have a nozzle hole configured to output the target material from the tank. The filter may be disposed in a communication portion for conducting the target material from the tank to the nozzle hole. The temperature adjuster may be configured to change the temperature of the target material in the tank. The controller may be configured to control the temperature adjuster to change the temperature of the target material in the tank for at least one time between a first temperature higher than a melting point of the target material and a second temperature lower than the first temperature while the target material is not contained between the filter and the nozzle hole.

According to another embodiment of the present disclosure, a target supply device may include a tank, a nozzle, a filter, a temperature adjuster, a gas exhauster and a controller. The tank may be configured to contain a target material of a metal. The nozzle may have a nozzle hole configured to output the target material from the tank. The filter may be disposed in a communication portion for conducting the target material from the tank to the nozzle hole. The temperature adjuster may be configured to change the temperature of the target material in the tank. The gas exhauster may be configured to exhaust gas from the tank. The controller may be configured to control the temperature adjuster to change the temperature of the target material in the tank for at least one time between a first temperature higher than a melting point of the target material and a second temperature lower than the first temperature while the gas exhauster is controlled to set the pressure in the tank lower than an atmospheric pressure.

According to an embodiment of the present disclosure, a target material refining method uses a target generator and a temperature adjuster. The target generator has a tank configured to contain a target material of a metal, a nozzle having a nozzle hole configured to output the target material from the tank, and a filter disposed in a communication portion for conducting the target material from the tank to the nozzle hole. The temperature adjuster is configured to change the temperature of the target material in the tank. The target material refining method may include a step of causing oxygen in the target material to precipitate as metal oxide by changing the temperature of the target material in the tank by the temperature adjuster, and a step of filtering the target material as being liquefied and containing the precipitated metal oxide through the filter.

According to an embodiment of the present disclosure, a target material refining program may enable a computer to perform operations for controlling the temperature adjuster in the target material refining method as defined above.

According to an embodiment of the present disclosure, a recording medium storing a target material refining program may be configured to store the abovementioned target material refining program in a computer readable manner.

According to another embodiment of the present disclosure, the target generator may be configured to contain the target material that is solidified after refined by the target material refining method as defined above.

2. Overview of EUV Light Generation Apparatus 2.1 Configuration

FIG. 1 schematically illustrates an exemplary configuration of an LPP type EUV light generation system. An EUV light generation apparatus 1 may be used with at least one laser apparatus 3. In the present application, a system that includes the EUV light generation apparatus 1 and the laser apparatus 3 is referred to as an EUV light generation system 11. As illustrated in FIG. 1 and described in detail below, the EUV light generation apparatus 1 may include a chamber 2 and a target supply device 7. The chamber 2 may be sealed airtight. The target supply device 7 may be mounted onto the chamber 2, for example, so as to put through a wall of the chamber 2. A target material to be supplied by the target supply device 7 may include, but is not limited to, tin, terbium, gadolinium, lithium, xenon, or any combination of two or more of those.

The chamber 2 may have at least one through hole or opening formed in its wall. The chamber 2 may have a window 21 formed in its wall, through which a pulse laser beam 32 output from the laser apparatus 3 may travel into the chamber 2. An EUV collector mirror 23, for example, having a spheroidal reflecting surface may be provided inside the chamber 2. The EUV collector mirror 23 can have a first focus and a second focus. The EUV collector mirror 23 may have a multi-layered reflective film formed on the surface thereof, the reflective film having, for example, a molybdenum layer or layers and a silicon layer or layers alternately laminated on one another. The EUV collector mirror 23 is preferably positioned such that the first focus lies in a plasma generation region 25 and the second focus lies in an intermediate focus (IF) region 292. The EUV collector mirror 23 may have a through hole 24 formed at the center thereof so that a pulse laser beam 33 may travel through the through hole 24.

The EUV light generation apparatus 1 may further include an EUV light generation control system 5, a target sensor 4, and the like. The target sensor 4 may have an imaging function and may be configured to detect the presence, trajectory, position, speed, and the like of a droplet 27 as a target.

Further, the EUV light generation apparatus 1 may include a connection section 29 for allowing the interior of the chamber 2 to be in communication with the interior of an exposure apparatus 6. A wall 291 having an aperture 293 may be provided in the connection section 29. The wall 291 may be positioned such that the second focus of the EUV collector mirror 23 lies in the aperture 293 formed in the wall 291.

The EUV light generation apparatus 1 may also include a laser beam direction control unit 34, a laser beam focusing mirror 22, a target collector 28 for collecting droplets 27, and the like. The laser beam direction control unit 34 may include an optical element for defining the direction into which the pulse laser beam travels and an actuator for adjusting the position and the orientation or posture of the optical element.

2.2 Operation

With reference to FIG. 1, a pulse laser beam 31 output from the laser apparatus 3 may pass through the laser beam direction control unit 34 and be output therefrom as the pulse laser beam 32 so as to travel through the window 21 and enter the chamber 2. The pulse laser beam 32 may travel inside the chamber 2 along at least one laser beam path, and may be reflected by the laser beam focusing mirror 22, so as to be projected as a pulse laser beam 33 toward at least one droplet 27.

The target supply device 7 may be configured to output the droplets 27 toward the plasma generation region 25 in the chamber 2. The droplet 27 may be irradiated with at least one pulse of the pulse laser beam 33. Upon being irradiated, the droplet 27 can be turned into plasma, and radiation light 251 can be emitted from the plasma. EUV light 252 included in the radiation light 251 may be reflected selectively by the EUV collector mirror 23. The EUV light 252, which is reflected by the EUV collector mirror 23, may travel through the intermediate focus region 292 and be output to the exposure apparatus 6. Here, the droplet 27 may be irradiated with multiple pulses included in the pulse laser beam 33.

The EUV light generation control system 5 may be configured to integrally control the EUV light generation system 11. The EUV light generation control system 5 may be configured to process image data of the droplet 27 captured by the target sensor 4. Further, the EUV light generation control system 5 may be configured to control the timing when the droplet 27 is output, the direction into which the droplet 27 is output, or the like, for example. Furthermore, the EUV light generation control system 5 may be configured to control the timing when the laser apparatus 3 oscillates, the direction in which the pulse laser beam 32 travels, the position at which the pulse laser beam 33 is focused, or the like, for example. The various controls mentioned above are merely examples, and other controls may be added as necessary.

3. EUV Light Generation Apparatus With A Target Supply Device

3.1. Terms

Hereinafter, in the descriptions that refer to the drawings, terms regarding directions may be described on the basis of XYZ axes illustrated in the drawings. These terms representing the directions, however, have no relation to gravity direction 10B. In a case where tin is a target material 270, an oxidized material of tin may be expressed as "metal oxide". Oxygen dissolved in tin as a solid solution, or oxygen dissolved in a supersaturated state in a metal may be expressed simply as "oxygen". Among pressures applied to the target material 270, a minimum pressure that enables the target material 270 to infiltrate in a filter 831A (refer to FIG. 3) or a filter 884D (refer to FIG. 35) may be expressed as "penetration pressure". Among pressures applied to the target material 270, a minimum pressure that enables the target material 270 to output from a nozzle 86A (refer to FIG. 3) at a predetermined speed may be expressed as "output pressure". A process according to the target material refining method may be expressed as "target material refinement". A temperature level, which is equal to or higher than a melting point of the target material 270 and which is high enough to output the target material 270 from a target supply device 7A, may be expressed as "output temperature". In the drawings, a reservoir tank 84A and a feed tank 87D (refer to FIG. 35), which are the tanks of the present disclosure, may be expressed simply as "tanks".

3.2 First Embodiment

3.2.1 Overview

In a target supply device of a first embodiment of the present disclosure, the controller may be configured to control the temperature adjuster for changing the temperature of the target material in the tank for at least one time between a first temperature higher than a melting point of the target material and a second temperature lower than the first temperature.

In a target material refining method of the first embodiment of the present disclosure, the oxygen precipitation step for the target material may include controlling the temperature adjuster for changing the temperature of the target material in the tank for at least one time between a first temperature higher than a melting point of the target material and a second temperature lower than the first temperature.

In the target supply device or target material refining method of the first embodiment of the present disclosure, the second temperature may be lower than the melting point of the target material.

3.2.2 Configuration

Figure 2:
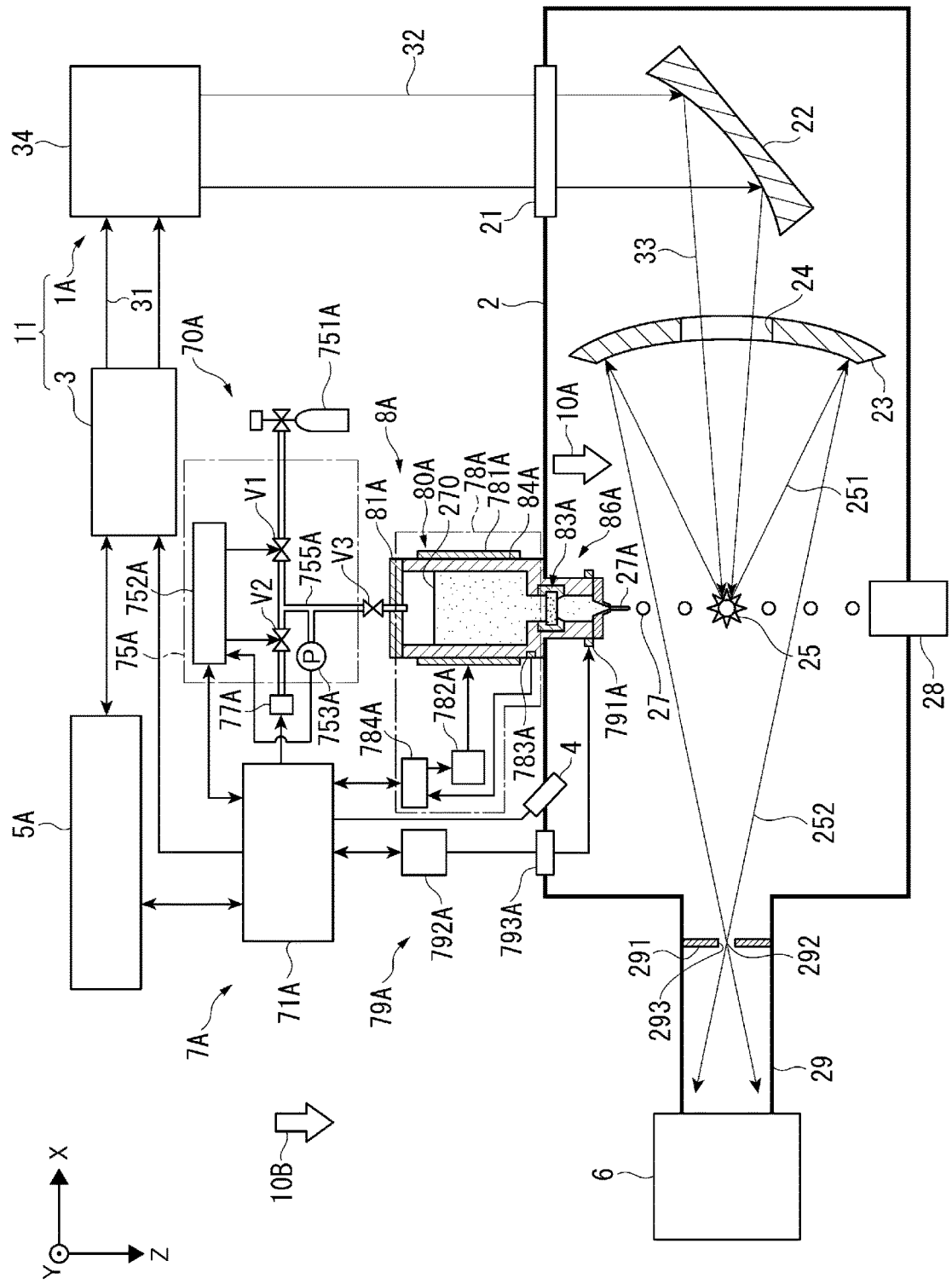
FIG. 2 schematically illustrates the EUV light generation apparatus having a target supply device of a first embodiment.
Figure 3:
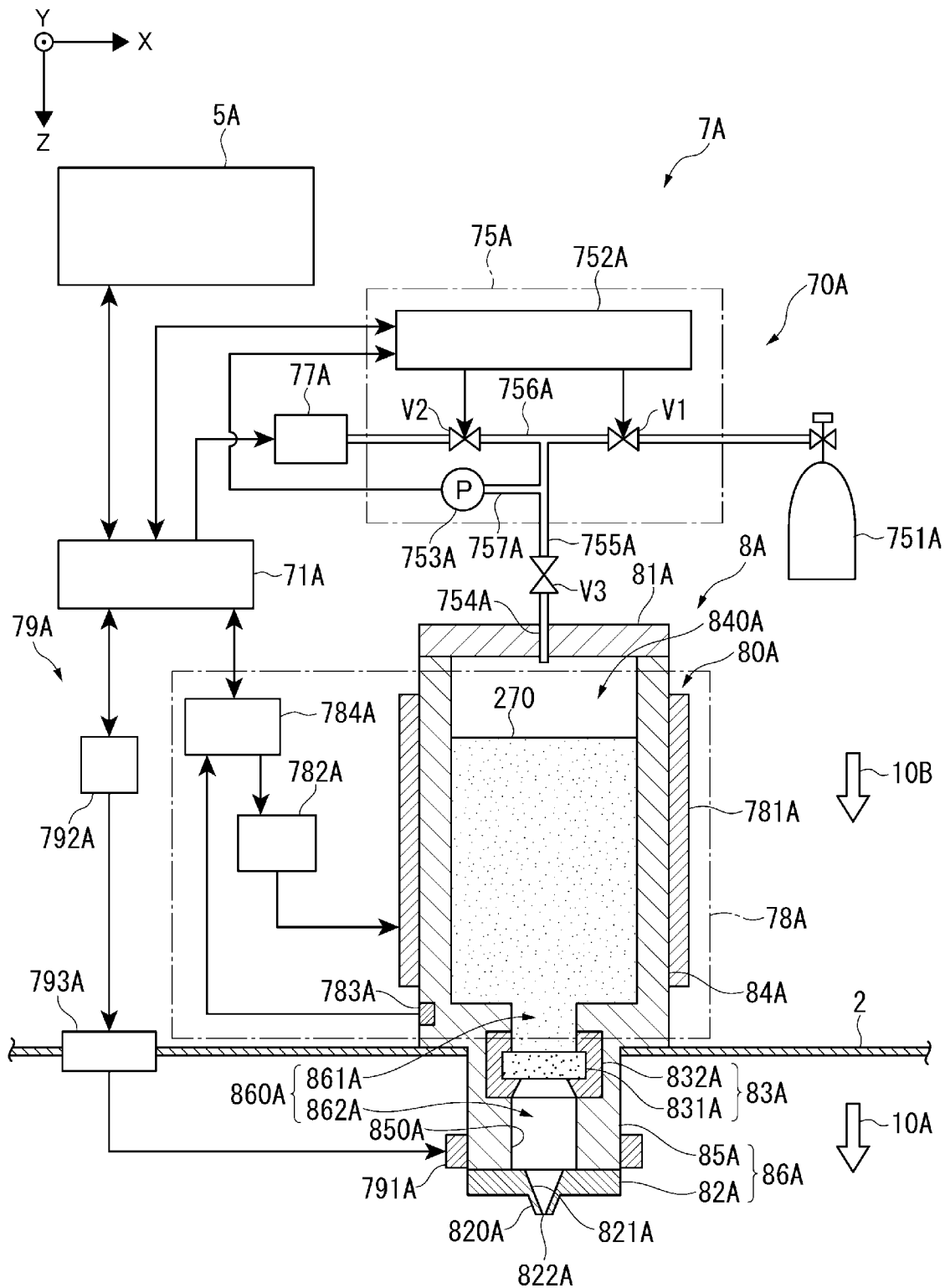
FIG. 3 schematically illustrates the target supply device.

FIG. 2 schematically illustrates a configuration of an EUV light generation apparatus that includes a target supply device according to the first embodiment. FIG. 3 schematically illustrates a configuration of the target supply device are schematically illustrated.

As shown in FIG. 2, an EUV light generation apparatus 1A may include a chamber 2 and a target supply device 7A. The target supply device 7A may include a target generating section 70A and a target controller 71A as a controlling section. An EUV light generation control system 5A, the laser apparatus 3 and the target sensor 4 may be electrically connected to the target controller 71A.

The target generating section 70A in FIGS. 2 and 3 may include a target generator 8A, a pressure adjuster 75A, a gas exhauster 77A, a temperature adjuster 78A and a piezoelectric actuator 79A.

The target generator 8A may include a device main unit 80A, a lid 81A, a nozzle head 82A and a filter unit 83A.

The device main unit 80A may include a reservoir tank 84A of a substantially cylindrical shape with a wall on a first side thereof that is on the +Z direction side. The reservoir tank 84A may be the tank of the present disclosure. A room in the reservoir tank 84A may be a space for containment 840A for containing the target material 270.

The reservoir tank 84A may include a nozzle body 85A. The nozzle body 85A may be of a substantially cylindrical shape and extend from the center of the first side of the reservoir tank 84A in the +Z direction. A hollow in the nozzle body 85A may be a through hole 850A for feeding the target material 270 from the space for containment 840A to the nozzle head 82A therethrough.

The lid 81A may be formed in a substantially disk shape and close a second side of the reservoir tank 84A, which is on the −Z direction side. The lid 81A may be so provided as to tightly contact with the second side of the reservoir tank 84A.

The nozzle head 82A may be formed in a substantially disk shape. The outer diameter of the nozzle head 82A may be substantially equal to that of the nozzle body 85A. The nozzle head 82A may be disposed in tight contact with the nozzle body 85A at the end of the +Z direction side. A nozzle tip 820A may protrude from the center of the nozzle head 82A in a conically tapered shape. A through channel 821A is formed through the center of the nozzle head 82A to extend vertically or along the Z axis. The through channel 821A may communicate with the through hole 850A. The through channel 821A may be formed to decrease its diameter in the +Z direction. An end of the through channel 821A, which is located on the +Z direction side, may be a nozzle hole 822A. The diameter of the nozzle hole 822A may be 1 to 15 µm. The through hole 850A and the through channel 821A may constitute a communication portion 860A for conducting the target material 270 in the reservoir tank 84A to the nozzle hole 822A.

The nozzle body 85A and the nozzle head 82A may constitute the nozzle 86A that is provided to communicate the communication portion 860A with the space for containment 840A. The nozzle 86A can protrude from the first end wall of the reservoir tank 84A into the chamber 2.

The nozzle head 82A is preferably formed from a material that provides a contact angle of not less than 90 degrees between the nozzle head 82A and the target material 270. Alternatively, at least a surface of the nozzle head 82A may be coated with a material that will make the contact angle equal to or more than 90 degrees. If the target material 270 is tin, the material which will provide the contact angle of not less than 90 degrees may be SiC, $SiO_2$, $Al_2O_3$, molybdenum, and tungsten.

The filter unit 83A may include the filter 831A and a holder 832A.

The filter 831A may be disposed in the communication portion 860A of the nozzle 86A. The filter 831A may have a first filter (filter element), which may be formed from a porous material for collecting metal oxide. A great number of pores with a diameter of approximately 3 to 10 μm may be formed in the first filter. The pores may be bent or curved in various directions to extend through the first filter.

The first filter may be formed from a material having a low reactivity to the target material 270. The difference between a linear thermal expansion coefficient of a material of the first filter and a linear thermal expansion coefficient of a material of the target generator 8A can be smaller than 20% of the linear thermal expansion coefficient of the material of the target generator 8A.

When the target generator 8A formed from molybdenum or tungsten, the material of the first filter may be Shirasu Porous Glass (SPG) provided by SPG Technology Co., Ltd. The SPG may be porous glass formed from white volcanic ash and sand.

The filter 831A may further include a second filter disposed on one side of a first filter, at a position closer to the nozzle hole 822A. The second filter may be formed by bundling multiple capillaries into a plate shape. Through holes of the capillaries may extend in the vertical direction (the Z-axis direction). An inner diameter of the capillaries may be 0.1 to 2 μm.

Also, the second filter may be formed from glass which can react with the target material 270 in the liquid phase to create a solid reaction product. The glass forming the capillaries of the second filter may be a low-melting-point glass. Making the capillaries of a low-melting-point glass can permit forming the capillaries with smaller diameter in comparison with the capillaries made of quartz glass having a high melting point. Also, the low-melting-point glass may contain metal lead.

In a case where the target material 270 is tin, forming the second filter (filter element) from a low-melting-point glass can cause reductive reaction of the metal lead contained in the low-melting-point glass with the tin, precipitating the metal lead in the solid form. The precipitation of the metal lead from the low-melting-point glass may result in breaking the structure of the remaining glass, producing solid $SiO_2$.

As a result, particles of SnO, $SnO_2$, $SiO_2$ and the like can be created through the reaction between the low-melting-point glass of the second filter and the tin as the target material 270.

To suppress the creation of these particles, a coating layer may be formed on an inner surface of the through holes of the capillaries. The coating layer can be formed by applying a coating of a material with a low reactivity to the target material 270 of a liquid phase.

Note that the filter 831A may include only one of the first and second filters.

The holder 832A may be formed into a tubular shape. In a case where tin is the target material 270, the holder 832A may be formed from molybdenum having low reactivity with the tin. The holder 832A may hold the filter 831A so as to close the communication portion 860A. The communication portion 860A may be partitioned with the filter 831A into a first communication passage 861A and a second communication passage 862A. The first communication passage 861A is on the side of the reservoir tank 84A. The second communication passage 862A is on the side of the nozzle hole 822A.

The output direction predetermined for the droplets 27 does not necessarily coincide with the gravity direction 10B but depends on how the chamber 2 is arranged. The predetermined output direction of the droplet 27 may be equal to the direction of the center axis of the nozzle hole 822A, and hereinafter will be referred to as the predetermined output direction 10A. A configuration may be possible wherein the output direction of the droplets 27 is horizontal or aslant to the gravity direction 10B. In the first embodiment, the chamber 2 may be arranged such that the predetermined output direction 10A coincides with the gravity direction 10B.

A flow line 754A may be provided through the lid 81A of the target generator 8A. A first end of the flow line 754A, which is on the +Z direction side, may be positioned in the device main unit 80A. A second end of the flow line 754A, which is on the −Z direction side, may be connected to a first end of a flow line 755A through a valve V3. A second end of the flow line 755A may be connected to an inert gas cylinder 751A through the pressure adjuster 75A. Thus, inert gas from the inert gas cylinder 751A can be supplied to the target generator 8A.

The pressure adjuster 75A may be provided in the flow line 755A. The pressure adjuster 75A may have a first valve V1, a second valve V2, a pressure controller 752A and a pressure sensor 753A.

The first valve V1 may be provided in the flow line 755A.

A flow line 756A may be connected to the flow line 755A at a position between the target generator 8A and the first valve V1. A first end of the flow line 756A may be joined to the flow line 755A at a side portion thereof. A second end of the flow line 756A may be connected to the gas exhauster 77A.

The second valve V2 may be provided in the flow line 756A.

The first and second valves V1 and V2 may be any of gate valves, ball valves, butterfly valves and the like. The first valve V1 and the second valve V2 may be of the same type or different types+.

The pressure controller 752A may be connected electrically to the first and second valves V1 and V2. The target controller 71A may send the pressure controller 752A signals for the first and second valves V1 and V2. The first and second valves V1 and V2 may be changed over between open and closed positions, independently from each other according to the signal sent from the pressure controller 752A.

When the first valve V1 opens, the inert gas in the inert gas cylinder 751A can be supplied to the target generator 8A through the flow lines 754A and 755A. While the second valve V2 is closed, the inert gas in the flow lines 754A and 755A and the target generator 8A can be prevented from being exhausted to the outside of the flow line 756A through the second end thereof. Thus, by opening the first valve V1 and closing the second valve V2, it may be possible to raise the pressure in the target generator 8A up to a pressure set by a regulator or the like which may be provided in the inert gas cylinder 751A. Thereafter, it may also be possible to maintain the pressure in the target generator 8A at the level set by the regulator or the like.

When the first valve V1 is closed, the inert gas in the inert gas cylinder 751A can be prevented from being supplied to the target generator 8A through the flow lines 754A and 755A. When the second valve V2 opens and the gas exhauster 77A is driven, the inert gas can be exhausted from the flow lines 754A and 755A and the target generator 8A. Thus, it may also be possible to reduce the pressure in the target generator 8A by closing the first valve V1, opening the second valve V2 and driving the gas exhauster 77A.

A flow line 757A may be connected to the flow line 755A at a position between the target generator 8A and the flow line 756A. A first end of the flow line 757A may be connected to the flow line 755A at a side portion thereof. A second end of the flow line 757A may be provided with the pressure sensor 753A. The pressure controller 752A may be electrically connected to the pressure sensor 753A. The pressure sensor 753A may detect the pressure of the inert gas inside the flow line 757A, and send a pressure signal of the detected pressure to the pressure controller 752A. The pressure in the flow line 757A may be substantially equal to the pressure in the flow lines 754A and 755A and the target generator 8A.

The flow lines 754A, 755A, 756A and 757A may be made of stainless steel, for example.

The gas exhauster 77A may be a pump. The gas exhauster 77A may be connected electrically to the target controller 71A. The gas exhauster 77A may exhaust the gas from the flow lines 754A, 755A and 756A and the target generator 8A according to a signal sent from the target controller 71A.

The temperature adjuster 78A may be configured to control the temperature of the target material 270 contained in the target generator 8A. The temperature adjuster 78A may have a heater 781A, a heater power supply 782A, a temperature sensor 783A and a temperature controller 784A. The heater 781A may be disposed on an outer surface of the reservoir tank 84A. The heater power supply 782A may supply power to the heater 781A to generate heat according to a signal from the temperature controller 784A. Thus, the target material 270 in the reservoir tank 84A can be heated through the wall of the reservoir tank 84A.

The temperature sensor 783A may be disposed on the outer circumferential surface of the reservoir tank 84A, at a position close to the nozzle body 85A, or may be located within the reservoir tank 84A. The temperature sensor 783A may be configured to detect the temperature at a location where the temperature sensor 783A is installed as well as the vicinity thereof in the reservoir tank 84A, and to send a signal of the detected temperature to the temperature controller 784A. The temperature at and around the installed position of the temperature sensor 783A can be substantially equal to the temperature of the target material 270 in the reservoir tank 84A.

The temperature controller 784A may also be configured to output, to the heater power supply 782A, a signal for controlling the temperature of the target material 270 to be a predetermined temperature on the basis of the signal from the temperature sensor 783A.

The piezoelectric actuator 79A may have a piezoelectric element 791A and a power source 792A. The piezoelectric element 791A may be provided on an outer circumferential surface of the nozzle body 85A at the distal end thereof in the chamber 2. As an alternative to the piezoelectric element 791A, a mechanism capable of applying vibrations to the nozzle 86A at a high rate may be provided. A feedthrough unit 793A may connect the power source 792A to the piezoelectric element 791A electrically. The power source 792A may be electrically connected to the target controller 71A.

The target generating section 70A may be configured to generate a jet 27A of the target material according to a continuous jet method, and vibrate the jet 27A at the output from the nozzle 86A so as to form the droplets 27.

3.2.3 Solubility of Oxygen Atoms to Tin

Figure 4:
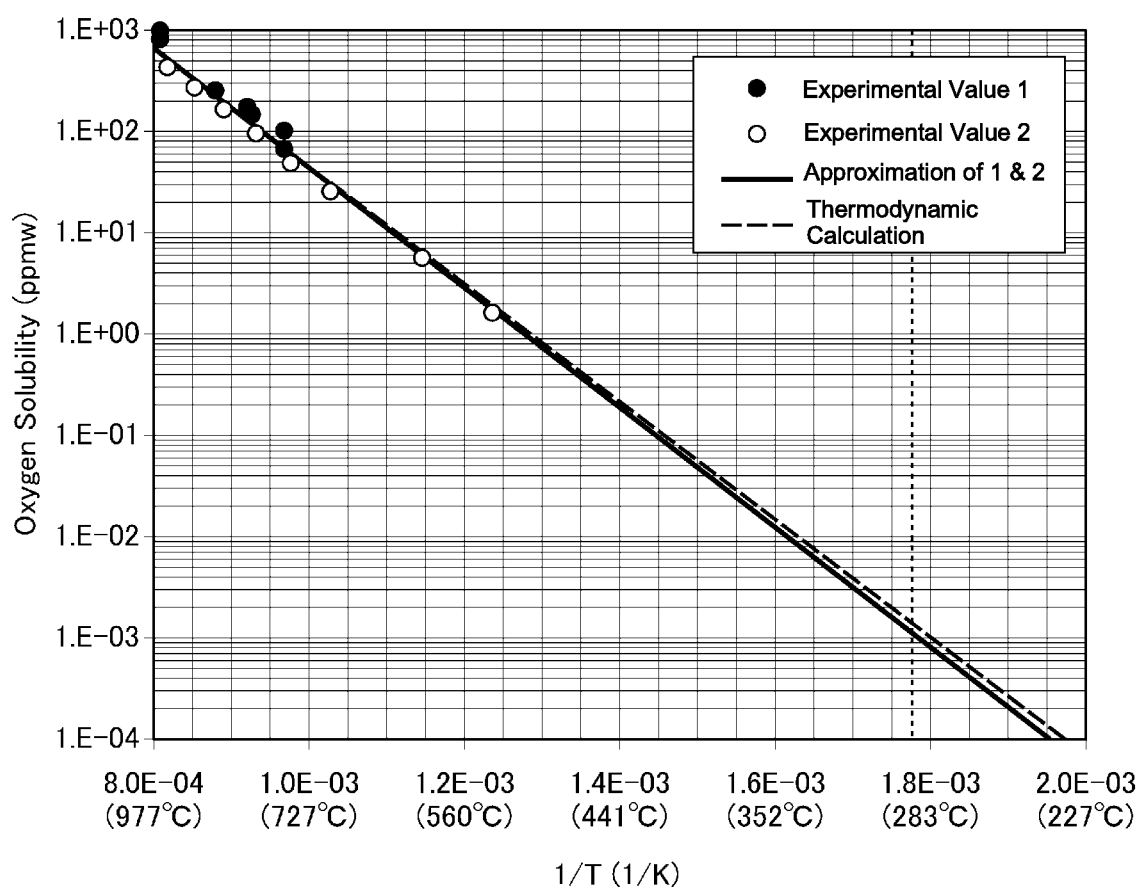
FIG. 4 is a graph illustrating the solubility of oxygen atoms to tin.

FIG. 4 is a graph showing solubility of oxygen atoms to tin.

Oxygen atoms are soluble in the target material 270 contained in the target generator 8A. Solubility of oxygen atoms to tin, a case of the target material 270, may decrease as the temperature of tin decreases, as illustrated in FIG. 4. If the tin is solidified after being heated up to a first melting temperature, and then melted again at a second melting temperature lower than the first melting temperature, undissolved oxygen atoms will remain in an amount that is equal to a result of subtraction by the amount of the oxygen atoms soluble to the tin at the second melting temperature from the amount of the oxygen atoms soluble to the tin at the first melting temperature. Then the undissolved oxygen atoms can bond with tin, to be precipitated as tin oxide as metal oxide.

3.2.4 Operation

Figure 5:
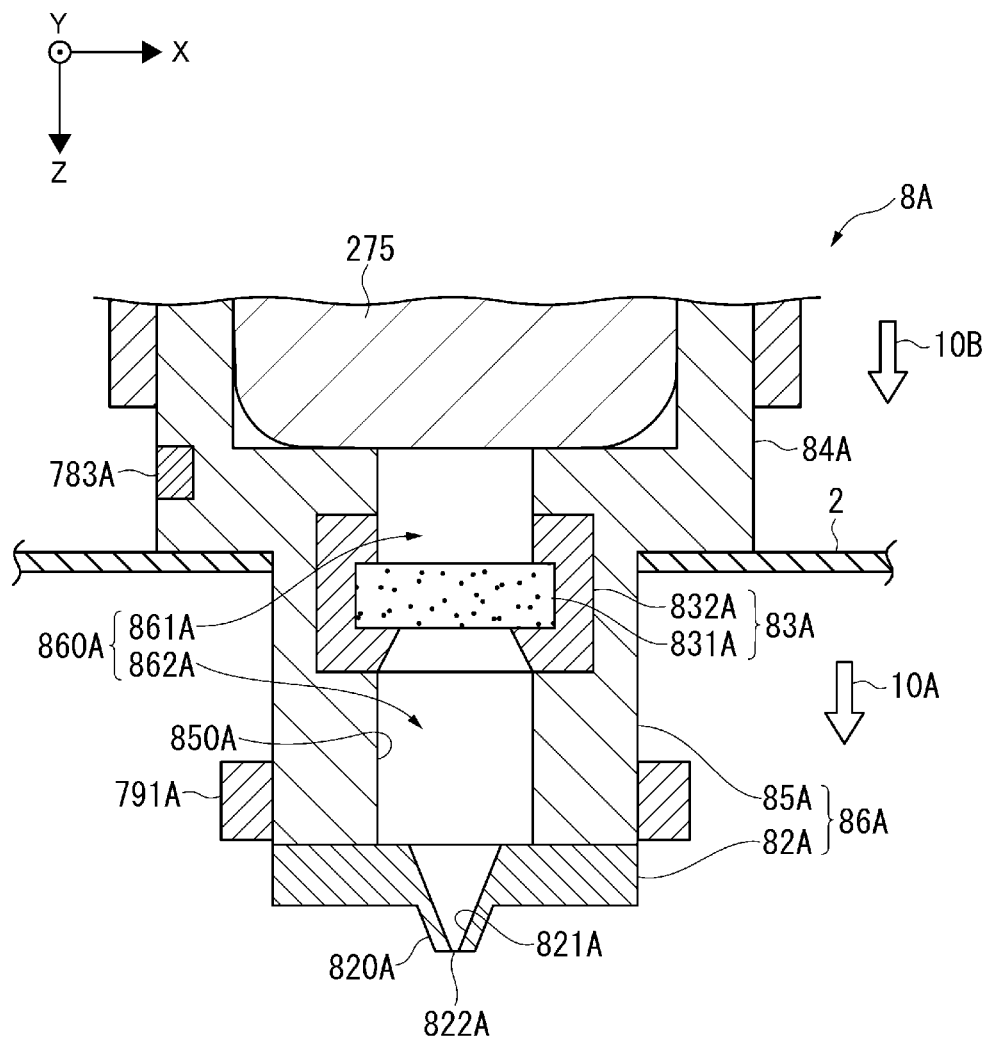
FIG. 5 schematically illustrates a state of a target material heated up to a temperature equal to or higher than a melting point of the target material.
Figure 6:
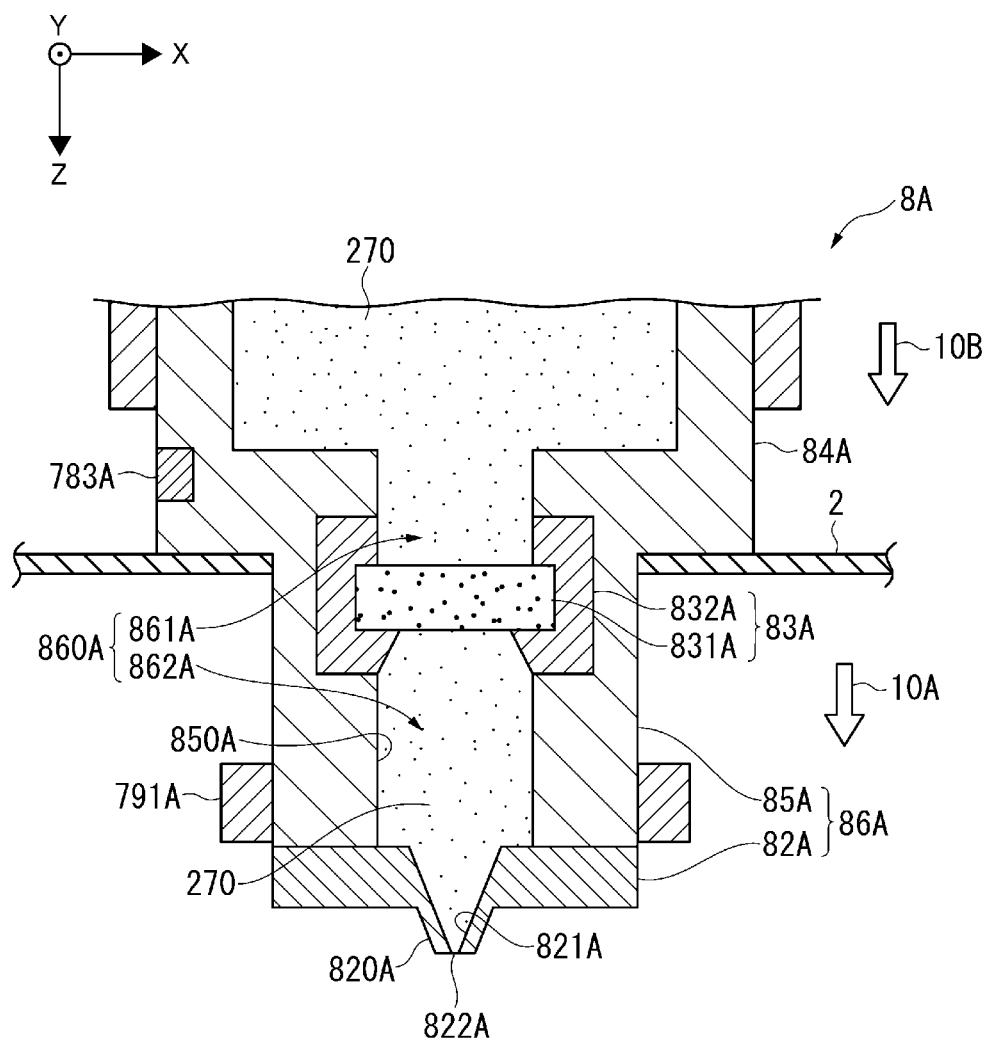
FIG. 6 schematically illustrates a state after the state of FIG. 5.
Figure 7:
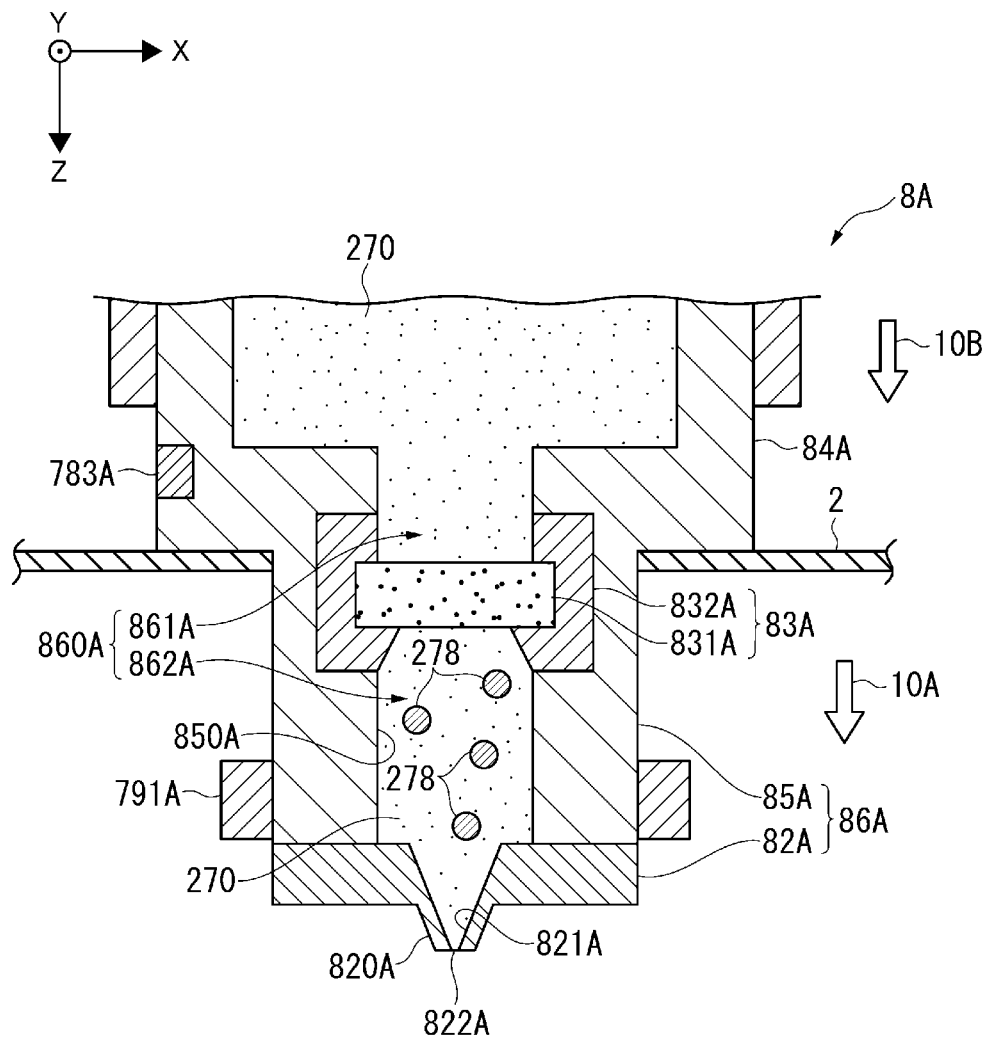
FIG. 7 schematically illustrates a state after the state of FIG. 6.
Figure 8:
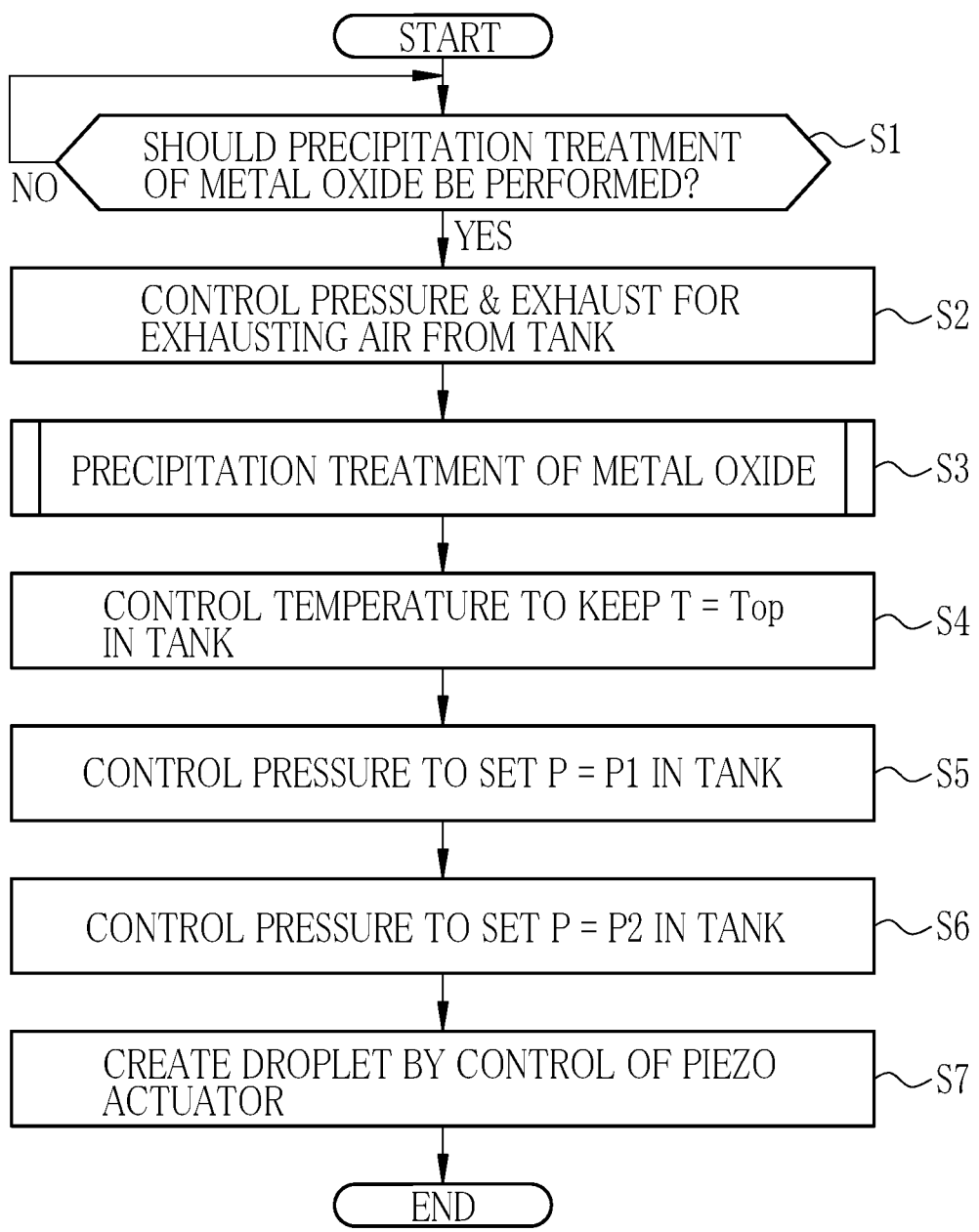
FIG. 8 is a flow chart illustrating a method for refinement of the target material.
Figure 9:
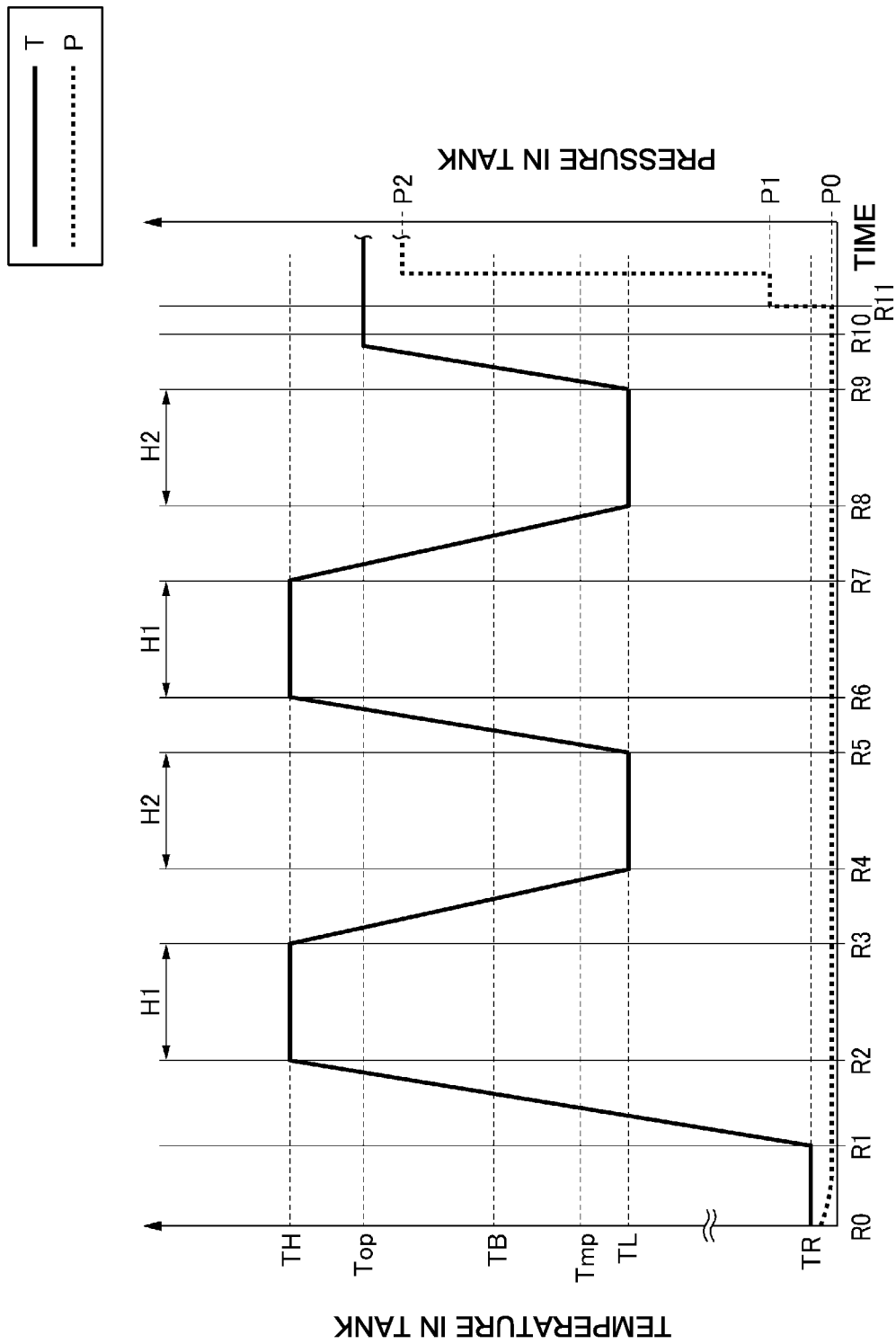
FIG. 9 is a timing chart illustrating the refinement of the target material.
Figure 10:
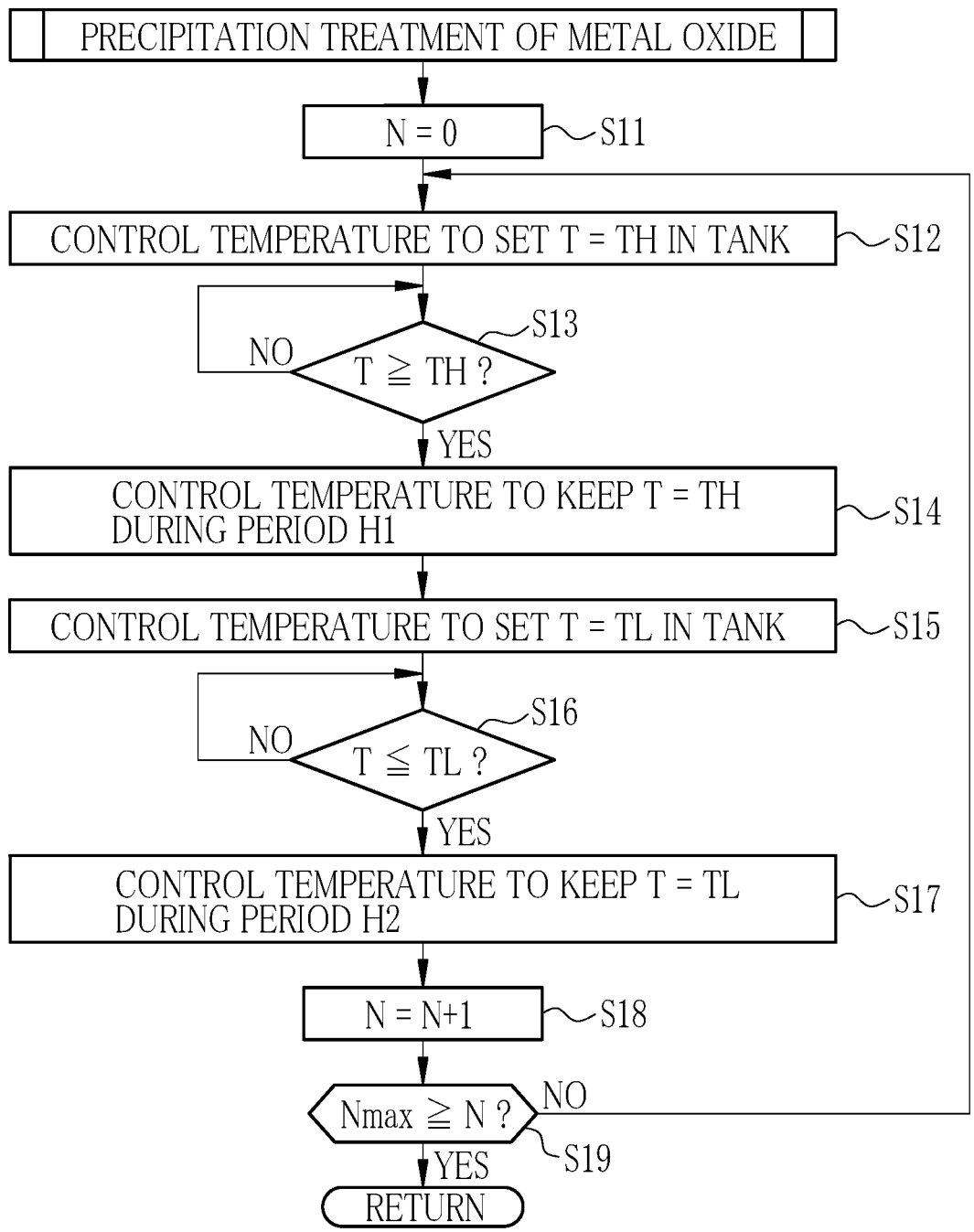
FIG. 10 is a flow chart illustrating a metal oxide precipitation treatment.
Figure 11:
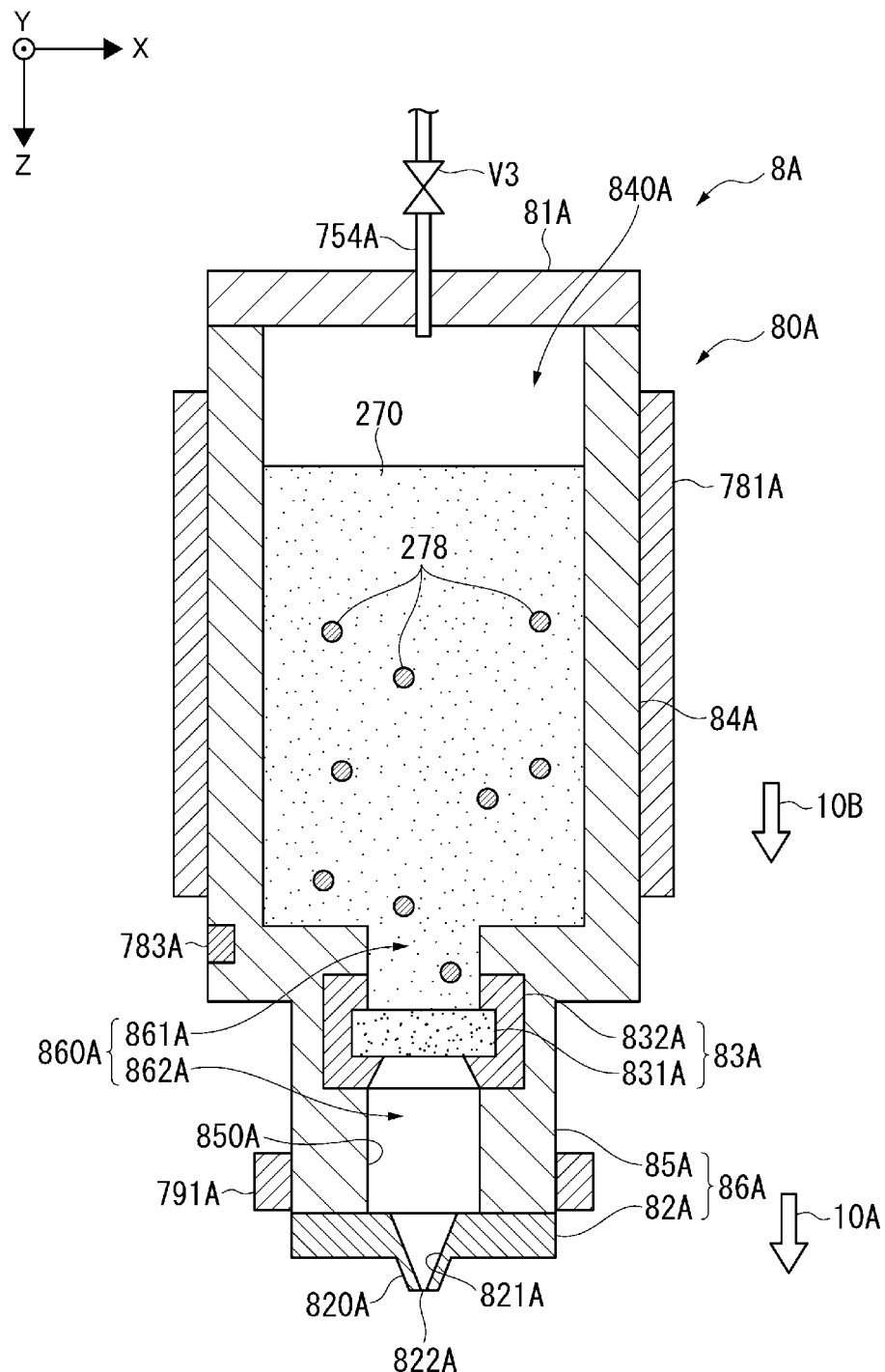
FIG. 11 schematically illustrates a state at the end of the metal oxide precipitation treatment.
Figure 12:
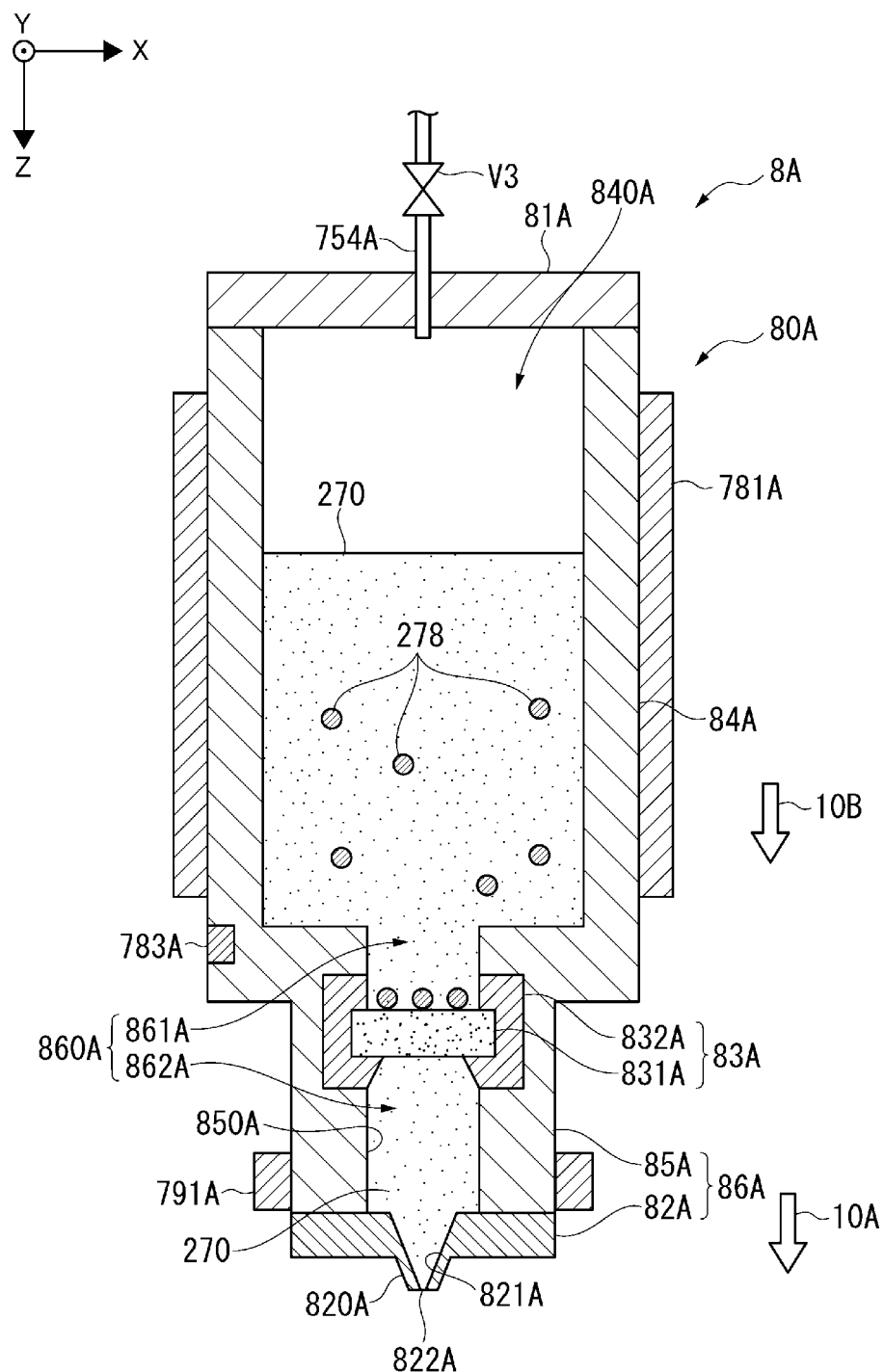
FIG. 12 schematically illustrates a state when the steps for the refinement of the target material are complete.

FIG. 5 schematically illustrates a phenomenon that can occur when the target material is heated up to a predetermined temperature equal to or higher than the melting point of the target material. In FIG. 6, a phenomenon after the phenomenon of FIG. 5 is schematically illustrated. In FIG. 7, a phenomenon after the phenomenon of FIG. 6 is schematically illustrated. FIG. 8 is a flow chart illustrating a method of refinement of the target material. FIG. 9 is a timing chart illustrating the refinement method. FIG. 10 is a flow chart illustrating a process of precipitation treatment for metal oxide. FIG. 11 schematically illustrates a state after the precipitation treatment being complete. In FIG. 12, a state after the completion of the treatment based on the target material refinement method.

The operation of the target supply device 7A will hereinafter be described with reference to an example where tin is the target material 270.

At first, phenomena that can occur in a target supply device will be described, the target supply device having the same structure as the target supply device 7A of the first embodiment except for the target controller.

As shown in FIG. 5, an operator can load an ingot 275 of the target material 270 in the reservoir tank 84A of the target generator 8A. It is not necessary to put the ingot 275 in the communication portion 860A and the filter 831A in the target generator 8A.

The target controller may send a signal to the temperature controller 784A, to heat the ingot 275 in the target generator 8A up to a predetermined temperature equal to or higher than the melting point of the ingot 275. Thus, the ingot 275 can melt to be the target material 270 of a liquid phase. The target controller may send a signal of a predetermined frequency to the piezoelectric element 791A. The piezoelectric element 791A can thereby vibrate so as to generate the droplets 27 from the jet 27A periodically.

The target controller may send a signal to the pressure controller 752A to set the pressure in the reservoir tank 84A at an output pressure P2. Inert gas in the inert gas cylinder 751A is thereby supplied to the reservoir tank 84A, making it possible to stabilize the pressure in the reservoir tank 84A at the output pressure P2.

When the pressure in the reservoir tank 84A becomes higher than a penetration pressure, the target material 270 of the liquid phase in the reservoir tank 84A can penetrate through the filter 831A and enter the second communication passage 862A, as shown in FIG. 6.

The ingot 275 may be produced by a material manufacturer. The temperature in a refining process of the ingot 275 may be approximately 490° to 600° C. during the manufacture of the ingot 275 of high purity by the material manufacturer. According to the relationship shown in FIG. 4, oxygen can be dissolved in the ingot 275 in an amount around 0.6 to 5 ppm (weight ratio).

When the tin is the target material 270, the melting point of the target material 270 can be 232° C. In order to output the droplet 27, the target material 270 in the target generator 8A can be heated up to 240° to 290° C. Solubility of oxygen to the target material 270 in this temperature range can be 0.0001 to 0.001 ppm (weight ratio).

Accordingly, a certain amount of oxygen can theoretically remain undissolved in the target material 270 of the liquid phase obtained by heating the ingot 275 at temperatures in the range of approximately 240° to 290° C.

However, while the ingot 275 is being heated at approximately 240° to 290° C., such oxygen that cannot theoretically be dissolved in the target material 270 at said temperatures can be dissolved in and thus supersaturate the target material 270 with oxygen.

Thus, precipitation of metal oxide 278 (FIG. 7) can be suppressed, as illustrated in FIG. 6, and the target material 270 of the supersaturated state can enter the second communication passage 862A.

When the pressure in the reservoir tank 84A reaches the output pressure P2, the jet 27A can be output from the nozzle 86A and formed into the droplets 27 according to the vibration of the nozzle 86A.

When terminating the creation of the droplet 27, the target controller may send signals to the pressure controller 752A and the piezoelectric element 791A so as to reduce inner pressure in the target generator 8A to the atmospheric pressure, and to stop the vibration of the piezoelectric element 791A. Thus, the output of the jet 27A may be stopped. The creation of the droplets 27 may be completed. The target controller may send a signal to the temperature controller 784A so as to decrease the temperature of the target material 270 down to the room temperature in the reservoir tank 84A. Thus, the target material 270 may solidify in the reservoir tank 84A, the communication portion 860A and the filter 831A.

When restarting creating the droplets 27, the target controller can operate to heat the solidified target material 270 at temperatures in the range of approximately 240° to 290° C. According to the findings of the inventors, metal oxide 278 can precipitate when the target material 270 is heated again after being solidified. As shown in FIG. 7, the oxygen dissolved in the target material 270 in the supersaturated state can be considered to react with the target material 270, causing the precipitation of metal oxide 278 in the reservoir tank 84A and the first and second communication passages 861A and 862A. The metal oxide 278 precipitated in the second communication passage 862A can clog or narrow the nozzle hole 822A.

To solve this problem, the target controller 71A may perform the following control in the target supply device 7A.

The operator, after putting the ingot 275 in the reservoir tank 84A of the target generator 8A, may close the lid 81A for sealing. As shown in FIG. 8, the target controller 71A may determine whether precipitation of metal oxide 278 should be performed (step S1). The step S1 may be executed at a time point R0 in FIG. 9. The target controller 71A may make the determination in step S1 depending upon whether a signal for executing the precipitation treatment is input from the EUV light generation control system 5A or from an external apparatus.

If, in the step S1, the target controller 71A determines that no signal for executing the precipitation treatment is input, the target controller 71A may repeat the step S1 after a predetermined time interval. However, if the target controller 71A determines that there is an input of the signal for executing the precipitation treatment in the step S1, then the target controller 71A may control the pressure adjuster 75A and the gas exhauster 77A to exhaust air from the reservoir tank 84A (step S2). Thus, as shown in FIG. 9, the pressure P in the reservoir tank 84A can decrease to a pressure level P0. While the pressure P in the reservoir tank 84A is at the pressure P0, the reservoir tank 84A may be in a substantially vacuum state where the internal pressure is lower than the atmospheric pressure.

The target controller 71A may perform the precipitation treatment for metal oxide 278 (step 3).

In the step S3 as shown in FIG. 10, the target controller 71A may set the number N of times of the conducted thermal cycles of heating and cooling the target material to 0 (step S11). The target controller 71A may control the temperature adjuster 78A so as to make the temperature T in the reservoir tank 84A equal to a temperature TH (step S12). The step S12 may be executed at a time point R1 in FIG. 9. The temperature TH may be higher than the melting point Tmp of the target material 270 and in a level in which reaction between the reservoir tank 84A and the target material 270 is inhibited. Preferably, the temperature TH may be in the range of 280° to 300° C., for example, 290° C. The temperature TH may correspond to the first temperature of the present disclosure. When the temperature in the reservoir tank 84A becomes higher than the melting point Tmp of the target material 270, the ingot 275 can melt to become the target material 270 of a liquid phase. As the pressure P in the reservoir tank 84A is at the pressure P0 that is not higher than the penetration pressure, the target material 270 of the liquid phase cannot enter or pass the filter 831A, but is located only in the reservoir tank 84A and the first communication passage 861A, as shown in FIG. 11.

The temperature controller 784A in the temperature adjuster 78A may receive a signal from the temperature sensor 783A and send the signal to the target controller 71A. Referring to FIG. 10, the target controller 71A may determine by the signal from the temperature adjuster 78A whether the temperature T is equal to or higher than the temperature TH (step S13). If it is determined in the step S13 that the temperature T is not yet equal to or higher than the temperature TH, then the target controller 71A may repeat step S13 after a lapse of predetermined time. If it is determined in the step S13 that the temperature T has become equal to or higher than the temperature TH, then the target controller 71A may control the temperature adjuster 78A to maintain the temperature T at the temperature TH for a period H1 (step S14). The step S14 may be performed from a time point R2 to a time point R3 in FIG. 9. The period H1 may range from 1 hour to 10 hours, for example. More preferably, the period H1 may range from 4 to 8 hours, for example. As described above with reference to FIG. 6, also those oxygen which cannot be dissolved in the target material 270 at the temperature TH can be dissolved in the target material 270 under this condition, bringing the target material 270 into a supersaturated state. Thus, the precipitation of metal oxide 278 can be inhibited.

The target controller 71A may control the temperature adjuster 78A so as to set the temperature T in the reservoir tank 84A equal to a temperature TL (step S15). The step S15 may be executed at the time point R3 in FIG. 9. The temperature TL may be a temperature at which metal oxide 278 can precipitate but the target material 270 of the liquid phase does not solidify, or a temperature at which the target material 270 solidifies and metal oxide 278 precipitates in the solidified target material 270. The temperature TL may be a predetermined temperature that is equal to or higher than but near the melting point Tmp and in the range of 232° to 240° C. The temperature TL may also be a predetermined temperature that is lower than the melting point Tmp and in the range of 20° to 220° C. in which the target material 270 solidifies. Preferably, the temperature TL may be a predetermined temperature in the range of 30° to 60° C. Setting the temperature TL lower than the melting point Tmp is more preferable because the precipitation of metal oxide 278 can be facilitated in comparison with the case where the temperature TL is equal to or higher than the melting point Tmp. The temperature TL may be a second temperature of the present disclosure. Furthermore, the temperature TL may be lower than the melting point Tmp and equal to the room temperature TR.

The target controller 71A may determine whether the temperature T is equal to or lower than the temperature TL on the basis of a signal from the temperature adjuster 78A, (step S16). If it is determined in the step S16 that the temperature T has not become equal to or lower than the temperature TL, then the target controller 71A may repeat the step S16 after a lapse of predetermined time. If it is determined in the step S16 that the temperature T has become equal to or lower than the temperature TL, then the target controller 71A may control the temperature adjuster 78A to maintain the temperature T at the temperature TL for a period H2 (step S17). The step S17 can be performed from a time point R4 to a time point R5 in FIG. 9. The period H2 may range from 1 hour to 20 hours, and more preferably 6 hours to 13 hours, for example. By maintaining the temperature T at the temperature TL in the reservoir tank 84A, such oxygen that has been dissolved in the target material 270 in the supersaturated state but cannot be dissolved therein at the temperature TL can be precipitated as metal oxide 278, as shown in FIG. 11.

As shown in FIG. 10, the target controller 71A may add 1 to the number N of times of the thermal cycles of heating and cooling (step S18). The target controller 71A may determine whether the number N of times of the thermal cycles has reached or exceeds an upper limit number Nmax (step S19). If it is determined in the step S19 that the number N of times of the thermal cycles has not reached the upper limit number Nmax, the target controller 71A may perform the step S12. In contrast, if it is determined that the number N of times of the thermal cycles has reached or exceeds the upper limit number Nmax, the target controller 71A may perform the step S4 in FIG. 8. The upper limit number Nmax may be set at 1 or a number between 2 and 30 inclusive. Preferably, the upper limit number Nmax may be set in the range of 3 to 17.

When the upper limit number Nmax of thermal cycles is 2, the step S12 may be executed at time points R1 and R5 in FIG. 9. The step S14 may be performed during a period between the time points R2 and R3 and during a period between time points R6 and R7. The step S15 may be executed at time points R3 and R7. The step S17 may be performed during a period between time points R4 and R5 and during a period between time points R8 and R9. Thus, the precipitation treatment for precipitating oxygen as metal oxide 278 may end at the time point R9.

Through the above precipitation treatment for metal oxide 278, oxygen dissolved in the target material 270 of the supersaturated state but not dissolvable therein at the temperature TL can be precipitated as metal oxide 278. Thus, after the precipitation treatment for metal oxide 278, the target material 270 can be free from the supersaturated state. In other words, the target material 270 after the precipitation treatment can contain no such oxygen that cannot be dissolved therein at the temperature TL.

In step S4 as shown in FIG. 8, the target controller 71A may control the temperature adjuster 78A so as to keep the temperature T in the reservoir tank 84A equal to the output temperature Top. The output temperature Top may be a predetermined temperature between the melting point Tmp and the temperature TH. The target controller 71A may control the pressure adjuster 75A so as to set the pressure P in the reservoir tank 84A equal to a penetration pressure P1 (step S5). The step S5 may be executed at a time point R11 later than a time point R10 in FIG. 9. The penetration pressure P1 may, for example, be 2 MPa. Through the step S5, the metal oxide 278 can be trapped in the filter 831A, and the target material 270 free from the supersaturated state can pass through the filter 831A and enter the second communication passage 862A. As shown in FIG. 12, the target material 270 downstream of the filter 831A can reach the nozzle hole 822A at a time point R12 in FIG. 9.

The target controller 71A may control the pressure adjuster 75A so that the pressure P inside the reservoir tank 84A can become the output pressure P2 (step S6). The step S6 may be executed at the time point R12 in FIG. 9. An example of the output pressure P2 may be 10 MPa. The target material 270 can be output as a jet 27A by means of the step S6.

In addition, the target controller 71A may control the piezoelectric element 791A to create the droplet 27 in a predetermined form (step S7). Thus, the refinement of the target material can be completed.

After refining the target material 270, the EUV light generation system 11 may transit to a process for generating the EUV light 252. Alternatively, the target controller 71A, after the refinement of the target material, may lower the temperature T in the reservoir tank 84A to the room temperature TR, to solidify the target material 270 in the target generator 8A. In another alternative, the target material 270 may be refined by a device specific to the above-described refining treatment, which is not provided in the EUV light generation apparatus 1A. In that case, the target generator 8A containing the target material 270 may be transferred from the specific device and attached to the EUV light generation apparatus 1A, after the target material 270 is refined and solidified in the specific device.

Furthermore, the target controller 71A in the first embodiment may perform the following steps for precipitation of metal oxide 278. The target controller 71A may control the temperature T of the target material 270 in the reservoir tank 84A so that the oxygen having been dissolved in the target material 270 of the supersaturated state can precipitate as metal oxide 278. The target controller 71A may change the temperature T of the target material 270 in the reservoir tank 84A at least one time between the temperature TH and the temperature TL while the target material 270 is not contained in the second communication passage 862A. For example, the target controller 71A may perform this change while making the inside of the reservoir tank 84A in a substantially vacuum state.

After the precipitation treatment for metal oxide 278 described above, the target controller 71A may control pressure in the reservoir tank 84A so as the target material 270 to pass through the filter 831A in the reservoir tank 84A.

Through the processes described as far, the metal oxide 278 can be trapped in the filter 831A, and the target material 270 free from the supersaturated state can enter the second communication passage 862A. Thus, solidifying and thereafter re-melting the target material 270 in the target generator 8A can suppress precipitation of the metal oxide 278 from the target material 270 which has entered the second communication passage 862A. It is possible to inhibit the metal oxide 278 from clogging or narrowing the nozzle hole 822A.

It is also possible for the target controller 71A to change the temperature T of the target material 270 in the reservoir tank 84A multiple times between the temperature TH and the temperature TL. This can help the metal oxide 278 grow larger in comparison with a single change of the temperature T between the temperature TH and the temperature TL. As a result, the content of oxygen in the target material 270 can be more reduced after the precipitation treatment for metal oxide 278, and thus precipitation of the metal oxide 278 from the target material 270 in the second communication passage 862A can be suppressed.

3.2.5 Variation of the First Embodiment
3.2.5.1. Operation

Figure 13:
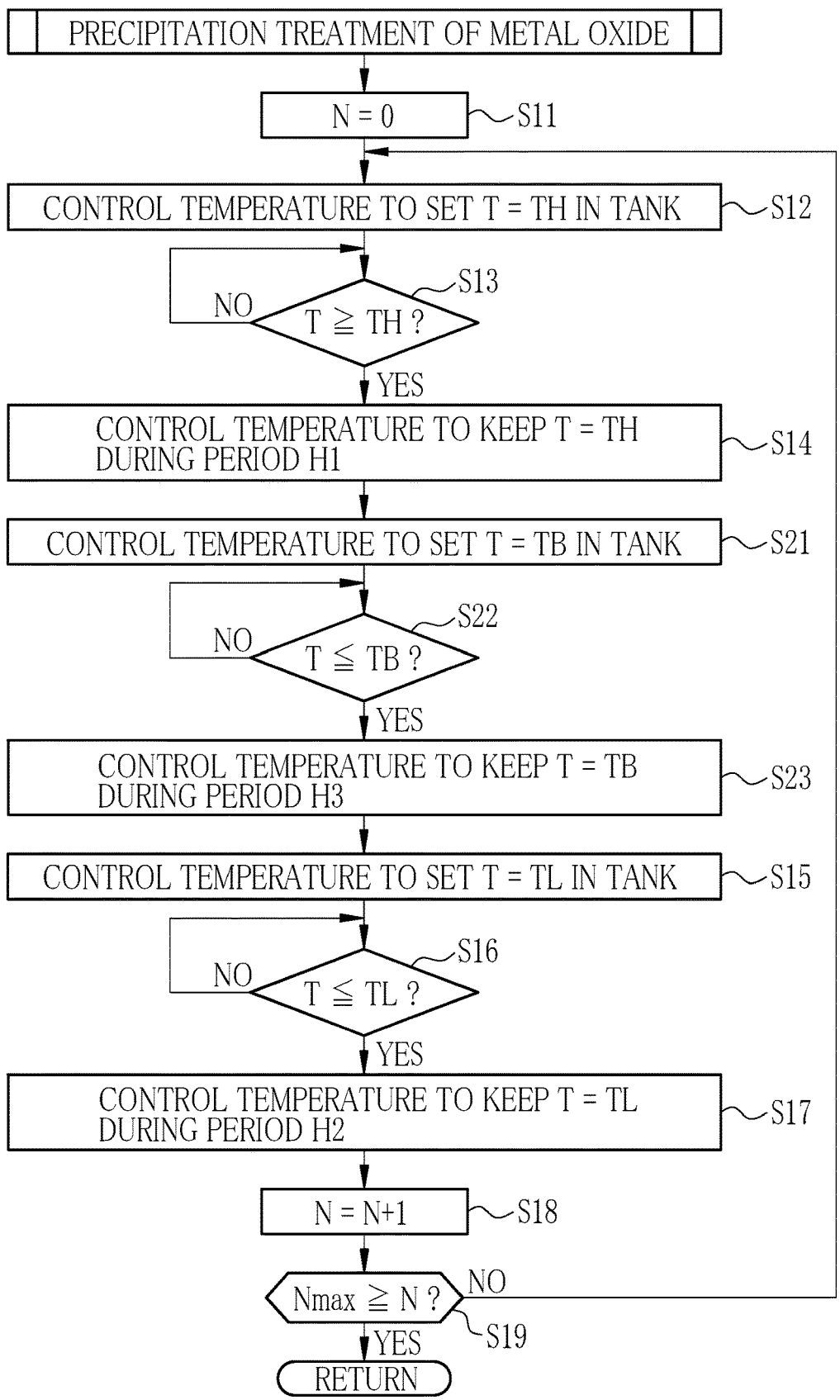
FIG. 13 is a flow chart illustrating a metal oxide precipitation treatment in a variation of the first embodiment.
Figure 14:
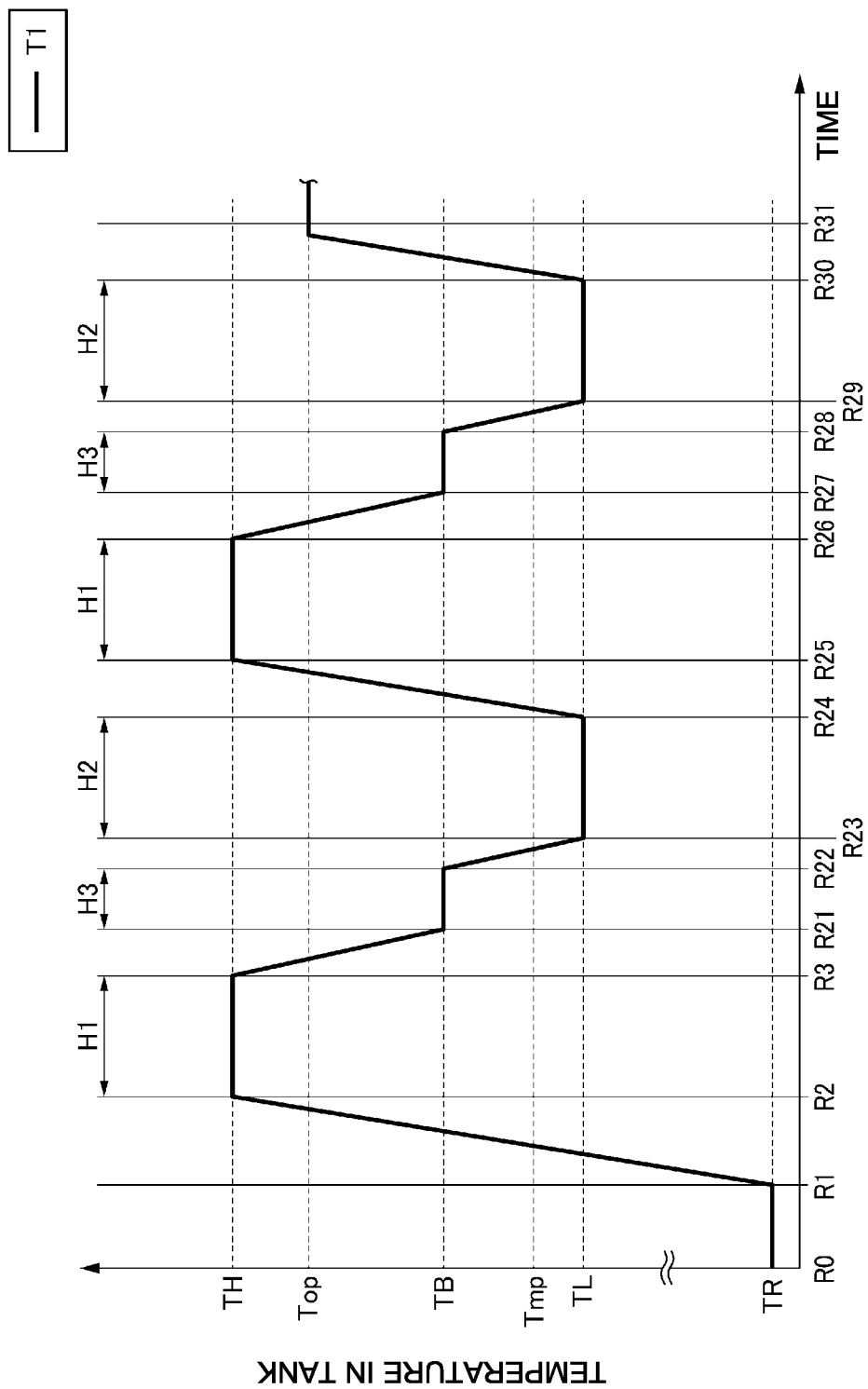
FIG. 14 is a timing chart illustrating a method for refinement of the target material.

In FIG. 13, a flow chart of a metal oxide precipitation treatment according to a variation of the first embodiment is illustrated. In FIG. 14, a timing chart illustrating a target material refining method is illustrated.

The variation of the first embodiment may include the same steps for metal oxide precipitation treatment as in the first embodiment except but further include steps S21, S22 and S23.

As shown in FIG. 13, the target controller 71A, after performing the steps S11 to S14 of the first embodiment, may control the temperature adjuster 78A to set the temperature T in the reservoir tank 84A equal to a temperature TB (step S21). The step S21 can be executed at the time point R3 in FIG. 14. The temperature TB may be a temperature at which the metal oxide 278 can grow larger after the precipitation. An example of the temperature TB may be equal to or higher than the melting point Tmp, and may be 240° C., for example.

The target controller 71A may determine whether the temperature T has become equal to or lower than the temperature TB on the basis of a signal from the temperature adjuster 78A (step S22). If it is determined in the step S22 that the temperature T has not become equal to or lower than the temperature TB, then the target controller 71A may repeat the step S22 after a lapse of predetermined time. If it is determined in the step S22 that the temperature T has become equal to or lower than the temperature TB, then the target controller 71A may control the temperature adjuster 78A to maintain the temperature T at the temperature TB for a period H3 (step S23). The step S23 may be performed from a time point R21 to a time point R22 in FIG. 14. The period H3 may range from 10 minutes to 2 hours, and may be 30 minutes, for example. By maintaining the temperature T at the temperature TB in the reservoir tank 84A, a certain amount of oxygen that has been dissolved in a supersaturated state in the target material 270 but cannot be dissolved therein at the temperature TB can be precipitated as metal oxide 278, and then the metal oxide 278 can grow larger.

Then the target controller 71A may perform the steps S15 to S19, as with the first embodiment. The precipitation treatment of the metal oxide 278 can be terminated by the step S19. After the step S19, the target controller 71A may perform the steps S4 to S7 of the first embodiment.

When the upper limit number Nmax of thermal cycles is 2, for example, the step S12 may be executed at time points R1 and R24 in FIG. 14. The step S14 may be performed during a period between the time points R2 and R3 and during a period between time points R25 and R26. The step S21 may be executed at the time points R3 and R26. The step S23 may be performed during a period between time points R21 and R22 and during a period between time points R27 and R28. The step S15 may be executed at the time points R22 and R28. The step S17 may be performed during a period between the time points R23 and R24 and during a period between time points R29 and R30. The precipitation treatment of the metal oxide 278 may be completed at the time point R30. The step S5 may be executed at a time point R31.

In the variation of the first embodiment, the target controller 71A may maintain the temperature at the temperature TB for a predetermined time in the course of lowering the temperature T of the target material 270 in the reservoir tank 84A from the temperature TH to the temperature TL. Thus, the metal oxide 278 can grow larger in comparison with the first embodiment. As a result, the content of oxygen in the target material 270 after the precipitation treatment for metal oxide 278 can decrease to inhibit precipitation of metal oxide 278 from the target material 270 in the second communication passage 862A.

3.3 Second Embodiment
3.3.1 Configuration

Figure 15:
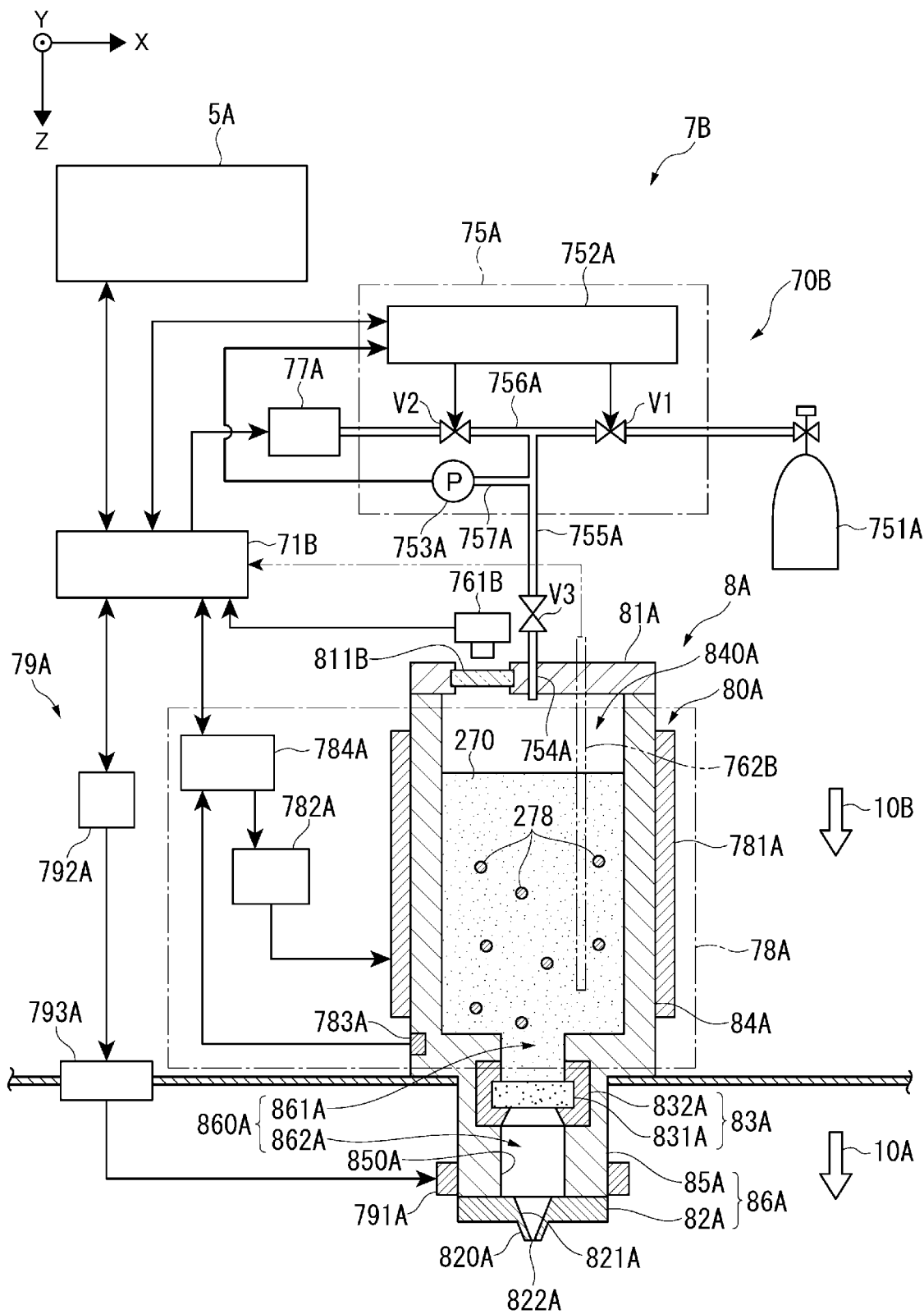
FIG. 15 schematically illustrates a target supply device of a second preferred embodiment.

FIG. 15 schematically shows a configuration of a target supply device according to a second embodiment.

As shown in FIG. 15, the target supply device 7B of the second embodiment may include a target generating section 70B, and a target controller 71B as a controlling section.

To the target generating section 70B, it is possible to apply the same configuration as the target generating section 70A of the first embodiment, except that a window 811B is provided in a lid 81A of a target generator 8A, and a camera 761B as an imaging section is further included therein.

The camera 761B may be disposed outside the target generator 8A and in face to the window 811B, and may be connected electrically to the target controller 71B. The camera 761B may be a CCD camera, and is capable of imaging solidification or melting of the target material 270 in the reservoir tank 84A through the window 811B. The camera 761B may send a signal corresponding to an acquired image to the target controller 71B.

When the target material 270 in the reservoir tank 84A solidifies, the target material 270 can also solidify in the communication portion 860A. When the target material 270 in the reservoir tank 84A melts, the target material 270 can also melt in the communication portion 860A.

3.3.2 Operation

Figure 16:
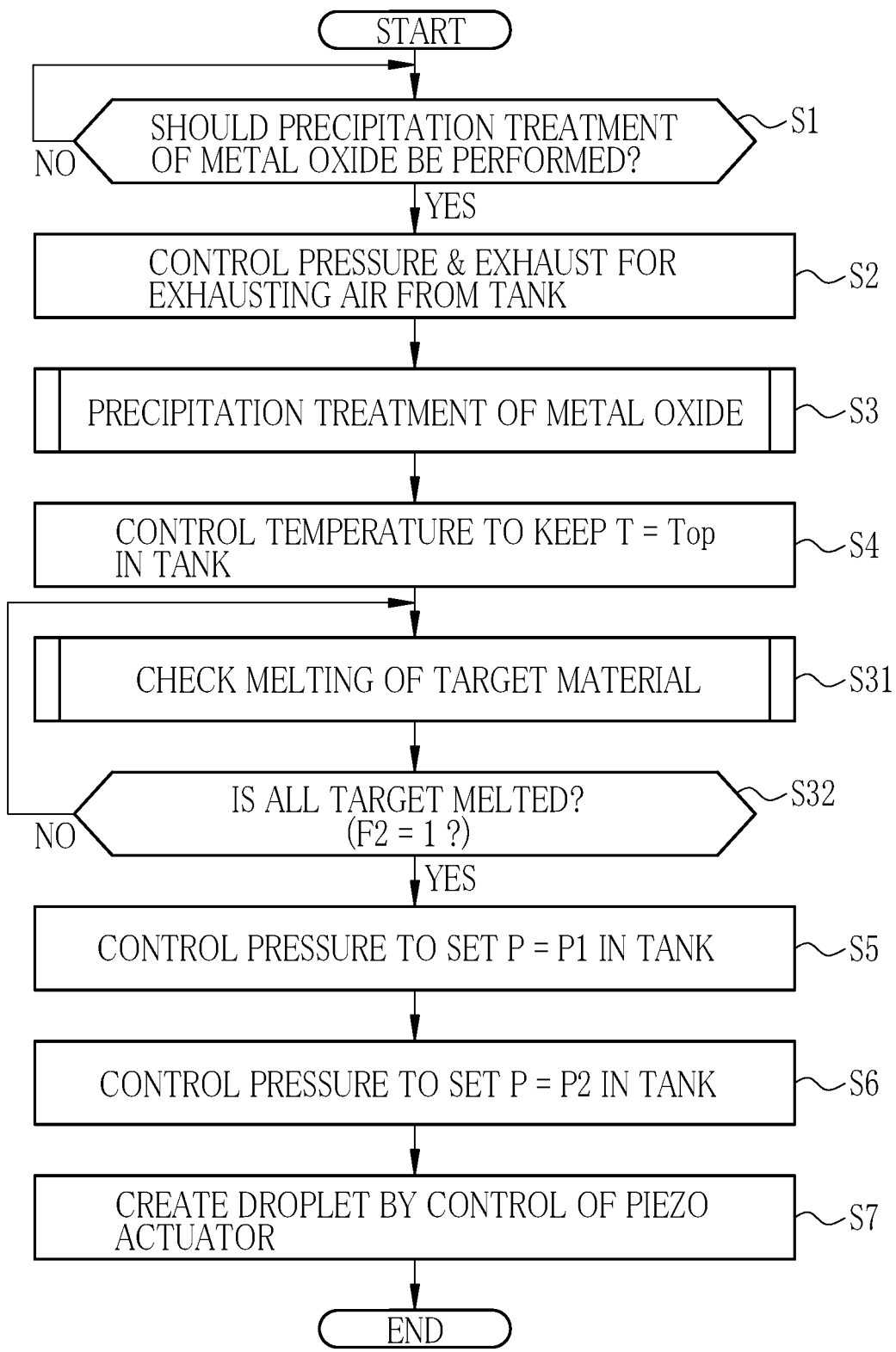
FIG. 16 is a flow chart illustrating a method for refinement of the target material in the second embodiment.
Figure 17:
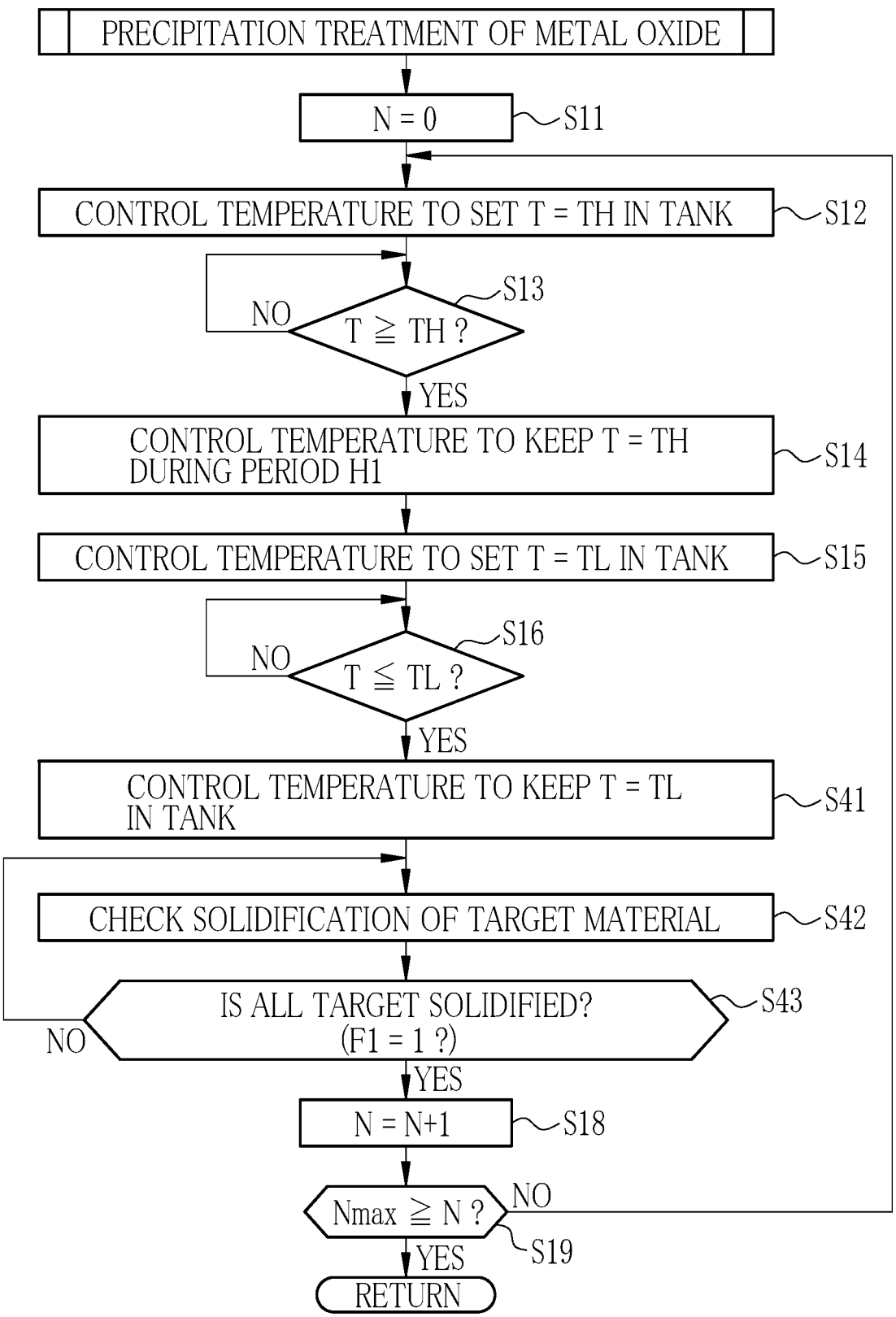
FIG. 17 is a flow chart illustrating a metal oxide precipitation treatment.
Figure 18:
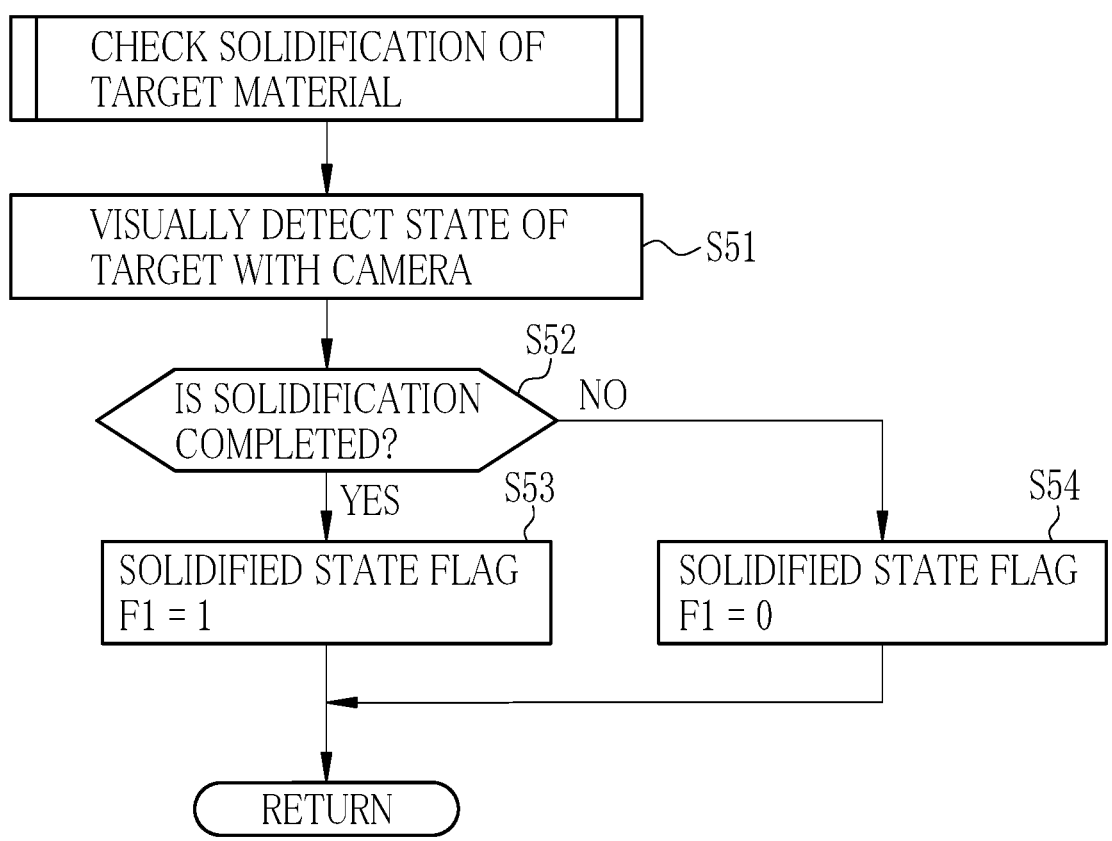
FIG. 18 is a flow chart illustrating a process for checking solidification of the target material.
Figure 19:
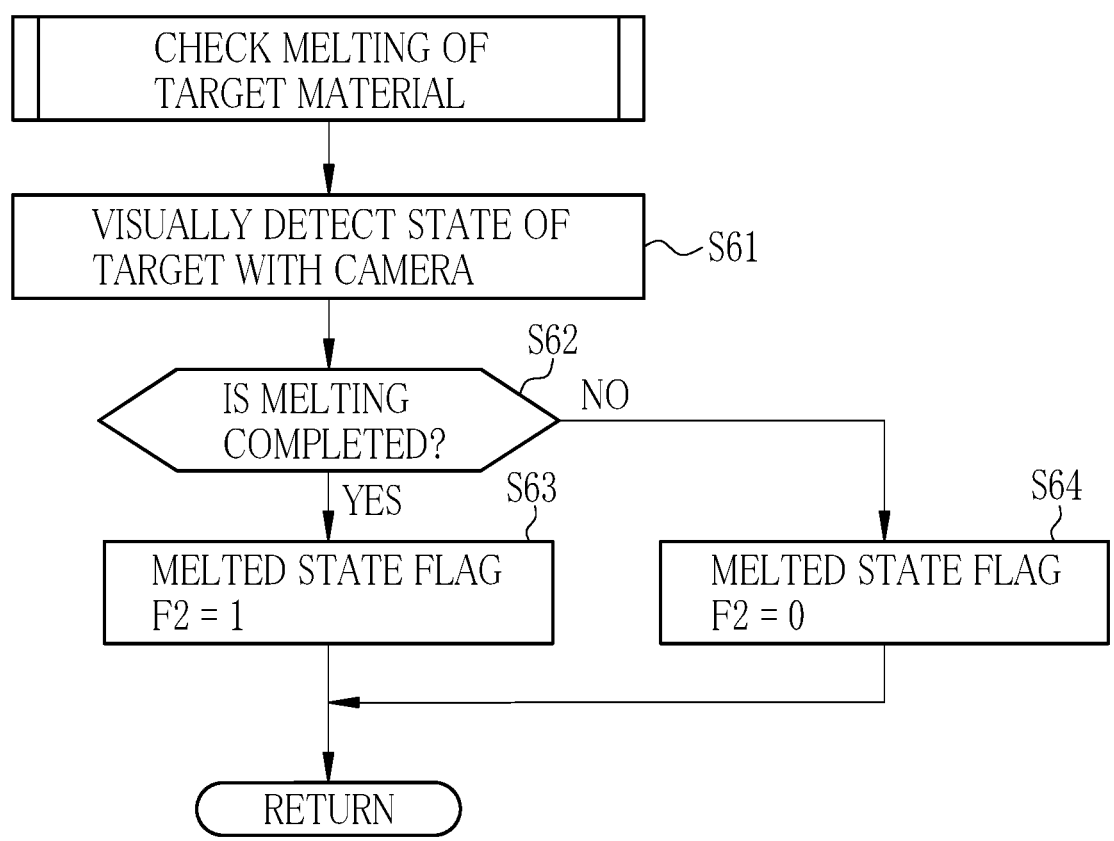
FIG. 19 is a flow chart illustrating a process for checking melting of the target material.

FIG. 16 is a flow chart illustrating a method for refinement of the target material according to the second embodiment. FIG. 17 is a flow chart illustrating a metal oxide precipitation treatment. FIG. 18 is a flow chart illustrating a process for checking solidification of the target material. FIG. 19 is a flow chart illustrating a process for checking melting of the target material.

The target supply device 7B will be described hereinafter with reference to an example wherein tin is the target material 270.

The metal oxide precipitation treatment of the second embodiment may include the same steps as the metal oxide precipitation treatment of the first embodiment except but further includes a step of checking if the target material 270 is solidified. The refinement of the target material of the second embodiment may include the same steps for the refinement of the target material as in the first embodiment except but further include a step of checking if the target material 270 is melted.

As shown in FIG. 16, the target controller 71B may perform the steps S1 to S4 of the first embodiment and then check the state of melting of the target material 270 (step S31).

In the step S3, as shown in FIG. 17, the target controller 71B may control the temperature adjuster 78A so as to keep the temperature T in the reservoir tank 84A at the temperature TL after performing the steps S11 to S16 of the first embodiment (step S41). The target controller 71B may check the state of solidification of the target material 270 (step S42).

In step S42, as shown in FIG. 18, the target controller 71B may visually detect the state of the target material 270 with the camera 761B through the window 811B (step S51). On the basis of the result of the visual detection in the step S51, the target controller 71B may determine whether the target material 270 has completed solidification (step S52). The target controller 71B may determine whether the target material 270 has completed solidification, by processing the image acquired by the camera 761B.

If it is determined in the step S52 that the solidification of the target material 270 is complete, the target controller 71B may set 1 for a solidified state flag F1 (step S53). If, in the step S52, it is determined that the solidification of the target material 270 is not complete, the target controller 71B may set 0 for the solidified state flag F1 (step S54). The check of the solidification of the target material 270 is completed by performing the step S53 or S54.

After performing the step S42 in FIG. 17, the target controller 71B may determine whether all the target material 270 has been solidified (step S43). If the solidified state flag F1=1, the target controller 71B can determine that all the target material 270 has been solidified. If the solidified state flag F1=0, the target controller 71B can determine that at least part of the target material 270 has not been solidified. If it is determined in the step S43 that at least part of the target material 270 has not been solidified, then the target controller 71B may perform the step S42. If it is determined in the step S43 that all the target material 270 has been solidified, then the target controller 71B may perform the step S18.

The precipitation treatment for the metal oxide 278 can be terminated by performing the steps S18 and S19.

Upon completion of the step S3, the target controller 71B may perform the step S4, as shown in FIG. 16. Thereafter, the target controller 71B may check the melting state of the target material 270 (step S31).

In step S31, as shown FIG. 19, the target controller 71B may visually detect the state of the target material 270 with the camera 761B through the window 811B (step S61). On the basis of the result of the visual detection in the step S61, the target controller 71B may determine whether the target material 270 has completed melting(step S62). Also, the target controller 71B may determine whether the melting of the target material 270 has completed, by processing the image acquired by the camera 761B.

If the target controller 71B determines that the target material 270 completes melting in the step S62, the target controller 71B may set 1 for a melted state flag F2 (step S63). If the target controller 71B determines in the step S62 that the target material 270 has not completely melted, the target controller 71B may set 0 for the melted state flag F2 (step S64). The check of melting of the target material 270 can be completed by performing the step S63 or S64.

Referring to FIG. 16, the target controller 71B may determine, after the step S31, whether all the target material 270 has melted (step S32). When the melted state flag F2 is 1, the target controller 71B may determine that the target material 270 has entirely melted. When the melted state flag F2 is 0, the target controller 71B may determine that at least part of the target material 270 has not melted. If it is determined in the step S32 that at least part of the target material 270 has not melted, the target controller 71B may perform the step S31. In contrast, if it is determined in the step S32 that the target material 270 has entirely melted, the target controller 71B may perform the steps S5 to S7.

If the upper limit number Nmax of times of the thermal cycles is set at 2, the steps S41 to S43 may be performed between time points R4 and R5 and between time points R8 and R9 in FIG. 9.

3.3.3 Variation of the Second Embodiment
3.3.3.1 Configuration

A target generating section 70B in the variation of the second embodiment may have the same configuration as the target generating section 70B except but a temperature sensor 762B as indicated by a phantom line in FIG. 15 is provided as an alternative to the camera 761B and no window 811B is provided in the lid 81A.

The temperature sensor 762B may be disposed to extend through the lid 81A into the target material 270 contained in the reservoir tank 84A. The temperature sensor 762B may be connected electrically to the target controller 71B. The temperature sensor 762B may be coated with a material of low reactivity to the target material 270. The temperature sensor 762B may detect a temperature of the target material 270 in the reservoir tank 84A and send a temperature signal corresponding to the detected temperature to the target controller 71B.

3.3.3.2 Operation

Figure 20:
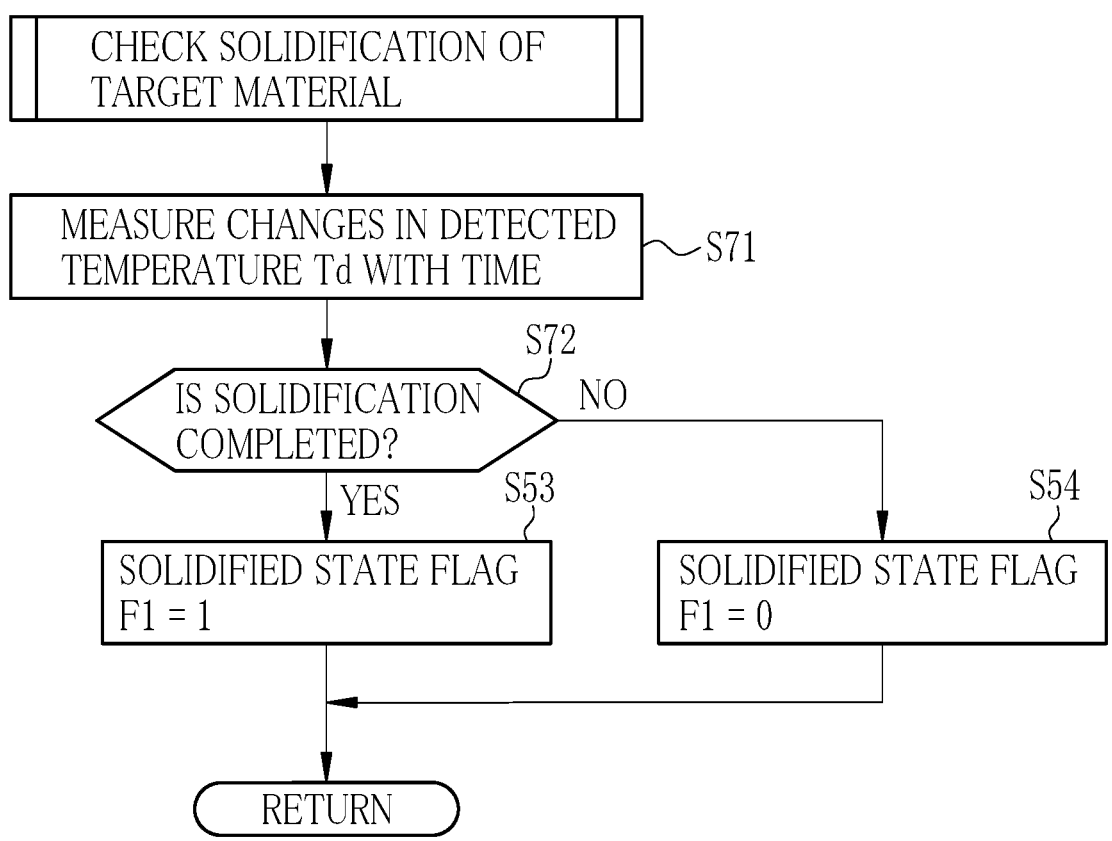
FIG. 20 is a flow chart illustrating a process for checking solidification of the target material in a variation of the second embodiment.
Figure 21:
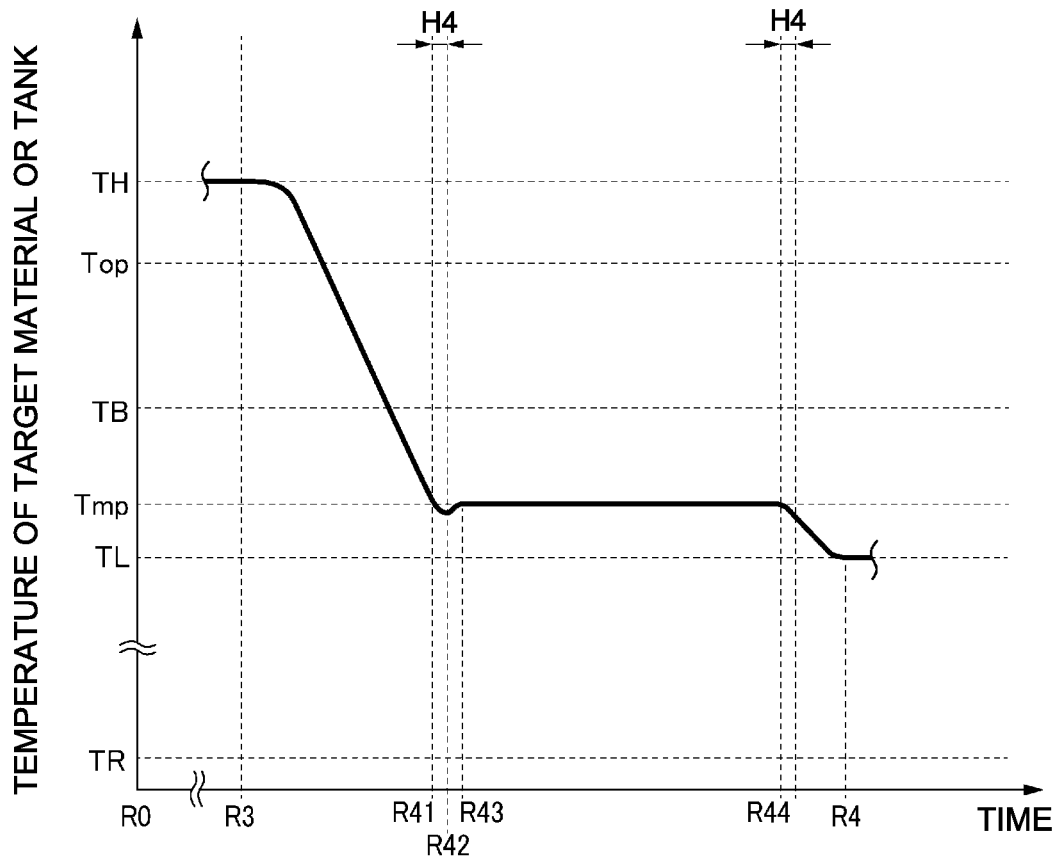
FIG. 21 is a timing chart illustrating the process for checking solidification of the target material.
Figure 22:
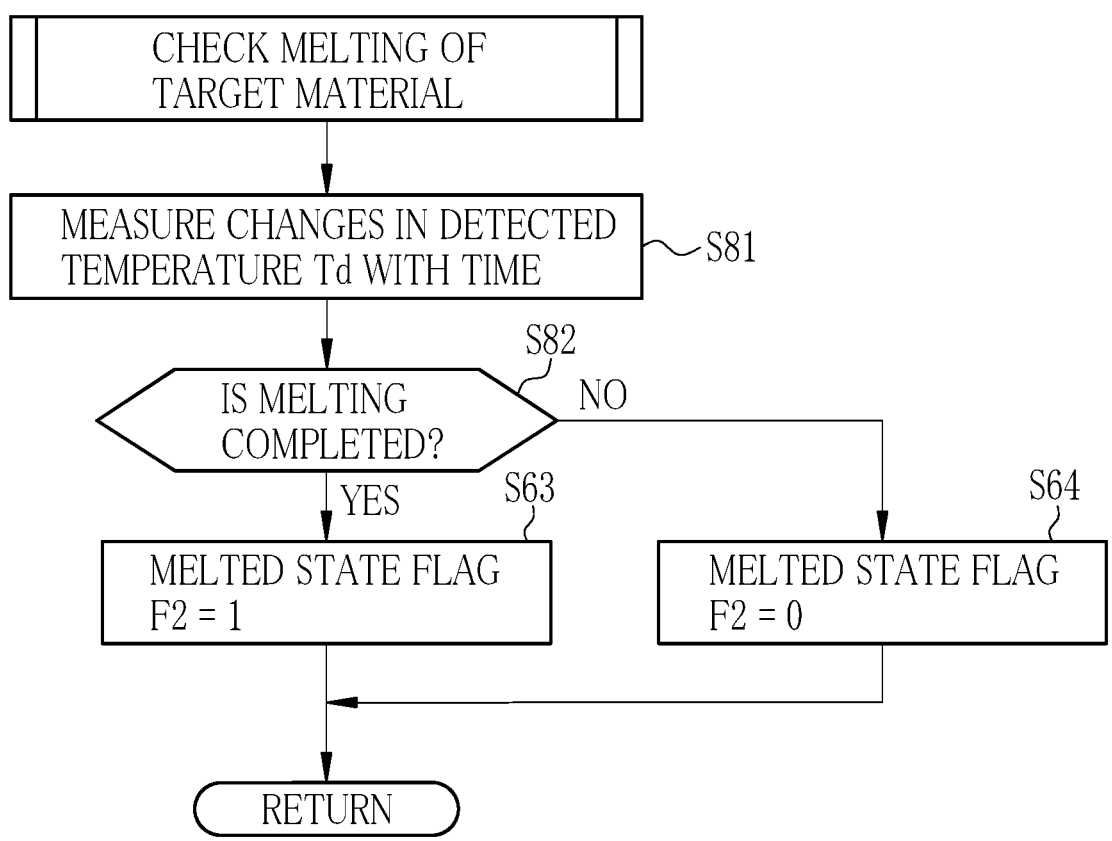
FIG. 22 is a flow chart illustrating a process for checking melting of the target material.
Figure 23:
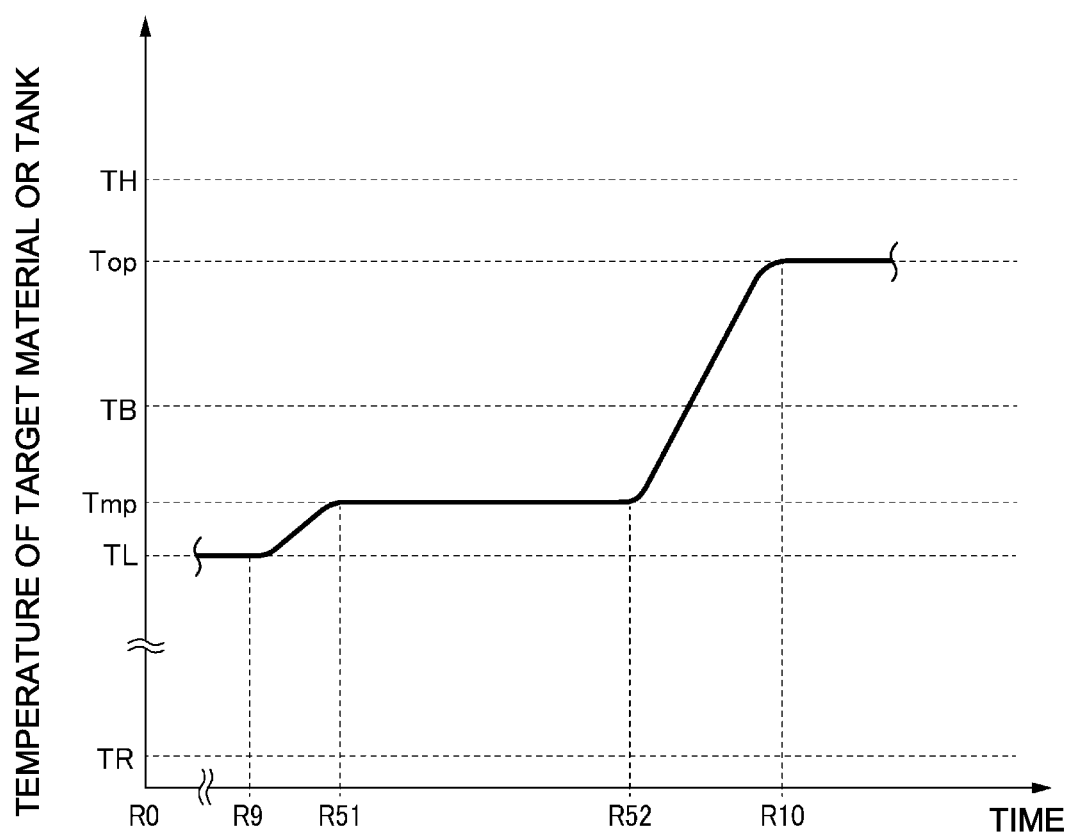
FIG. 23 is a timing chart illustrating the process for checking melting of the target material.

FIG. 20 is a flow chart illustrating a process for checking solidification of the target material in the variation of the second embodiment. FIG. 21 is an explanatory diagram illustrating a method for checking solidification of the target material. FIG. 22 is a flow chart illustrating a process for checking melting of the target material. FIG. 23 is an explanatory diagram illustrating a method for checking melting of the target material.

The target material refinement according to the variation of the second embodiment may include the same steps as the target material refinement of the second embodiment except but steps shown in FIG. 20 are carried out instead of the steps shown in FIG. 18, and steps shown in FIG. 22 instead of the steps shown in FIG. 19.

For checking solidification of the target material 270, the target controller 71B in FIG. 20 may measure the change in temperature Td with time detected by the temperature sensor 762B (step S71). According to the result of measurement in the step S71, the target controller 71B may determine whether the solidification of the target material 270 is completed (step S72).

For example, when the temperature adjuster 78A is controlled in the step S41 at the time point R3 so as to maintain the temperature T in the reservoir tank 84A at the temperature TL, the temperature of the target material 270 can start decreasing, as shown in FIG. 21. During a period between time points R41 and R43, the target material 270 can be cooled too much in the course of cooling. As a result, the temperature of the target material 270 can get lower than the melting point Tmp while the target material 270 stays in the liquid form. For example, the temperature of the target material 270 can decrease during a period H4 between time points R41 and R42 and, thereafter, increase during a period between the time points R42 and R43.

The temperature of the target material 270 may be kept stable at the melting point Tmp for a period between the time points R43 and R44 while the target material 270 is being solidified. When the solidification of the target material 270 is complete at the time point R44, the temperature of the target material 270 restarts decreasing and can reach the temperature TL at the time point R4.

If the detected temperature Td becomes lower than the melting point Tmp, the target controller 71B may measure the time duration until the detected temperature Td restarts increasing, and, if the measured time duration is equal to or shorter than the period H4, the target controller 71B may determine that solidification of the target material 270 has not completed. If the measured time duration exceeds the period H4, the target controller 71B may determine that solidification of the target material 270 is complete. The period H4 may preferably be obtained previously by experiments, and stored in the target controller 71B.

Also, the target controller 71B may perform the step S53 or S54 depending on the result in the step S72, as illustrated in FIG. 20.

As shown in FIG. 22, the target controller 71B may measure the change with time in the detected temperature Td by the temperature sensor 762B as a step for checking the melting state of the target material 270 (step S81). On the basis of the result of measurement in the step S81, the target controller 71B may determine whether the target material 270 has completely melted (step S82).

For example, when the temperature adjuster 78A is controlled so as to maintain the temperature T in the reservoir tank 84A at the output temperature Top in the step S4 at the time point R9, as shown in FIG. 23, the temperature of the target material 270 starts increasing. For a period between time points R51 and R52 during the temperature increase, the temperature of the target material 270 may be temporarily kept stable at the melting point Tmp. The target material 270 can continue melting while the temperature of the target material 270 is kept stable at the melting point Tmp. When the melting of the target material 270 is complete at the time point R52, the temperature of the target material 270 begins to increase again and can reach the output temperature Top at the time point R10.

Furthermore, if the target controller 71B determines that the detected temperature Td detected by the temperature sensor 762B continues to increase from the melting point Tmp in the period from the time point R52 to the time point R10, the target controller 71B can determine that the melting of the target material 270 is complete.

Referring to FIG. 22, the target controller 71B may perform the step S63 or S64 depending on the result of determination in the step S82.

In the above embodiment, the solidification and melting of the target material 270 are checked on the basis of the temperature of the target material 270 detected by the temperature sensor 762B. However, the solidification and melting of the target material 270 may be checked on the basis of the temperature of the reservoir tank 84A detected by the temperature sensor 783A without the temperature sensor 762B being provided.

It may be possible to check one of the solidification and melting processes of the target material 270 on the basis of the temperature of the target material 270 detected by the temperature sensor 762B, and to check the other of the solidification and melting processes of the target material 270 one the basis of the temperature of the reservoir tank 84A detected by the temperature sensor 783A.

3.4 Third Embodiment 3.4.1 Configuration

Figure 24:
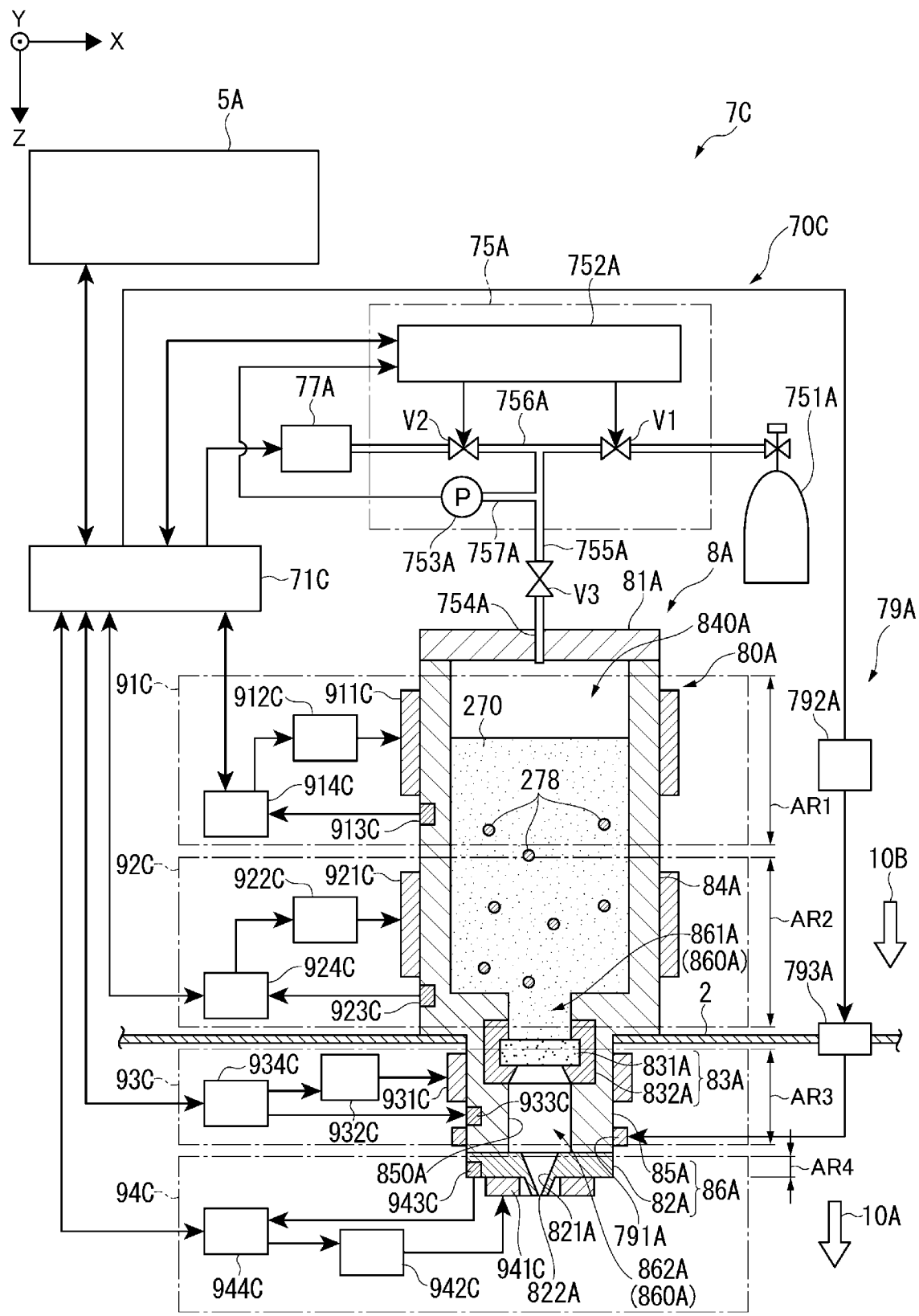
FIG. 24 schematically illustrates a target supply device of a third preferred embodiment.

In FIG. 24, a target supply device 7C of a third embodiment may include a target generating section 70C, and a target controller 71C as a controlling section.

To the target generating section 70C, it is possible to apply the same configuration as the target generating section 70A of the first embodiment except but the target generating section 70C includes a first temperature adjuster 91C, a second temperature adjuster 92C, a third temperature adjuster 93C and a fourth temperature adjuster 94C in place of the temperature adjuster 78A.

The first temperature adjuster 91C may change the temperature of a first area AR1 located on the −Z direction side in the reservoir tank 84A of the target generator 8A. The second temperature adjuster 92C may change the temperature of a second area AR2 located on the +Z direction side in the reservoir tank 84A. The third temperature adjuster 93C may change the temperature of a third area AR3 located on the −Z direction side in the nozzle 86A in the target generator 8A. The fourth temperature adjuster 94C may change the temperature of a fourth area AR4 located on the +Z direction side in the nozzle 86A.

The first temperature adjuster 91C may include a first heater 911C, a first heater power supply 912C, a first temperature sensor 913C and a first temperature controller 914C. The second temperature adjuster 92C may include a second heater 921C, a second heater power supply 922C, a second temperature sensor 923C and a second temperature controller 924C. The third temperature adjuster 93C may include a third heater 931C, a third heater power supply 932C, a third temperature sensor 933C and a third temperature controller 934C. The fourth temperature adjuster 94C may include a fourth heater 941C, a fourth heater power supply 942C, a fourth temperature sensor 943C and a fourth temperature controller 944C.

The first to fourth heaters 911C, 921C, 931C and 941C may be disposed on the outer circumferential surface of the target generator 8A in the first, second, third and fourth areas AR1, AR2, AR3 and AR4, respectively.

The first to fourth heater power supplies 912C, 922C, 932C and 942C may receive signals from the first to fourth temperature controllers 914C, 924C, 934C and 944C, and supply power to the first to fourth heaters 911C, 921C, 931C and 941C, to cause the first to fourth heaters 911C, 921C, 931C and 941C to generate heat, respectively. Thus, the target material 270 in the first to fourth areas AR1 to AR4 can be heated under the control of the target generator 8A.

The first to fourth temperature sensors 913C, 923C, 933C and 943C may be disposed on the outer circumferential surface of the target generator 8A or inside the target generator 8A in the first to fourth areas AR1 to AR4, respectively. The temperatures detected respectively by the first to fourth temperature sensors 913C, 923C, 933C and 943C can be substantially equal to the temperatures of the target material 270 in the first to fourth areas AR1 to AR4 within the target generator 8A, respectively.

The first to fourth temperature controllers 914C, 924C, 934C and 944C may be electrically connected to the target controller 71C. The first to fourth temperature controllers 914C, 924C, 934C and 944C may be so configured as to control the first to fourth heaters 911C, 921C, 931C and 941C by controlling the first to fourth heater power supplies 912C, 922C, 932C and 942C according to signals from the first to fourth temperature sensors 913C, 923C, 933C and 943C.

The target controller 71C may control the first and second temperature adjusters 91C and 92C to melt the ingot 275 in the reservoir tank 84A in such a manner that the part of the ingot 275 within the first area AR1 distant from the filter 831A can melt faster than the part of the ingot 275 within the second area AR2 nearer to the filter 831A.

3.4.2 Operation

Figure 25:
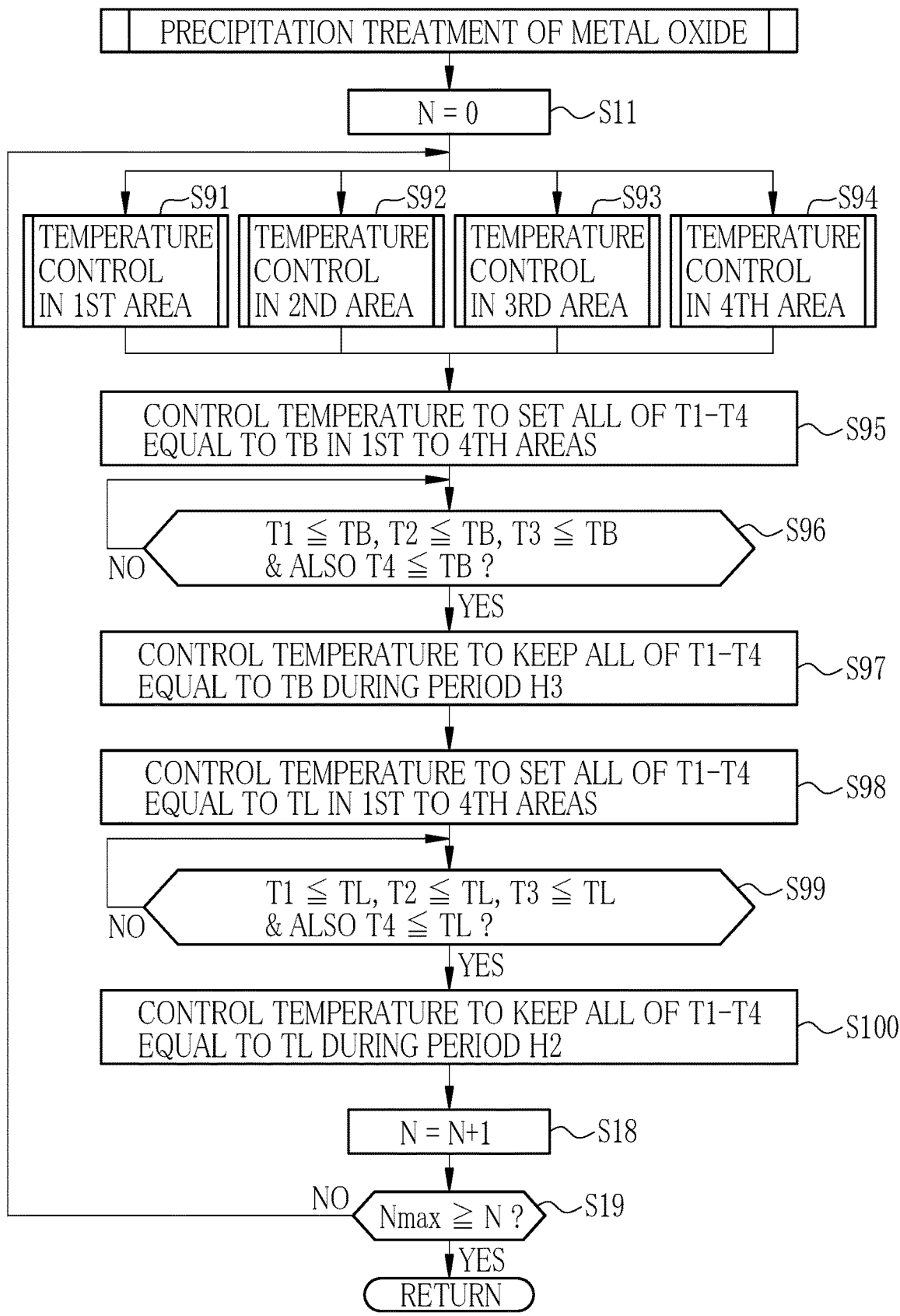
FIG. 25 is a flow chart illustrating a metal oxide precipitation treatment in the third embodiment.
Figure 26:
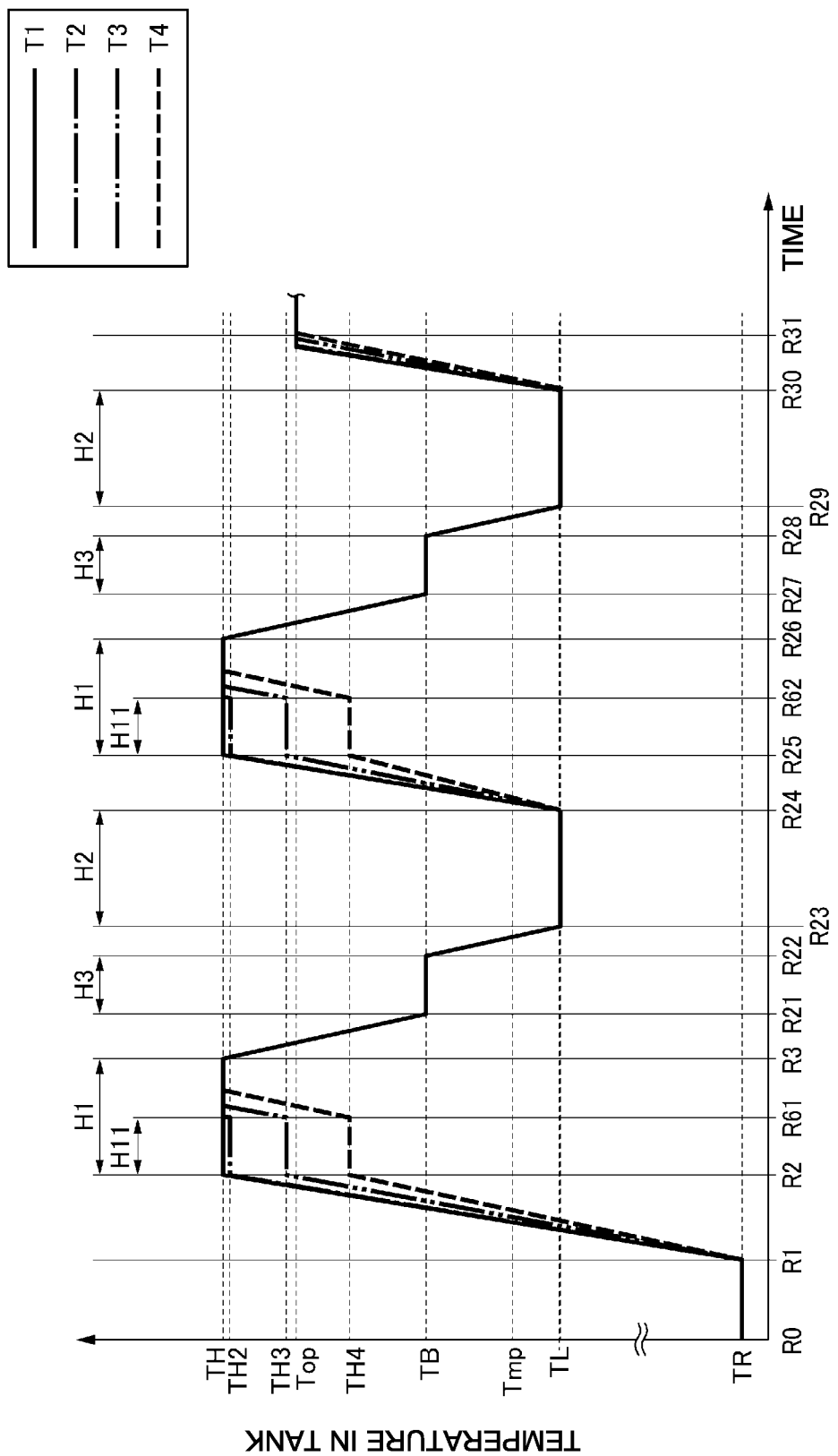
FIG. 26 is a timing chart illustrating a method for refinement of the target material.
Figure 27:
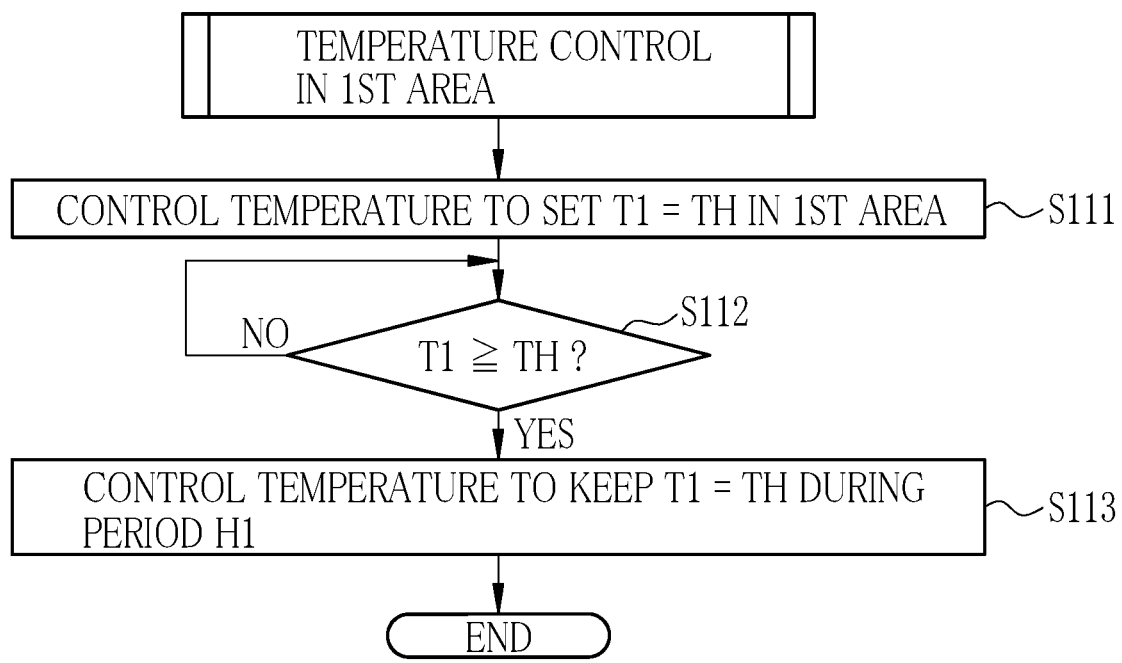
FIG. 27 is a flow chart illustrating temperature control for a first area.
Figure 28:
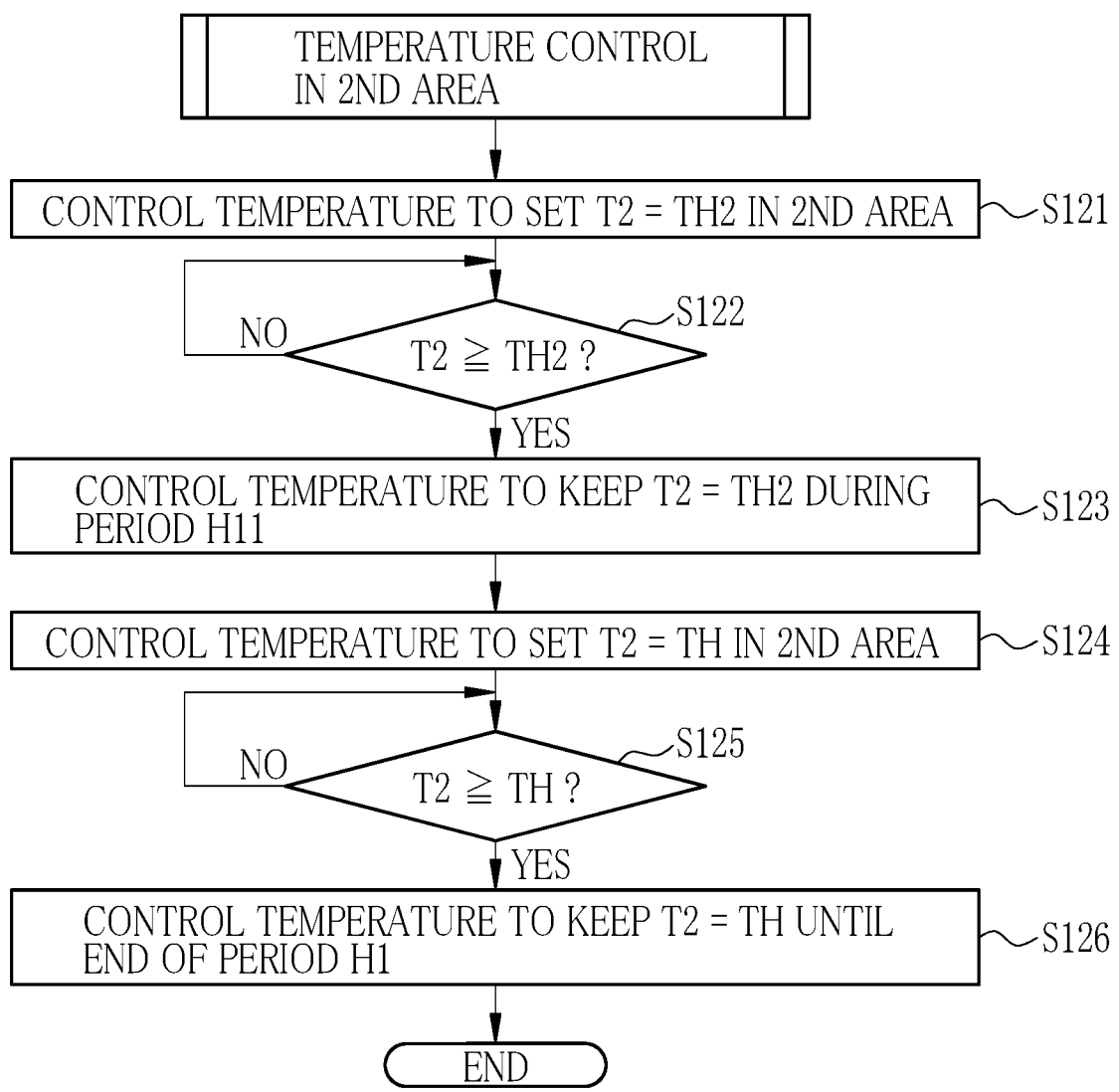
FIG. 28 is a flow chart illustrating temperature control for a second area.
Figure 29:
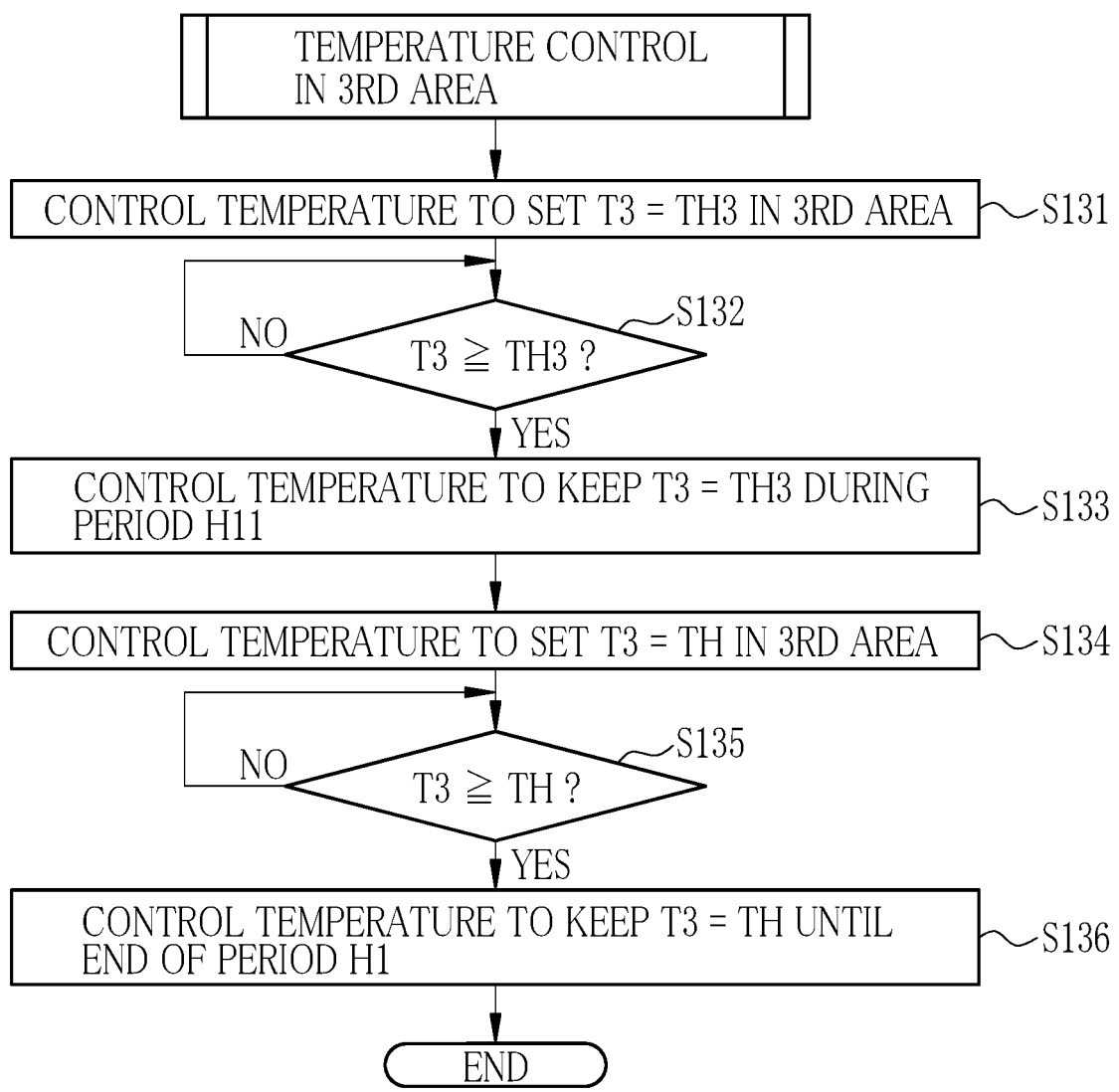
FIG. 29 is a flow chart illustrating temperature control for a third area.
Figure 30:
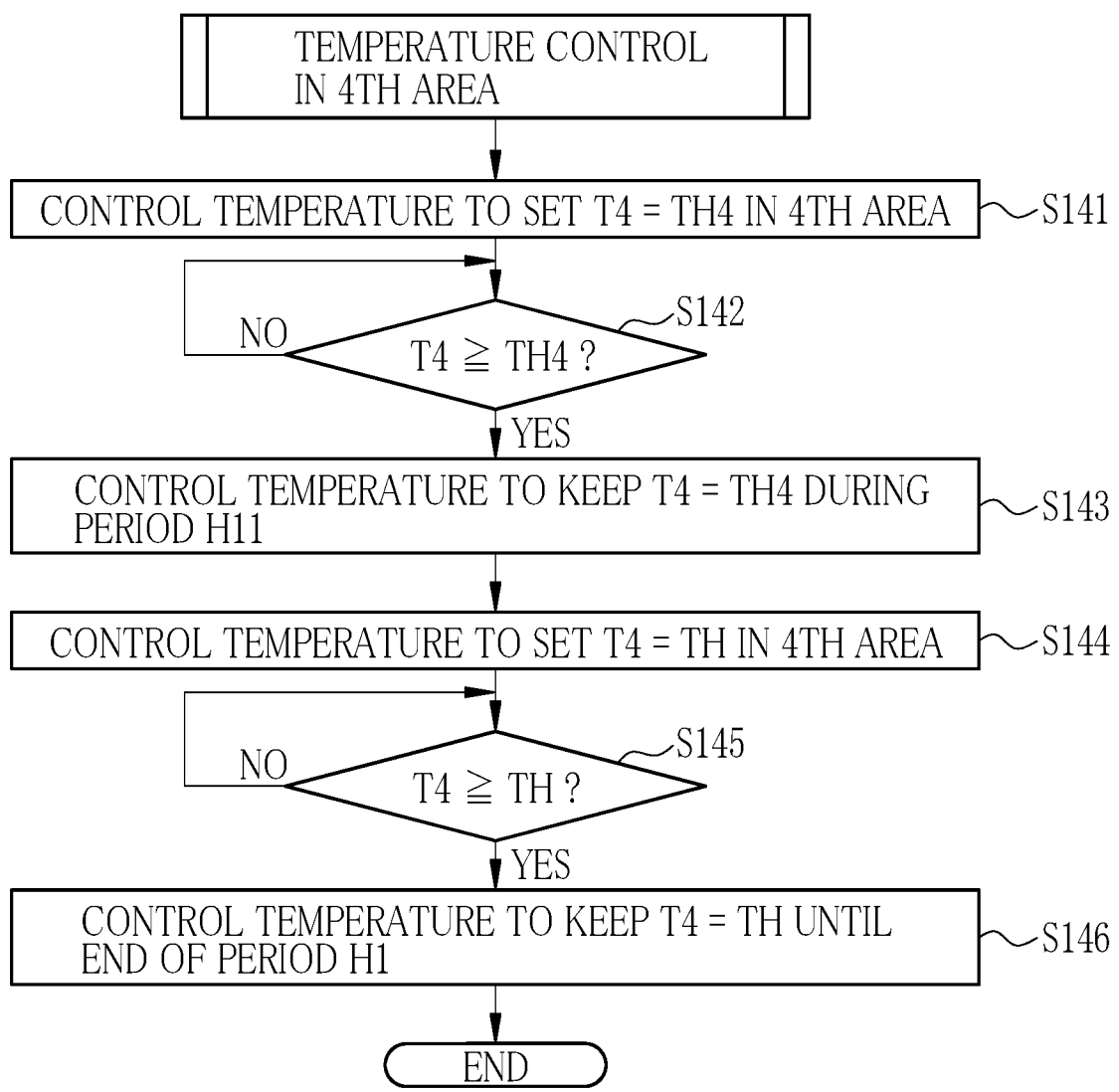
FIG. 30 is a flow chart illustrating temperature control for a fourth area.

In FIG. 25, a metal oxide precipitation treatment according to the third embodiment is illustrated. FIG. 26 is a timing chart illustrating a method of refinement of the target material. FIG. 27 is a flow chart illustrating temperature control for the first area AR1. In FIGS. 28 to 30, flow charts of temperature control for the second, third and fourth areas AR2, AR3 and AR4 are illustrated, respectively.

The operation of the target supply device 7C is hereinafter described with an example wherein tin is the target material 270.

The refinement of the target material in the third embodiment may include the same steps as the refinement of the target material in the first embodiment except that the metal oxide precipitation treatment is different from that illustrated in FIG. 10.

If the target controller 71C controls such that a first portion of the ingot 275 in the reservoir tank 84A, the first portion being disposed in the second area AR2 nearer to the filter 831A, melt faster than a second portion of the ingot 275, the second portion being disposed in the first area AR1 distant from the filter 831A, the following problem can occur. When the first portion of the ingot 275 in the second area AR2 melts to be the target material 270 of the liquid phase, the liquefied target material 270 can expand from the volume in the solid state. As the second portion of the ingot 275 in the first area AR1 stays solid, the target material 270 in the second area AR2 may expand toward the filter 831A, not toward the first area AR1. Even while the reservoir tank 84A is kept substantially in a vacuum state, the target material 270 of the supersaturated state in the second area AR2 can then pass through the filter 831A and enter the second communication passage 862A. When the target material 270 in the target generator 8A is solidified and then melted again, metal oxide 278 can be precipitated in the reservoir tank 84A and the first and second communication passages 861A and 862A as well. The metal oxide 278 precipitated in the second communication passage 862A can clog or narrow the nozzle hole 822A.

In order to inhibit these phenomena, the target controller 71C may perform the control as described below.

The target controller 71C may perform the steps S1 to S3 shown in FIG. 8 while the ingot 275 is contained in the reservoir tank 84A of the target generator 8A. Also, the target controller 71C may perform steps shown in FIG. 25 for metal oxide precipitation treatment in the step S3.

In FIG. 25, the target controller 71C after the step S11 may perform a step S91 of controlling the temperature in the first area AR1, a step S92 of controlling the temperature in the second area AR2, a step S93 of controlling the temperature in the third area AR3, and a step S94 of controlling the temperature in the fourth area AR4. The target controller 71C may start the steps S91 to S94 at a time point R1 in FIG. 26.

In the step S91, as shown in FIG. 27, the target controller 71C may control the first temperature adjuster 91C to set the temperature T1 in the area AR1 equal to the temperature TH, (step S111). The target controller 71C may determine whether the temperature T1 is equal to or higher than the temperature TH on the basis of a signal from the first temperature adjuster 91C (step S112). If it is determined in the step S112 that the temperature T1 has not become equal to or higher than the temperature TH, then the target controller 71C may perform the step S112 after a lapse of predetermined time. If it is determined in the step S112 that the temperature T1 has become equal to or higher than the temperature TH, then the target controller 71C may control the first temperature adjuster 91C to maintain the temperature T1 at the temperature TH for a period H1 (step S113). The step S113 may be performed from a time point R2 to a time point R3 in FIG. 26. Under this condition, as described above with FIG. 6, such an amount of oxygen that cannot otherwise dissolve in the target material 270 at the temperature TH can dissolve in the target material 270, making the target material 270 a supersaturated state. Thus, precipitation of metal oxide 278 can be inhibited.

In FIG. 28, the target controller 71C in the step S92 may control the second temperature adjuster 92C to set the temperature T2 in the area AR2 equal to the temperature TH2, (step S121). The target controller 71C may determine whether the temperature T2 is equal to or higher than the temperature TH2 on the basis of a signal from the second temperature adjuster 92C (step S122). Note that the temperature TH2 may be lower than the temperature TH and higher than the output temperature Top. If it is determined in the step S122 that the temperature T2 has not become equal to or higher than the temperature TH2, then the target controller 71C may repeat the step S122 after a lapse of predetermined time. If it is determined that the temperature T2 has become equal to or higher than the temperature TH2, then the target controller 71C may control the second temperature adjuster 92C to maintain the temperature T2 at the temperature TH2 for a period H11 (step S123). Note that the period H11 may be shorter than the period H1. The step S123 may be performed from the time point R2 to a time point R61 in FIG. 26.

The target controller 71C may control the second temperature adjuster 92C to set the temperature T2 equal to the temperature TH (step S124). The target controller 71C may determine whether the temperature T2 is equal to or higher than the temperature TH on the basis of the signal from the second temperature adjuster 92C (step S125). If it is determined in the step S125 that the temperature T2 has not become equal to or higher than the temperature TH, then the target controller 71C may repeat the step S125 after a lapse of predetermined time. If it is determined in the step S125 that the temperature T2 has become equal to or higher than the temperature TH, then the target controller 71C may control the second temperature adjuster 92C to maintain the temperature T2 at the temperature TH until the end of the period H1 from the time point R2 (step S126).

In FIG. 29, the target controller 71C in the step S93 may control the third temperature adjuster 93C to set the temperature T3 in the area AR3 equal to the temperature TH3, (step S131). The target controller 71C may determine whether the temperature T3 is equal to or higher than the temperature TH3 on the basis of a signal from the third temperature adjuster 93C (step S132). Note that the temperature TH3 may be lower than the temperature TH2 and higher than the output temperature Top. If it is determined in the step S132 that the temperature T3 has not become equal to or higher than the temperature TH3, then the target controller 71C may repeat the step S132 after a lapse of predetermined time. If it is determined in the step S132 that the temperature T3 has become equal to or higher than the temperature TH3, then the target controller 71C may control the third temperature adjuster 93C to maintain the temperature T3 at the temperature TH3 during the period H11 (step S133). The step S133 may be performed from the time point R2 to the time point R61 in FIG. 26.

The target controller 71C may control the third temperature adjuster 93C to set the temperature T3 equal to the temperature TH (step S134). The target controller 71C may determine whether the temperature T3 is equal to or higher than the temperature TH on the basis of the signal from the third temperature adjuster 93C (step S135). If it is determined in the step S135 that the temperature T3 has not become equal to or higher than the temperature TH, then the target controller 71C may repeat the step S135 after a lapse of predetermined time. If it is determined in the step S135 that the temperature T3 has become equal to or higher than the temperature TH, then the target controller 71C may control the third temperature adjuster 93C to maintain the temperature T3 at the temperature TH until the end of the period H1 from the time point R2 (step S136).

In FIG. 30, the target controller 71C in the step S94 may control the fourth temperature adjuster 94C to set the temperature T4 in the area AR4 equal to the temperature TH4, (step S141). The target controller 71C may determine whether the temperature T4 is equal to or higher than the temperature TH4 on the basis of a signal from the fourth temperature adjuster 94C (step S142). Note that the temperature TH4 may be lower than the output temperature Top and higher than the temperature TB. If it is determined in the step S142 that the temperature T4 has not become equal to or higher than the temperature TH4, then the target controller 71C may repeat the step S142 after a lapse of predetermined time. If it is determined in the step S142 that the temperature T4 has become equal to or higher than the temperature TH4, then the target controller 71C may control the fourth temperature adjuster 94C to maintain the temperature T4 at the temperature TH4 during the period H11 (step S143). The step S143 may be performed from the time point R2 to the time point R61 in FIG. 26.

The target controller 71C may control the fourth temperature adjuster 94C to set the temperature T4 equal to the temperature TH (step S144). The fourth temperature controller 944C (in the fourth temperature adjuster 94C) may determine whether the temperature T4 is equal to or higher than the temperature TH (step S145). If it is determined on the basis of the signal from the fourth temperature adjuster 94C in the step S145 that the temperature T4 has not become equal to or higher than the temperature TH, then the target controller 71C may repeat the step S145 after a lapse of predetermined time. If it is determined in the step S145 that the temperature T4 has become equal to or higher than the temperature TH, then the target controller 71C may control the fourth temperature adjuster 94C to maintain the temperature T4 at the temperature TH until the end of the period H1 from the time point R2 (step S146).

Provided that SP1, SP2, SP3 and SP4 represent temperature increase rates in the first to fourth areas AR1 to AR4 in FIG. 26, respectively, the relationship between the temperature increase rates according to the steps S91 to S94 may satisfy a condition represented by expression (1):

$$SP1 > SP2 > SP3 > SP4 \tag{1}$$

Therefore, the temperatures can come up to the melting point Tmp in a sequence from the first area AR1, the second area AR2, the third area AR3 to the fourth area AR4. The target controller 71C can control the first and second temperature adjusters 91C and 92C to melt the ingot 275 in the reservoir tank 84A so that the part of the ingot 275 in the first area AR1 that is distant from the filter 831A may melt faster than the part of the ingot 275 in the second area AR2 nearer to the filter 831A. Also, the inner space of the reservoir tank 84A can become a substantially vacuum state by performing the step S2. Finally, the part of the ingot 275 of the target material 270 in the first area AR1 can liquefy faster than the part of the ingot 275 in the second area AR2. The liquefied part of the target material 270 in the second area AR2 can expand toward the first area AR1 because the target material 270 is being liquefied in the first area AR1. Thus, while the first to fourth areas AR1 to AR4 are being heated, the target material 270 in the supersaturated state in the second area AR2 can be inhibited from passing through the filter 831A and entering the second communication passage 862A.

After performing the steps S91 to S94, the target controller 71C in FIG. 25 may control the first to fourth temperature adjusters 91C to 94C to make the temperatures T1 to T4 equal to the temperature TB in the first to fourth areas AR1 to AR4 (step S95). The step S95 may be executed at the time point R3 in FIG. 26.

The first to fourth temperature controllers 914C to 944C of the first to fourth temperature adjusters 91C to 94C may transmit the signals from the first to fourth temperature sensors 913C to 943C to the target controller 71C. The target controller 71C may determine whether all conditions of the following expressions (2) to (5) are satisfied, on the basis of the signals from the first to fourth temperature adjusters 91C to 94C (step S96).

$$T1 \leq TB \tag{2}$$

$$T2 \leq TB \tag{3}$$

$$T3 \leq TB \tag{4}$$

$$T4 \leq TB \tag{5}$$

If the target controller 71C determines that at least one of the conditions of expressions (2) to (5) is not satisfied in the step S96, then the step S96 can be performed after a lapse predetermined time. If the target controller 71C determines that all the conditions of expressions (2) to (5) are satisfied in the step S96, then the first to fourth temperature adjusters 91C to 94C are controlled to keep the temperatures T1 to T4 in the first to fourth areas AR1 to AR4 equal to the temperature TB during the period H3 (step S97). The step S97 may be performed from a time point R21 to a time point R22 in FIG. 26. By keeping the temperatures T1 to T4 in the first to fourth areas AR1 to AR4 at the temperature TB, such part of oxygen that has been dissolved in the target material 270 in the supersaturated state but cannot remain dissolved therein at the temperature TB can precipitate as metal oxide 278 and the precipitated metal oxide 278 can grow larger.

In step S98, the target controller 71C may control the first to fourth temperature adjusters 91C to 94C so as to make the temperatures T1 to T4 in the first to fourth areas AR1 to AR4 equal to the temperature TL. The step S98 may be executed at the time point R22 in FIG. 26.

In step S99, the target controller 71C may determine whether all conditions of the following expressions (6) to (9) are satisfied, on the basis of signals from the first to fourth temperature adjusters 91C to 94C.

$$T1 \leq TL \quad (6)$$

$$T2 \leq TL \quad (7)$$

$$T3 \leq TL \quad (8)$$

$$T4 \leq TL \quad (9)$$

If it is determined in the step S99 that at least one of the conditions of expressions (6) to (9) is not satisfied, then the target controller 71C may perform the step S99 after a lapse of predetermined time. If it is determined that all the conditions of expressions (6) to (9) are satisfied, then the target controller 71C may control the first to fourth temperature adjusters 91C to 94C to keep the temperatures T1 to T4 in the first to fourth areas AR1 to AR4 at the temperature TL during the period H2 (step S100).

The target controller 71C may perform the steps S18 and S19 of the first embodiment after performing the step S100.

When the upper limit number Nmax of times of the thermal cycles is 2, the steps S91 to S94 may be performed from the time point R1 and from a time point R24 in FIG. 26. The steps S123, S133 and S143 may be performed between the time points R2 and R61 and between time points R25 and R62. The step S113 may be performed between the time points R2 and R3 and between time points R25 and R26. The step S95 may be performed from the time points R3 and R26. The step S97 may be performed between the time points R21 and R22 and between time points R27 and R28. The step S98 may be performed from the time points R22 and R28. The step S100 may be performed between the time points R23 and R24 and between time points R29 and R30. The precipitation treatment of the metal oxide 278 may be completed at the time point R30. The step S5 may be performed from a time point R31.

3.4.3 Variation of the Third Embodiment
3.4.3.1 Operation

Figure 31:
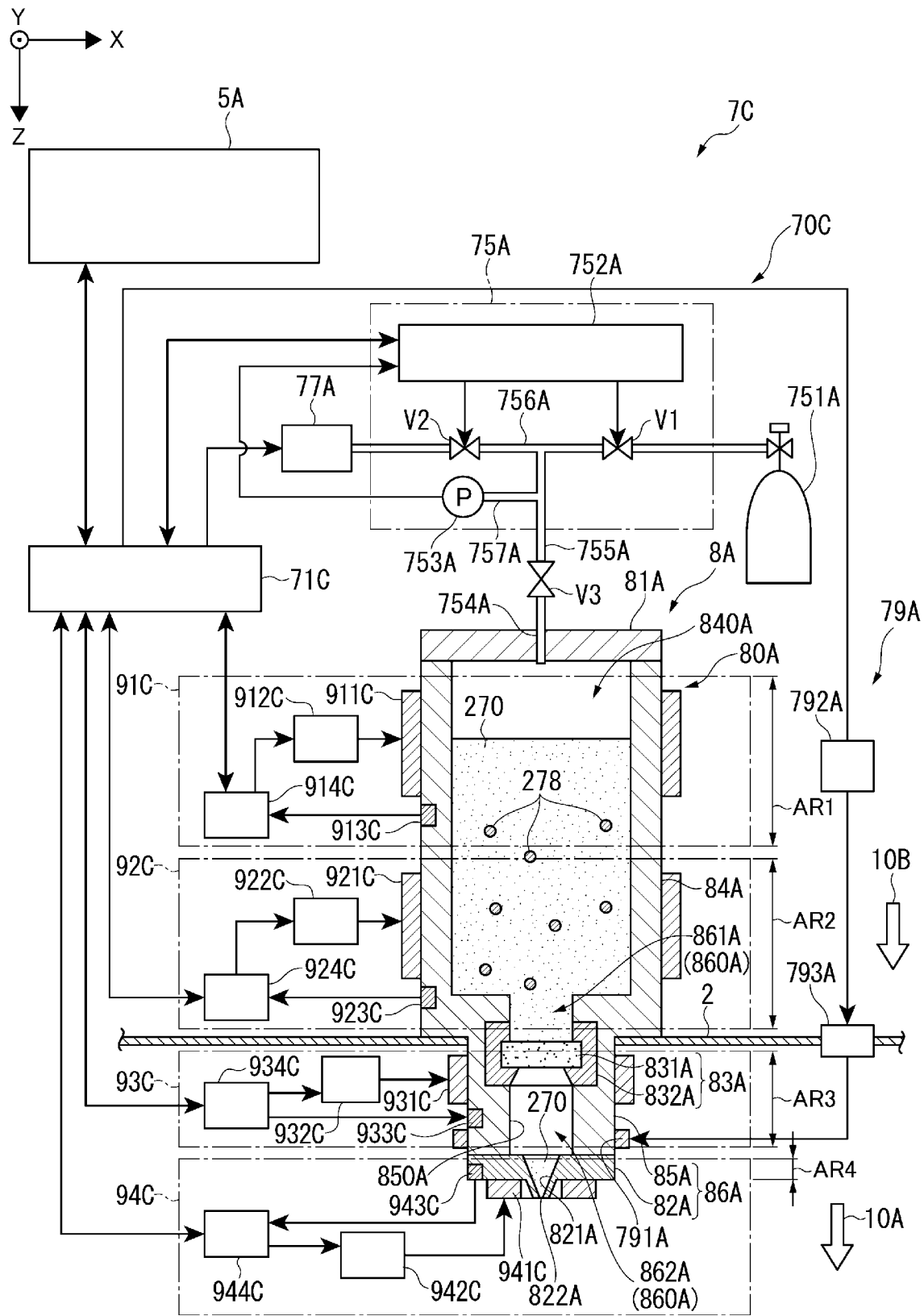
FIG. 31 schematically illustrates a phenomenon that can occur when the ingot is melted in the order from the first to fourth areas.
Figure 32:
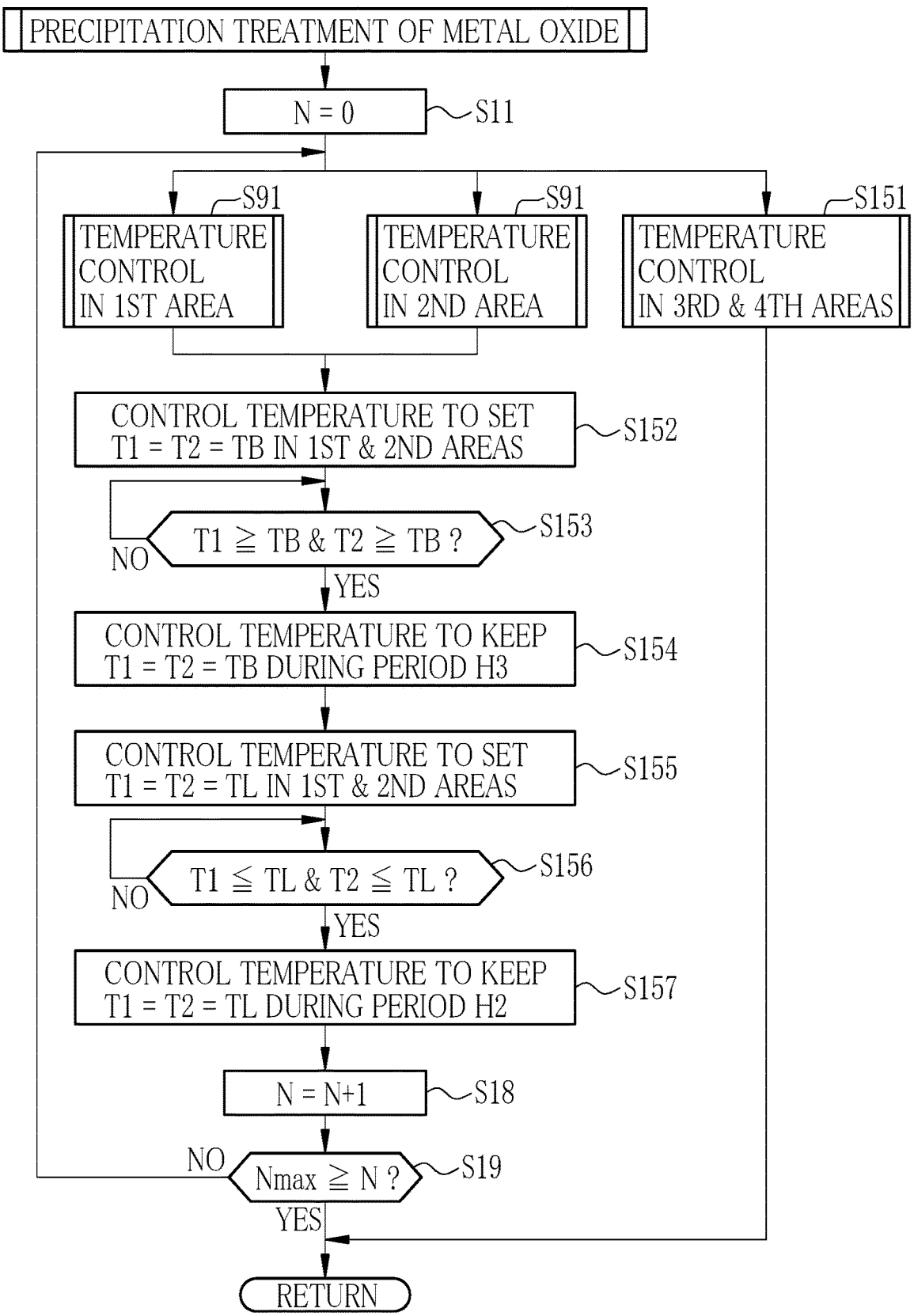
FIG. 32 is a flow chart illustrating a metal oxide precipitation treatment in a variation of the third embodiment.
Figure 33:
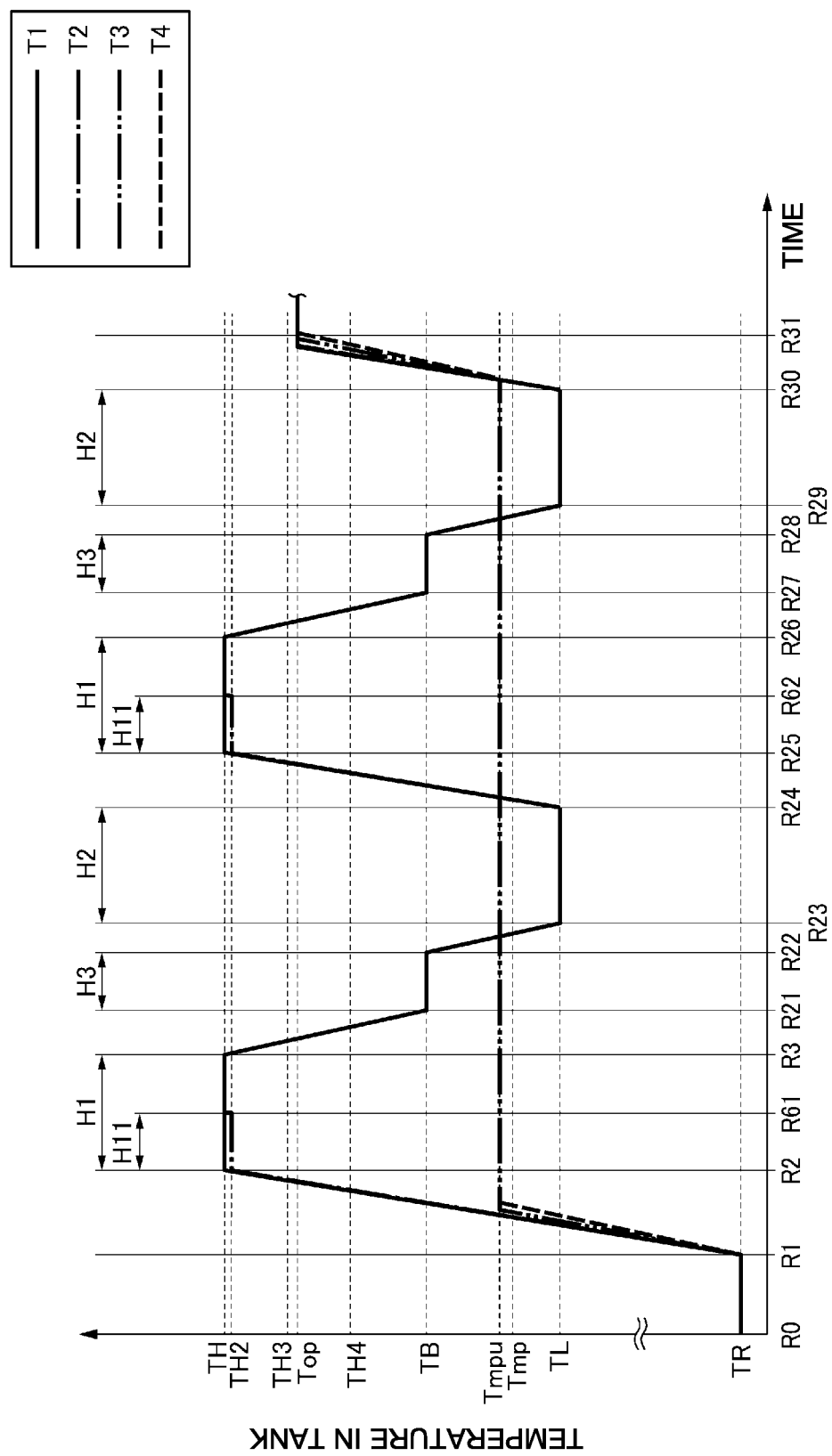
FIG. 33 is a timing chart illustrating a method for refinement of the target material.
Figure 34:
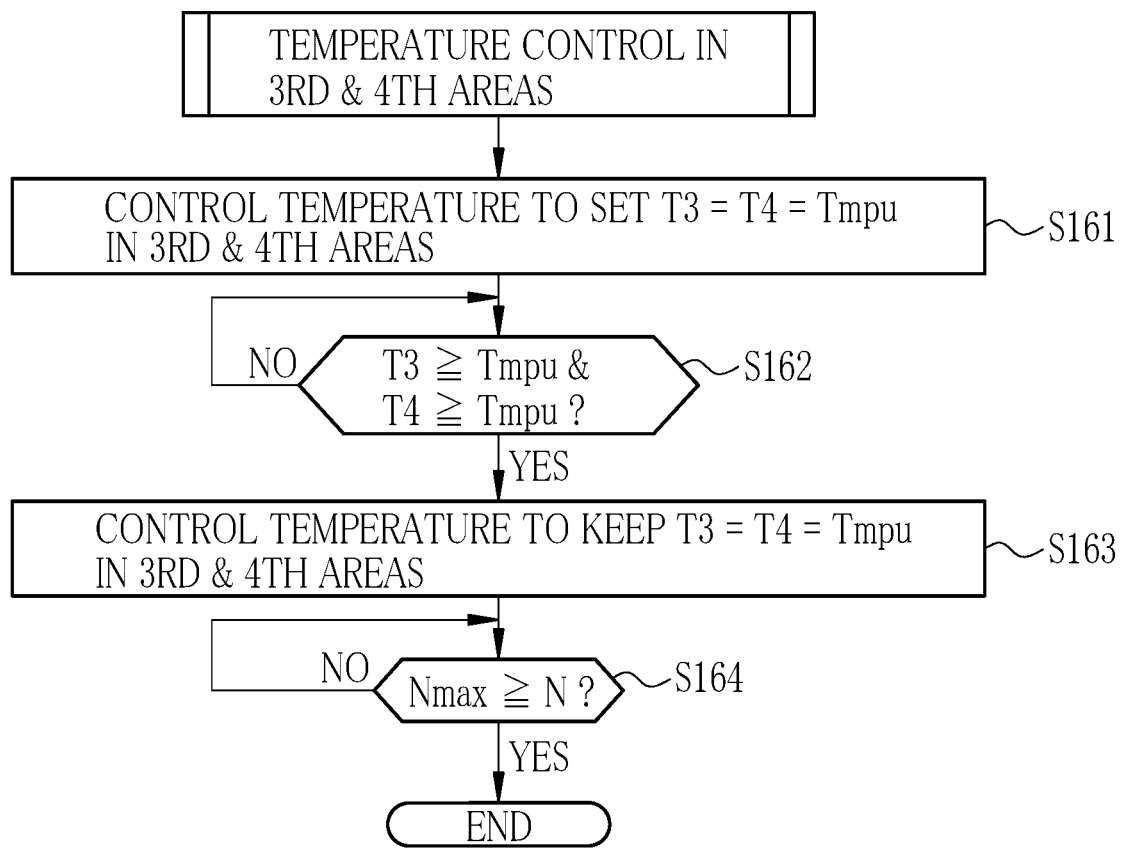
FIG. 34 is a flow chart illustrating temperature control for the third and fourth areas.

In FIG. 31, a phenomenon that can occur when the ingot melts sequentially from the first to fourth areas is illustrated. In FIG. 32, a flow chart of metal oxide precipitation treatment according to a variation of the third embodiment is illustrated. In FIG. 33, a timing chart of a target refining method is illustrated. In FIG. 34, a flow chart of temperature control in the third and fourth areas is illustrated.

In the third embodiment, even when the temperatures reach the melting point Tmp in the order from the first to fourth areas AR1, AR2, AR3 and AR4 while the pressure P in the reservoir tank 84A is kept at the pressure P0, there is a possibility for the target material 270 in the supersaturated state to pass through the filter 831A and stand in the second communication passage 862A, as shown in FIG. 31. In that case, when the target material 270 in the target generator 8A is solidified and then melted again, metal oxide 278 can precipitate from the target material 270 in the second communication passage 862A, which can result in clogging or narrowing the nozzle hole 822A.

In order to inhibit the phenomenon above, the target controller 71C may perform the following control.

After performing the steps S1 to S3 shown in FIG. 8, the target controller 71C may perform a process as illustrated in FIG. 32 for the metal oxide precipitation treatment in the step S3.

In FIG. 32, the target controller 71C may perform, after the step S11, the step S91 of controlling the temperature in the first area AR1, the step S92 of controlling the temperature in the second area AR2, and a step S151 of controlling the temperatures in the third and fourth areas AR3 and AR4. The steps S91, S92 and S151 may be started at a time point R1 in FIG. 33 by the target controller 71C.

In FIG. 34, the target controller 71C in the step S151 may control the third and fourth temperature adjusters 93C and 94C to set the temperatures T3 and T4 equal to the temperature Tmpu in the third and fourth areas AR3 and AR4 (step S161). The temperature Tmpu may be a temperature at which neither precipitation of metal oxide 278 nor solidification of the target material 270 of the liquid phase can occur. The temperature Tmpu may be a temperature from the melting point Tmp to the temperature TB. The temperature Tmpu may be a predetermined temperature ranging from 232° to 240° C.

Also, the target controller 71C may determine whether both conditions of the following expressions (10) and (11) are satisfied, on the basis of the signals from the third and fourth temperature adjusters 93C and 94C (step S162).

$$T3 \geq Tmpu \quad (10)$$

$$T4 \geq Tmpu \quad (11)$$

If it is determined in the step S162 that at least one of the conditions of expressions (10) and (11) is not satisfied, then the target controller 71C may perform the step S162 after a lapse of predetermined time. If it is determined that both the conditions of expressions (10) and (11) are satisfied, then the target controller 71C may control the third and fourth temperature adjusters 93C and 94C to keep the temperatures T3 and T4 in the third and fourth areas AR3 and AR4 at the temperature Tmpu (step S163).

The target controller 71C may determine whether the number N of times of the thermal cycles of heating and cooling is equal to or more than an upper limit number Nmax (step S164). If it is determined in the step S164 that the number N of times of the thermal cycles is less than the upper limit number Nmax, the target controller 71C may perform the step S164 after a lapse of predetermined time. In contrast, if it is determined that the number N of the thermal cycles is equal to or more than the upper limit number Nmax, the target controller 71C may complete the step of temperature control of the third and fourth areas AR3 and AR4. Note that the number N of times of the thermal cycles, to be checked, may be the latest value updated suitably by the sequence from the steps S91 and S92 to the step S19, which are performed in parallel to the step S151.

The relationship between temperature increase rates SP1, SP2, SP3 and SP4 in the first to fourth areas AR1 to AR4 may satisfy the abovementioned condition of expression (1).

The temperatures reach the melting point Tmp in the order from the first to fourth areas AR1 to AR4. As a result, for the reasons described above, it is possible to inhibit the target material 270 of the supersaturated state from passing through the filter 831A and entering the second communication passage 862A in the course of heating the first to fourth areas AR1 to AR4.

In FIG. 32, the target controller 71C after the steps S91 and S92 may control the first and second temperature adjusters 91C and 92C to set the temperatures T1 and T2 in the first and second areas AR1 and AR2 down to the temperature TB (step S152).

Also, the target controller 71C may determine whether both the conditions of expressions (2) and (3) are satisfied (step S153), on the basis of signals from the first and second temperature adjusters 91C and 92C.

If it is determined in the step S153 that at least one of the conditions of expressions (2) and (3) is not satisfied, then the target controller 71C may perform the step S153 after a lapse of predetermined time. If it is determined that both of the conditions of expressions (2) and (3) are satisfied, then the target controller 71C may control the first and second temperature adjusters 91C and 92C to keep the temperatures T1 and T2 in the first and second areas AR1 and AR2 at the temperature TB during the period H3 (step S154).

The target controller 71C may control the first and second temperature adjusters 91C and 92C to set the temperatures T1 and T2 in the first and second areas AR1 and AR2 down to the temperature TL (step S155). The target controller 71C may determine whether both the conditions of expressions (6) and (7) are satisfied, on the basis of the signals from the first and second temperature adjusters 91C and 92C (step S156).

If the target controller 71C determines that at least one of the conditions of expressions (6) and (7) is not satisfied in the step S156, the step S156 may be performed after a lapse of predetermined time. The target controller 71C, if it is determined that both of the conditions of expressions (6) and (7) are satisfied, may control the first and second temperature adjusters 91C and 92C to keep the temperatures T1 and T2 in the first and second areas AR1 and AR2 at the temperature TL during the period H2 (step S157). The temperatures T3 and T4 in the third and fourth areas AR3 and AR4 may be kept at the temperature Tmpu during the period H2.

After completing the step S157, the target controller 71C may perform the steps S18 and S19 as in the first embodiment.

If the upper limit number Nmax of times of the thermal cycles is set at 2, the same process as in the third embodiment may be carried out except that the temperatures T3 and T4 in the third and fourth areas AR3 and AR4 are kept at the temperature Tmpu after reaching the temperature Tmpu through to the time point R30.

Consequently, it is possible in the precipitation treatment for the metal oxide 278 to inhibit solidification of the target material 270 in the second communication passage 862A even if the target material 270 of the supersaturated state stands in the second communication passage 862A, like as shown in FIG. 31. As a result, precipitation of metal oxide 278 from the target material 270 in the second communication passage 862A can be inhibited. Accordingly, when the EUV light generation system 11 transits to the process for generating the EUV light 252 without solidifying the target material 270 after the precipitation of metal oxide 278, the target material 270 of the supersaturated state can be output as droplets 27. Thus, it is possible to inhibit the metal oxide 278 from clogging or narrowing the nozzle hole 822A.

4. Target supply device with tanks
4.1 Fourth embodiment
4.1.1 Configuration

Figure 35:
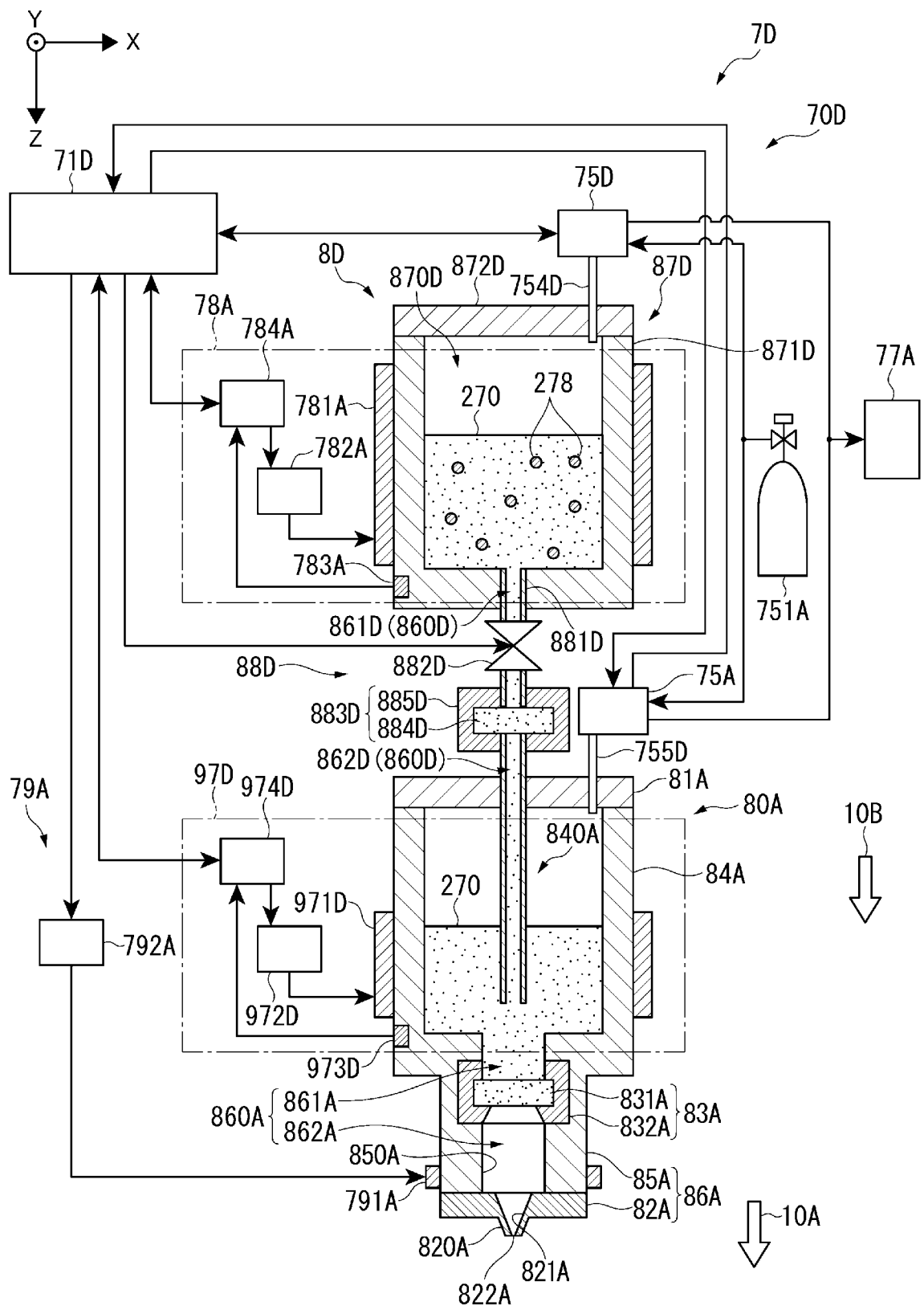
FIG. 35 schematically illustrates a target supply device of a fourth embodiment, which includes a feed tank and a reservoir thank.

In FIG. 35, a target supply device having a feed tank and a reservoir tank is illustrated.

A target supply device 7D in FIG. 35 may have a target generating section 70D, and a target controller 71D as a controlling section.

The target generating section 70D may include a target generator 8D, a pressure adjuster 75D, a pressure adjuster 75A, a gas exhauster 77A, a temperature adjuster 78A, a temperature controller 97D and a piezoelectric actuator 79A.

The target generator 8D may include a feed tank 87D, a transfer section 88D, a device main unit 80A, a lid 81A, a nozzle head 82A and a filter unit 83A. In the fourth embodiment, the tank of the present disclosure may be the feed tank 87D instead of the reservoir tank 84A of the device main unit 80A.

The feed tank 87D may have a tank body 871D and a lid 872D. The tank body 871D may be substantially cylindrical and have a first end wall on the +Z direction side. The lid 872D may be of a substantially disk shape to close a second end of the tank body 871D on the −Z direction side. The lid 872D may be positioned in tight contact with the second end of the tank body 871D. A room in the feed tank 87D may be a space for containment 870D for containing the target material 270.

A transfer line 881D may be provided in the transfer section 88D. The transfer line 881D may be formed into a pipe. The hollow in the transfer line 881D may constitute a communication portion 860D. The transfer line 881D may be disposed to penetrate through the first end wall of the tank body 871D and the lid 81A of the device main unit 80A. A downstream end of the transfer line 881D on the +Z direction side may be located in the vicinity of the first end wall of the reservoir tank 84A. Thus, the target material 270 in the feed tank 87D can be transferred to the reservoir tank 84A of the device main unit 80A through the communication portion 860D.

A valve 882D may be provided in the transfer line 881D. The target controller 71D may be connected electrically to the valve 882D. The valve 882D may be so configured as to change over between open and closed states under the control of the target controller 71D, the open state being for drawing the target material 270 from the feed tank 87D to the reservoir tank 84A, the closed state being for blocking the flow of the target material 270.

A filter unit 883D may be disposed in the transfer line 881D at a position between the valve 882D and the device main unit 80A. The filter unit 883D may include the filter 884D and a holder 885D. In the fourth embodiment, not a filter 831A of the filter unit 83A but the filter 884D may be the filter of the present disclosure.

The filter 884D may be configured in the same manner as the filter 831A. For example, the filter 884D may have at least one of first and second filters (filter elements).

The holder 885D may be configured in the same manner as a holder 832A of the filter unit 83A. The holder 885D may hold the filter 884D such that the filter 884D blocks the communication portion 860D. The communication portion 860D may be divided by the filter 884D into a first communication passage 861D and a second communication passage 862D, the first communication passage 861D being on one side close to the feed tank 87D, the second communication passage 862D being on the other side close to the nozzle hole 822A.

A flow line 754D may be provided through the lid 872D of the feed tank 87D. A flow line 755D may be provided through the lid 81A.

The flow line 754D may be provided with the pressure adjuster 75D. The pressure adjuster 75D may be configured in the same manner as the pressure adjuster 75A. A pressure controller (not shown) included in the pressure adjuster 75D may be electrically connected to the target controller 71D. The pressure adjuster 75D may be configured to supply inert gas from an inert gas cylinder 751A to the feed tank 87D in response to a control signal from the target controller 71D. Also, the pressure adjuster 75D may be configured to adjust the pressure in the feed tank 87D in response to a control signal from the target controller 71D.

The flow line 755D may be provided with the pressure adjuster 75A.

The gas exhauster 77A may be configured to exhaust gas from the device main unit 80A and the feed tank 87D in response to a signal from the target controller 71D.

A temperature sensor 783A of the temperature adjuster 78A may be disposed on the outer circumferential surface of the tank body 871D at a position close to the first end wall, or may be disposed inside the tank body 871D.

The temperature controller 97D may be configured in the same manner as the temperature adjuster 78A. The temperature controller 97D may include a heater 971D, a heater power supply 972D, a temperature sensor 973D and a temperature controller 974D.

The temperature sensor 973D may be disposed on the outer circumferential surface of the reservoir tank 84A at a position close to the nozzle body 85A, or may be disposed in the reservoir tank 84A. The temperature controller 974D may be configured to output a control signal to the heater power supply 972D, for controlling the target material 270 at a predetermined temperature on the basis of a signal from the temperature sensor 973D.

4.1.2 Operation

The target controller 71D may control the temperature adjuster 78A and the pressure adjuster 75D to refine the target material 270 while the ingot 275 is contained in the feed tank 87D and the valve 882D of the transfer section 88D is closed. The refinement of the target material 270 may be the same as that in the first embodiment in FIG. 8. In the step S2, however, gas may be exhausted from the reservoir tank 84A and the feed tank 87D as well.

Through the same process for precipitation of metal oxide 278 as in the step S3 shown in FIG. 8, metal oxide 278 can be precipitated from the target material 270 in the feed tank 87D, as illustrated in FIG. 35.

Then the target controller 71D may perform the step S4. In the step S4, the target controller 71D may control the temperature adjuster 78A and the temperature controller 97D. Performing the step S4 can keep the temperature in the feed tank 87D and the reservoir tank 84A at the output temperature Top. The target controller 71D may open the valve 882D after performing the step S4.

The target controller 71D may perform the step S5. In the step S5, the target controller 71D may control the pressure adjuster 75D. Thus, the metal oxide 278 can be trapped in the filter 884D, and the target material 270 getting out of the supersaturated state can pass through the filter 884D, to be supplied to the reservoir tank 84A through the second communication passage 862D.

Also, the target controller 71D may perform the step S6. The target controller 71D in the step S6 may control the pressure adjuster 75A. Thus, the target material 270 can be output as a jet 27A. Furthermore, the target controller 71D may perform the step S7.

The fourth embodiment makes it possible to inhibit the metal oxide 278 from clogging or narrowing the nozzle hole 822A, without the need for subjecting the target material 270 to the precipitation treatment for the metal oxide 278 in the reservoir tank 84A.

5. Controller 5.1 Configuration

FIG. 36 is a block diagram illustrating the overall configuration of a controller.

In each of the abovementioned embodiments, the controller may constitute the EUV light generation control system 5, the target controller 71A, the target controllers 71B to 71D, the pressure controller 752A, the temperature controllers 784A, 914C, 924C, 934C, 944C and 974D and the like. The controller may be constructed by a generic control device such as a computer, a programmable controller, or the like. The controller may, for example, be configured as follows:

The controller may be constituted of a processing unit 1000 and devices connected to the processing unit 1000, including a storage memory 1005, a user interface 1010, a parallel I/O (input/output) controller 1020, a serial I/O controller 1030, and an A-D/D-A(analog-to-digital/digital-to-analog) converter 1040. An example of the storage memory 1005 may be a recording medium for storing a refining program for refining the target material. The processing unit 1000 may be constituted of a CPU (Central Processing Unit) 1001, and a memory 1002, a timer 1003 and a GPU (Graphics Processing Unit) 1004, which are connected to the CPU 1001.

5.2 Operation

The processing unit 1000 may read the program stored in the storage memory 1005. In addition, the processing unit 1000 may execute the read program and, according to the executed program, read out data from the storage memory 1005, store data in the storage memory 1005, and so on.

The parallel I/O controller 1020 may be connected to communicable devices 1021 to 102X via parallel I/O ports. The parallel I/O controller 1020 may control digital signal communication via the parallel I/O ports, carried out during the execution of the program by the processing unit 1000.

The serial I/O controller 1030 may be connected to communicable devices 1031 to 103X via serial I/O ports. The serial I/O controller 1030 may control digital signal communication via the serial I/O ports, carried out during the execution of the program by the processing unit 1000.

The A-D/D-A converter 1040 may be connected to communicable devices 1041 to 104X via analog ports. The A-D/D-A converter 1040 may control analog signal communication, carried out during the execution of the program by the processing unit 1000, via the analog ports.

The user interface 1010 may be configured to display the progress of the execution of the program by the processing unit 1000 to an operator, and allow the operator to instruct the processing unit 1000 to stop the program execution or make an interruptive process or the like.

The CPU 1001 of the processing unit 1000 may carry out arithmetic processing for the program. The memory 1002 may temporarily store the program or temporarily store data during the computation while the CPU 1001 is executing the program. The timer 1003 may measure a current time and an amount of elapsed time, and output the current time or the amount of elapsed time to the CPU 1001 in accordance with the execution of the program. When image data is input into the processing unit 1000, the GPU 1004 may process the image data in accordance with the execution of the program, and may output a result thereof to the CPU 1001.

The communicable devices 1021 to 102X connected to the parallel I/O controller 1020 via the parallel I/O ports may be the EUV light generation control system 5, another controller, and the like.

The communicable devices 1031 to 103X connected to the serial I/O controller 1030 via the serial I/O ports may be the pressure controller 752A, the temperature controllers 784A, 914C, 924C, 934C, 944C and 974D, and the like.

The communicable devices 1041 to 104X connected to the A-D/D-A converter 1040 via the analog ports may be various types of sensors, including the temperature sensors

783A, 762B, 913C, 923C, 933C, 943C and 973D, the pressure sensor 753A, a vacuum gauge.

As being configured in the above-described manner, the controller can execute the operations indicated in the respective flow charts. For example, the target controllers 71A, 71B, 71C and 71D as the controller can perform the steps in the flow charts according to a program for the refinement of the target material, which is stored in the storage memory 1005.

6. Other Variations

It is possible in the second embodiment or in the variation thereof to maintain the temperature T at the temperature TB for a predetermined time in the course of lowering the temperature T from the temperature TH to the temperature TL. It is possible in the third embodiment not to define a period for maintaining the temperatures T1 to T4 at the temperature TB. It is possible in the variation of the third embodiment not to define a period for maintaining the temperatures T1 and T2 at the temperature TB. In the third embodiment, the third and fourth temperature adjusters 93C and 94C may not be disposed. In the third embodiment or in the variation thereof, at least one of the third and fourth temperature adjusters 93C and 94C may not be disposed. Three or more temperature adjusters may be disposed at least on one of the outer circumferential surfaces of the reservoir tank 84A and the nozzle 86A.

In the fourth embodiment, the treatment for precipitation of metal oxide 278 is performed on the target material 270 in the feed tank 87D. In addition, it is possible to process the target material 270 in the reservoir tank 84A for precipitation of metal oxide 278. This is more effective for inhibiting clogging or narrowing the nozzle hole 822A by the metal oxide 278.

Also, in the fourth embodiment, the precipitation treatment of metal oxide 278 may be performed on the target material 270 in the feed tank 87D when the target material 270 in the reservoir tank 84A is reduced by the step S7. Then, the target material 270 free from the supersaturated state may be fed to the reservoir tank 84A.

The refinement of the target material 270 in the fourth embodiment can be performed in the same manner as in any one of the variation of the first embodiment, the second embodiment, and the variation of the second embodiment.

Furthermore, two temperature adjusters can be disposed on an outer circumferential surface of the feed tank 87D in the fourth embodiment so that the target controller 71D may perform the precipitation treatment of metal oxide 278 in the way as follows: the target controller 71D may control the temperature adjusters to melt the ingot 275 in the feed tank 87D such that part of the ingot 275 located distant from the filter 884D will melt faster than part of the ingot 275 located closer to the filter 884D.

In the first to fourth embodiments and the respective variations described above, the temperature of the tank is changed by the heater(s) as the temperature adjuster of the present disclosure. As an alternative to the heater, a Peltier device with heating and cooling capabilities may be disposed on the tank. Thus, it is possible to change the temperature in the tank by adjusting the value or direction of a current applied to the Peltier device for heating and cooling. Furthermore, a water flow path for cooling may be provided as the temperature adjuster of the present disclosure on the tank in addition to the heater(s). Thus, it is possible to change the temperature in the tank by adjusting the value of the current applied to the heater or the amount of cooling water flowing in the water flow path.

Furthermore, the precipitation treatment of metal oxide 278 according to the first to fourth embodiments and their variations may be performed after the output of the target material 270 through the nozzle 86A or the creation of the EUV light 252 is stopped for a long period, or after making an operation that exposes the ingot 275 in the reservoir tank 84A or the feed tank 87D to air.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting". For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more".

What is claimed is:

1. A target supply device comprising:
   a tank configured to contain target material;
   a nozzle having a nozzle hole configured to output the target material from the tank;
   a filter disposed in a communication portion for conducting the target material from the tank to the nozzle hole;
   a heater configured to heat the tank, wherein the heater includes a first heater configured to heat a first area and a second heater configured to heat a second area; and
   a controller configured to control the heater such that a temperature in the first area of the tank reaches a melting point of the target material faster than a temperature in the second area of the tank, each of the first area and the second area being positioned upstream in an output direction into which the target material is output, the second area being positioned nearer to the filter than the first area.

2. The target supply device according to claim 1, wherein the first heater is positioned at an upper portion of the tank than the second heater.

3. The target supply device according to claim 1, wherein the heater is disposed on an outer surface of the tank.

4. The target supply device according to claim 1, wherein the heater sandwiches the tank.

5. The target supply device according to claim 1, wherein the controller controls the heater to make a first temperature increase rate in the first area be larger than a second temperature increase rate in the second area.

6. The target supply device according to claim 1, wherein the controller controls the heater such that the temperature in the second area reaches the melting point during a period when the temperature in the first area continues to rise.

7. The target supply device according to claim 6, further comprising a communication portion heater configured to heat the communication portion, wherein the controller controls the heater and the communication portion heater such that a temperature in the communication portion reaches the melting point during a period when the temperature in the second area continues to rise, and then temperature rise in the communication portion is suppressed during a period when the temperatures in the first and second areas continue to rise.

8. The target supply device according to claim 7, wherein the target material includes tin, and the controller suppresses the temperature rise in the communication portion such that the temperature in the communication portion is in a range of 232° C. to 242° C.

9. The target supply device according to claim 6, further comprising a nozzle heater configured to heat the nozzle, wherein the controller controls the heater and the nozzle heater such that a temperature in the nozzle reaches the melting point during a period when the temperature in the second area continues to rise, and then temperature rise in the nozzle is suppressed during a period when the temperatures in the first and second areas continue to rise.

10. The target supply device according to claim 9, wherein the target material includes tin, and the controller suppresses the temperature rise in the nozzle such that the temperature in the nozzle is in a range of 232° C. to 242° C.

11. The target supply device according to claim 6, further comprising
a communication portion heater configured to heat the communication portion, wherein
the controller controls the heater and the communication portion heater such that a temperature in the communication portion reaches the melting point during a period when the temperatures in the first and second areas continue to rise, and then the temperature in the communication portion is maintained at a temperature at which neither precipitation of metal oxide nor solidification of the target material of liquid phase cannot occur during a period when the temperatures in the first and second areas are higher than the temperature in the communication portion.

12. The target supply device according to claim 6, further comprising
a communication portion heater configured to heat the communication portion, wherein
the controller controls the heater and the communication portion heater such that a temperature in the communication portion reaches the melting point during a period when the temperatures in the first and second areas continue to rise, and then the temperature in the communication portion is maintained at a temperature that is equal to or higher than the melting point and is equal to or lower than a temperature at which metal oxide can grow larger after precipitation during a period when the temperatures in the first and second areas are higher than the temperature in the communication portion.

13. The target supply device according to claim 6, further comprising
a communication portion heater configured to heat the communication portion, wherein
the controller controls the heater and the communication portion heater such that a temperature in the communication portion reaches the melting point during a period when the temperatures in the first and second areas continue to rise, and then the temperature in the communication portion is maintained in a range of 232° C. to 240° C. during a period when the temperatures in the first and second areas are higher than the temperature in the communication portion.

14. The target supply device according to claim 6, further comprising
a nozzle heater configured to heat the nozzle, wherein
the controller controls the heater and the nozzle heater such that a temperature in the nozzle reaches the melting point during a period when the temperatures in the first and second areas continue to rise, and then the temperature in the communication portion is maintained at a temperature at which neither precipitation of metal oxide nor solidification of the target material of liquid phase cannot occur during a period when the temperatures in the first and second areas are higher than the temperature in the communication portion.

15. The target supply device according to claim 6, further comprising
a nozzle heater configured to heat the nozzle, wherein
the controller controls the heater and the nozzle heater such that a temperature in the nozzle reaches the melting point during a period when the temperatures in the first and second areas continue to rise, and then the temperature in the communication portion is maintained at a temperature that is equal to or higher than the melting point and is equal to or lower than a temperature at which metal oxide can grow larger after precipitation during a period when the temperatures in the first and second areas are higher than the temperature in the communication portion.

16. The target supply device according to claim 6, further comprising
a nozzle heater configured to heat the nozzle, wherein
the controller controls the heater and the nozzle heater such that a temperature in the nozzle reaches the melting point during a period when the temperatures in the first and second areas continue to rise, and then the temperature in the communication portion is maintained in a range of 232° C. to 240° C. during a period when the temperatures in the first and second areas are higher than the temperature in the communication portion.

17. The target supply device according to claim 1, wherein the controller controls the heater such that heating of the first area and the second area starts at almost the same time.

18. The target supply device according to claim 1, wherein the controller controls the heater such that the temperatures in the first and second areas reaches a temperature higher than the melting point.

19. An extreme ultraviolet light generation apparatus comprising:
a chamber in which a target material is irradiated with laser light and extreme ultraviolet light is generated; and
a target supply device configured to supply the target material into the chamber,
the target supply device comprising:
a tank configured to contain target material;
a nozzle having a nozzle hole configured to output the target material from the tank;
a filter disposed in a communication portion for conducting the target material from the tank to the nozzle hole;
a heater configured to heat the tank, wherein the heater includes a first heater configured to heat a first area and a second heater configured to heat a second area; and
a controller configured to control the heater such that a temperature in the first area of the tank reaches a melting point of the target material faster than a temperature in the second area of the tank, each of the first area and the second area being positioned upstream in an output direction into which the target material is output, the second area being positioned nearer to the filter than the first area.

20. The extreme ultraviolet light generation apparatus according to claim 19, wherein the controller controls the heater such that the temperatures in the first and second areas reaches a temperature higher than the melting point.

21. A production method comprising:
generating extreme ultraviolet light by an extreme ultraviolet light generation apparatus;
outputting the extreme ultraviolet light to an exposure apparatus; and
performing exposure to a substrate using the extreme ultraviolet light in the exposure apparatus to produce an electronic device,
the extreme ultraviolet light generation apparatus comprising:
a chamber in which a target material is irradiated with laser light and the extreme ultraviolet light is generated; and
a target supply device configured to supply the target material into the chamber,
the target supply device comprising:
a tank configured to contain target material;
a nozzle having a nozzle hole configured to output the target material from the tank;
a filter disposed in a communication portion for conducting the target material from the tank to the nozzle hole;
a heater configured to heat the tank, wherein the heater includes a first heater configured to heat a first area and a second heater configured to heat a second area; and
a controller configured to control the heater such that a temperature in the first area of the tank reaches a melting point of the target material faster than a temperature in the second area of the tank, each of the first area and the second area being positioned upstream in an output direction into which the target material is output, the second area being positioned nearer to the filter than the first area.

22. The production method according to claim 21, wherein the controller controls the heater such that the temperatures in the first and second areas reaches a temperature higher than the melting point.

* * * * *